(12) United States Patent
Jiang et al.

(10) Patent No.: US 12,200,839 B2
(45) Date of Patent: Jan. 14, 2025

(54) LED FILAMENT AND LIGHT BULB USING LED FILAMENT

(71) Applicant: JIAXING SUPER LIGHTING ELECTRIC APPLIANCE CO., LTD, Jiaxing (CN)

(72) Inventors: Tao Jiang, Jiaxing (CN); Lin Zhou, Jiaxing (CN); Ming-Bin Wang, Jiaxing (CN); Chih-Shan Yu, Jiaxing (CN); Rong-Huan Yang, Jiaxing (CN); Ji-Feng Xu, Jiaxing (CN); Heng Zhao, Jiaxing (CN); Jian Lu, Jiaxing (CN); Qi Wu, Jiaxing (CN)

(73) Assignee: JIAXING SUPER LIGHTING ELECTRIC APPLIANCE CO., LTD, Jiaxing (CN)

( * ) Notice: Subject to any disclaimer, the term of this patent is extended or adjusted under 35 U.S.C. 154(b) by 0 days.

(21) Appl. No.: 18/249,451

(22) PCT Filed: Sep. 29, 2022

(86) PCT No.: PCT/CN2022/122599
§ 371 (c)(1),
(2) Date: Apr. 18, 2023

(87) PCT Pub. No.: WO2023/051698
PCT Pub. Date: Apr. 6, 2023

(65) Prior Publication Data
US 2024/0130022 A1    Apr. 18, 2024

(30) Foreign Application Priority Data
Sep. 29, 2021  (CN) .......................... 202111153378.1
Nov. 2, 2021   (CN) .......................... 202111285994.2
(Continued)

(51) Int. Cl.
H05B 45/30     (2020.01)
H05B 45/345    (2020.01)
H05B 45/54     (2020.01)

(52) U.S. Cl.
CPC ........... *H05B 45/54* (2020.01); *H05B 45/345* (2020.01)

(58) Field of Classification Search
CPC ...... H05B 45/10; H05B 45/345; H05B 45/40; H05B 45/54; H05B 47/10; F21K 9/232; F21V 3/08; F21V 3/12
See application file for complete search history.

(56) References Cited

U.S. PATENT DOCUMENTS

2006/0214179 A1   9/2006  Cao
2017/0130906 A1*  5/2017  Jiang ...................... H01L 33/62

FOREIGN PATENT DOCUMENTS

CN    102271440    12/2011
CN    102938951    2/2013
(Continued)

OTHER PUBLICATIONS

International Search Report issued on Nov. 16, 2022 in corresponding Application No. PCT/CN2022/122599, 7 pages.

*Primary Examiner* — Jimmy T Vu
(74) *Attorney, Agent, or Firm* — Simon Kuang Lu

(57) ABSTRACT

This application relates to the field of lighting, and discloses an LED filament. The LED filament includes an LED chip unit, a light conversion layer, and an electrode. The light conversion layer covers the LED chip unit and part of the electrode, and a color of a light emitted by the LED filament after lighting is different from a color of the light conversion layer. This application has the characteristics of uniform light emission and good heat dissipation effect.

19 Claims, 36 Drawing Sheets

(30) Foreign Application Priority Data

| Dec. 9, 2021 | (CN) | ......................... | 202111501338.1 |
| Dec. 22, 2021 | (CN) | ......................... | 202111577215.6 |
| Dec. 24, 2021 | (CN) | ......................... | 202111598894.5 |
| Jan. 10, 2022 | (CN) | ......................... | 202210019982.3 |
| Jan. 24, 2022 | (CN) | ......................... | 202210077901.5 |
| Apr. 27, 2022 | (CN) | ......................... | 202210448843.2 |
| May 10, 2022 | (CN) | ......................... | 202210504353.X |
| Jul. 13, 2022 | (CN) | ......................... | 202210818921.3 |
| Jul. 20, 2022 | (CN) | ......................... | 202210851817.4 |
| Aug. 4, 2022 | (CN) | ......................... | 202210929741.2 |
| Aug. 31, 2022 | (CN) | ......................... | 202211052276.5 |
| Aug. 31, 2022 | (CN) | ......................... | 202211054539.6 |
| Sep. 9, 2022 | (CN) | ......................... | 202211101081.5 |

(56) References Cited

FOREIGN PATENT DOCUMENTS

| CN | 103415112 | | 11/2013 | | |
| CN | 106090665 | A * | 11/2016 | ............... | F21K 9/90 |
| CN | 106468405 | | 3/2017 | | |
| CN | 109723984 | | 5/2019 | | |
| CN | 112510028 | | 3/2021 | | |
| CN | 213244419 | | 5/2021 | | |

* cited by examiner

LED FILAMENT AND LIGHT BULB USING LED FILAMENT

TECHNICAL FIELD

This application relates to the field of lighting, and in particular, to an LED filament and a light bulb using the LED filament.

BACKGROUND

LEDs have the advantages of environmental protection, energy saving, high efficiency, and long life. Therefore, LEDs have been generally valued in recent years and gradually replaced the status of conventional lighting lamps. However, the light of conventional LED light sources is directional unlike the conventional lamps that can provide wide-angle illumination. Therefore, the application of LEDs to the conventional lamps has corresponding challenges depending on lamp types.

In recent years, an LED filament that allows the LED light sources to emit light like conventional tungsten filament light bulbs to achieve 360° full-angle illumination has gradually attracted the attention of the industry. This kind of LED filament is made by fixing a plurality of LED chips in series on a narrow and slender glass substrate, and then wrapping the entire glass substrate with phosphor-doped silica glue, and then performing electrical connection. In addition, there is one kind of LED soft filament, which is similar to the structure of the above-mentioned LED filament. A flexible printed circuit (hereinafter refer to FPC) substrate is used instead of the glass substrate to enable the filament to have a certain degree of bending. However, the soft filament made of the FPC has the following disadvantages, in an example, the FPC has a coefficient of thermal expansion different from that of the silica glue wrapping the filament, causing displacement or even degumming of the LED chips in long-term use; furthermore, the FPC may not beneficial to flexible adjustment of process conditions and the like.

A soft filament was disclosed (for example, in some of the embodiments of Chinese Patent Publication No. CN106468405A), where a soft filament structure without a carrying substrate is provided, which replaces a conventional structure in which chips have to be mounted on a substrate first and then coated with phosphor/encapsulated with a flexible fluorescent encapsulated body with wavelength conversion function. However, a part of the filament structure poses a challenge related to the stability of metal wire bonded between chips while they are being bent. When the arrangement of the chips in the filament is dense, if the adjacent LED chips are connected in a manner of metal wire bonding, it is prone to cause stress to be concentrated on a specific part of the filament when the filament is bent, so that the bonded metal wires connecting the LED chips are damaged or even broken. Therefore, some embodiments still have room for improvement in quality.

In the existing soft filament products, different types of bulbs lead to different requirements for the shape of the LED filament, so the length of the LED filament will be different in specification. For the same filament with the same quantity of LED chips, a larger length of the filament indicates a larger distance between two adjacent LED chips, and more significant light spots (or graininess) observed by the naked eye after the filament is lit, which seriously affects the visual comfort of users.

In the related art, most LED lamps use blue LED chips and yellow phosphor to emit white light, but an emission spectrum of the LED lamps shows that light in the red light region is weak and has a low color rendering index, making it difficult to achieve low color temperature. To increase the color rendering index, a certain amount of green phosphor and red phosphor are generally added, but the relative conversion rate of the red phosphor is relatively low, usually causing a total luminous flux of the LED lamps to decrease, that is, the light efficiency decreases. In addition, the red, green, and blue cone cells in the human eye have different sensitivities. If there is a lack of red light, green light and blue light will form a cyan image in the human eye, reducing the color gamut of color reproduction, which not only causes the lighting scene to be dull and uninteresting, but also affects the quality of the lighting environment. Moreover, the use of lighting with high color rendering can improve the perception of space of people, while low color rendering can affect the ability to distinguish objects and accurately perceive the surrounding environment.

In the existing LED filament, usually only the outer surface of the LED filament is coated with mixed phosphor glue. Since phosphor glues with different color temperatures will show different colors after drying, when multiple LED filaments with different color temperatures are mounted, they will show mixed colors at a glance, so that the LED lamps are unattractive when used as decorative lamps. Some LED lamps are provided with graphene adhesive layers above and below the substrate, and the graphene is toned into different colors to resolve the visual problem caused by the different appearance colors of the phosphor glue layer. However, graphene is expensive to produce and easily pollutes the environment.

The LED chip has a first light-emitting surface and a second light-emitting surface. The first light-emitting surface and the second light-emitting surface are opposite to each other. The light from the first light-emitting surface (front side) is directed toward a top layer, and the light from the second light-emitting surface (reverse side) is directed toward a carrying layer. Generally, the reverse side of flip chips or back-plated LED chips is basically opaque. The brightness of the front side and reverse side of the LED chip is quite different. If the above LED chips are used in the LED filament, after the LED filament is wound, the luminous flux in some directions will be less, and the light emission of the LED light bulb will be uneven.

In addition, the LED filament is generally disposed inside the LED light bulb, and in order to present the aesthetic appearance and also to make the illumination of the LED filament more uniform and widespread, the LED filament is bent to exhibit a plurality of curves. Since the LED chips are arranged in the LED filaments, and the LED chips are relatively hard objects, it is difficult for the LED filaments to be bent into a desired shape. Moreover, the LED filament is also prone to cracks due to stress concentration during bending.

Besides, generally the LED filament is arranged in a line around the stem, and the LED filament emits little light near both ends. When one end of a plurality of LED filaments is mounted near the bulb light emission top, a dark region will be formed in the light emission direction of the central axis of the bulb, causing uneven spatial distribution of output light and uneven illuminance distribution, resulting in the phenomenon of "dark under the lamp".

At present, LED filament lamps generally use a driving power supply to convert alternating current into direct current before driving to emit light. However, there are ripples in the process of converting alternating current into direct current by the driving power supply, causing flicker in the LED filament during light emitting. To reduce or even eliminate the flicker generated in the LED filament during light emitting, an electrolytic capacitor is usually added for ripple removal in the driving power supply. Heat generated by a heating element in the driving power supply greatly affects the service life of the electrolytic capacitor.

When multiple LED components are included in a lighting device, the multiple LED components need to be driven with different currents. In this case, if multiple drivers are used, circuit complexity and circuit cost will inevitably increase, so a shunt circuit is required to distribute current to the multiple LED components.

Finally, in the related art, when the semiconductor glue dispensing device performs a glue dispensing operation on the soft filament semiconductor, there is a glue dispensing abnormality, which leads to failure of normal wire bonding in the subsequent process, or a problem in the bonding between the LED chip and the bottom film.

Based on the above, in view of the deficiencies and defects of the related art, how to resolve the above problems is a technical problem to be resolved urgently by a person skilled in the art.

SUMMARY

It is particularly noted that the present disclosure may actually include one or more technical solutions currently claimed or not claimed. In addition, in the process of writing the description, in order to avoid confusion caused by unnecessary distinctions between these technical solutions, a plurality of possible technical solutions herein may be collectively referred to as "this application".

A plurality of embodiments with respect to "this application" are briefly described herein. However, the term "this application" is only used to describe certain embodiments disclosed in this specification (whether or not claimed), rather than a complete description of all possible embodiments. Some embodiments described below as various features or aspects of "this application" may be combined in various ways to form an LED light bulb or part thereof.

This application discloses an LED light bulb. The LED light bulb includes a lamp housing and a lamp cap connected to the lamp housing. At least one supporting arm, a stem, and an LED filament are disposed in the lamp housing. The stem includes a stand. Each supporting arm includes a first end and a second end that are opposite to each other. The first end of the supporting arm is connected to the stand. The second end of the supporting arm is connected to the LED filament. The LED light bulb is located in a spatial coordinate system (X, Y, Z). The Z axis is parallel to the stem. On the XY-plane, the central angle corresponding to the arc where at least two bending points of the LED filament are located ranges from 170° to 220°.

Preferably, each supporting arm has an intersection with the LED filament. On the XY-plane, at least two intersections are located on a circumference of a circle taking the stem as a center.

Preferably, the LED filament includes an LED section and a conductive section connecting two adjacent LED sections. The height of the stand is greater than the height of the conductive section in the conductive section.

Preferably, the LED filament further includes an electrode connecting the LED sections. The LED section includes a first section and a second section. The first section is extending in the direction of the top portion of the lamp housing from the electrode to the bending point. The second section is extending in the direction of the lamp cap from the bending point to the conductive section. The first section and the second section to the lamp housing respectively have a first distance and a second distance that are opposite to each other, and the first distance is less than the second distance.

Preferably, the LED filament further includes a light conversion layer. The light conversion layer includes a top layer and a base layer. The LED section and the conductive section are disposed on the base layer. The top layer covers the LED section, the conductive section, and part of the electrode. In the first distance direction, the base layer of the LED filament is close to the lamp housing, and the top layer of the LED filament is away from the lamp housing.

Preferably, there is a die-bonding glue included between the base layer and the LED chip, and at least 80% of the area of the bottom surface where each chip unit is attached to the base layer is attached with the die-bonding glue.

This application further discloses an LED light bulb. The LED light bulb includes a lamp housing and a lamp cap connected to the lamp housing. A stem an LED filament are disposed in the lamp housing. A plane A divides the lamp housing into an upper portion and a lower portion. The lamp housing has the largest width at the plane A. There is an intersection between the stem and the plane. The lamp housing has a lamp housing top portion and a lamp housing bottom portion that are opposite to each other. The lamp housing bottom portion is close to the lamp cap. The length of the filament located between the lamp housing top portion and the plane A is less than the length of the filament located between the plane A and the lamp housing bottom portion.

Preferably, in the height direction of the LED light bulb, the distance from the highest point of the LED filament to the plane A is less than the distance from the lowest point of the LED filament to the plane A.

Preferably, the lamp housing is filled with gas containing oxygen.

Preferably, the LED light bulb is located in a spatial coordinate system (X, Y, Z), and the Z-axis is parallel to the stem. The LED light bulb further includes at least one supporting arm connected to the stem, and each supporting arm has an intersection with the LED filament. On the XY-plane, at least two intersections are located on a circumference of a circle taking the stem as a center.

Preferably, the LED filament includes an LED section, a conductive section connecting two adjacent LED sections, and an electrode connected to the LED section. At least one intersection and the bending point of the conductive section form a straight line La, and the intersection on the straight line La and the electrode of the filament form a straight line Lb. The range of the angle α between the straight line La and the straight line Lb is $0° < α < 90°$.

This application has the following or any combination of technical effects through the above-mentioned technical solutions: (1) By filling the lamp housing with a combination of nitrogen and oxygen, the service life of a base layer can be effectively increased due to the action of oxygen and groups in the base layer. (2) By designing the relationship among a diameter of the lamp cap, a maximum diameter of the lamp housing, and a maximum width in the Y-axis direction on the YZ-plane or a maximum width in the X-axis direction on the XZ-plane of the LED filament, the heat dissipation effect of the light bulb can be effectively improved. (3) The thickness of the base layer is less than the thickness of the top layer. Since the thermal conductivity of the top layer is greater than that of the base layer, and the heat generated by the LED chip has a short distance to the outer surface of the base layer, the heat is not easy to accumulate, resulting in a good heat dissipation effect of the LED filament. (4) A carrying layer includes a transparent layer and a base layer. The transparent layer supports a part of the base layer, thereby enhancing the strength of the base layer, which is beneficial for die bonding. The part of the base layer that is not covered by the transparent layer can allow the heat generated by a part of the LED chip to be dissipated directly through the base layer. (5) The transparent layer includes a first transparent layer and a second transparent layer. When the LED filament is bent, the electrode is prone to be separated from the light conversion layer, or the part where the light conversion layer is in contact with the electrode is prone to cracks. The first transparent layer and the second transparent layer can perform structural reinforcement on the part where the light conversion layer is in contact with the electrodes, which prevents the part where the light conversion layer is in contact with the electrodes from cracks. (6) A conductor includes a covering portion and an exposed portion. When the LED filament is bent, the exposed portion is slightly deformed under force with a small bending region and a small deformation degree, which is beneficial to keeping a bending shape of the LED filament.

Figure 1A:
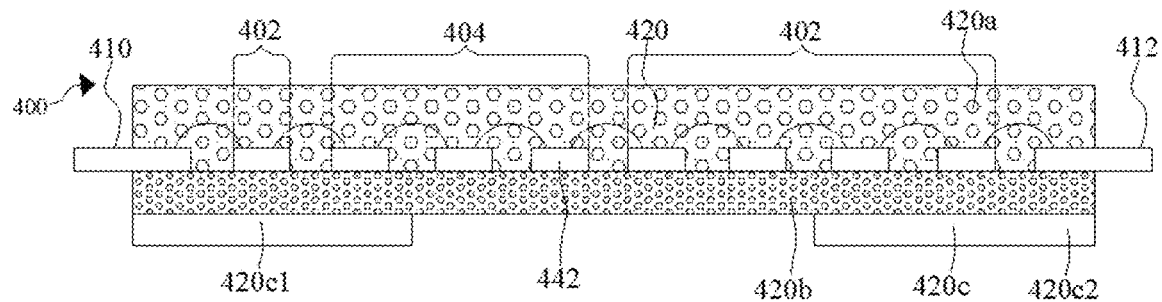
FIG. 1A is a schematic structural diagram of another embodiment of an LED filament according to this application.

R1 to R4 are first to fourth resistors respectively; M1 is a main switching element, and Q1 is a secondary switching element, which may use switching devices such as field effect transistors and triodes; D5 is a light emitting diode or a light emitting diode group; PTC is a PTC resistor; and V2 is a voltage source.

DETAILED DESCRIPTION

To make the above-mentioned objectives, features, and advantages of this application more apparent and comprehensible, specific embodiments of this application are described in detail below with reference to the accompanying drawings.

As shown in FIG. 1A to FIG. 1H, FIG. 2A to FIG. 2C, and FIG. 3A to FIG. 3E, an LED filament includes a light conversion layer 220/420, LED chip units 202/204 (or LED sections 402/404), and electrodes (or conductive electrodes) 210, 212/410, 412. The light conversion layer 220/420 wraps the LED chip units 202/204 (or LED sections 402/404) and parts of the electrodes (or conductive electrodes) 210, 212/410, 412, and parts of the electrodes (or conductive electrodes) 210, 212/410, 412 are exposed outside the light conversion layer 220/420, the adjacent LED chip units 202, 204 (or LED sections 402, 404) are electrically connected to each other, and the LED chip units 202/204 (or LED sections 402/404) and the electrodes (or conductive electrodes) 210, 212/410, 412 are electrically connected. The LED filament includes at least two LED chips 442, the two adjacent LED chips 442 are electrically connected to each other, the LED chip units 202/204 (or LED sections 402/404) include at least one LED chip 442, the light conversion layer 420 includes a top layer 420a and a carrying layer, and the top layer 420a and the carrying layer may separately be a layered structure having at least one layer. The layered structure may be selected from: a phosphor glue with high plasticity (relative to a phosphor film), a phosphor film with low plasticity, a transparent layer, or any combination of the three. The phosphor glue/phosphor film includes the following components: organosilicon-modified polyimide and/or glue. The phosphor glue/phosphor film may also include phosphor and inorganic oxide nanoparticles (or heat dissipation particles). The transparent layer may be composed of light-transmitting resin (such as silica glue and polyimide) or a combination thereof. The glue may be, but is not limited to, silica glue. In one embodiment, materials of the top layer 420a and the carrying layer are the same. In one embodiment, if the LED filament is supplied with electrical power no more than 8 W, when the LED filament is lit, at least 4 lm luminous flux of light is emitted every millimeter of an LED filament length on average or a filament body length on average or a top layer length on average. In one embodiment, there are at least two LED chips every millimeter of an LED filament length on average or a filament body length on average or a top layer length on average. In an environment at 25° C., the temperature of the LED filament is not greater than the junction temperature when the LED filament is lit for 15,000 h. Alternatively, if the LED filament is supplied with electrical power no more than 8 W, when the LED filament is lit, at least 4 lm luminous flux of light is emitted every cubic millimeter of an LED filament volume on average (or a filament body volume on average or a top layer 420a volume on average). In one embodiment, there are at least two LED chips every cubic millimeter of an LED filament volume on average (or a filament body volume on average or a top layer 420a volume on average). In an environment at 25° C., the junction temperature of the LED chip 442 is not greater than the junction temperature of the LED chip 442 when the LED filament is lit for 15,000 h. In some embodiments, the service life of the LED chip 442 may be related to the thermal equilibrium temperature (such as the junction temperature of the LED chip 442). The relationship between the service life of the LED chip 442 and the junction temperature varies depending on the manufacturer of the LED chip 442. In the LED filament, the heat of the LED chip 442 is transferred to the surrounding environment through thermal conduction, and the temperature is maintained not higher than a specific temperature (for example, the junction temperature of the LED chip is maintained not higher than the junction temperature of the LED chip with the 15,000-hour rated life in the surrounding environment at 25° C.).

Filament lamp products are not only for lighting purposes in most application scenarios, but also a part of environmental decoration. That is, when the filament lamp is not lit, consumers are concerned about the shape and appearance color of the filament (including the appearance color of the filament (or the color of the filament body) and the appearance color of the bulb). When the filament lamp is lit, the focus is on whether the performance of the color temperature and the illuminance meet the environmental requirements. The above-mentioned filament body does not include the part where the electrode exposes the light conversion layer 420. In one embodiment, when the LED filament is not lit, the surface of the LED filament is white, gray, black, blue, green, purple, or the like. In some embodiments, the surface of the LED filament may be the surface of the light conversion layer 420. After the LED filament is lit, it can emit light of a different color than when the LED filament is not lit, so that the light bulb with the LED filament can be applied in different scenarios to achieve different decorative effects. In some embodiments, the LED filament includes a coating, and the color of the coating is white, gray, black, blue, green, purple, or the like. The coating at least covers a part of the surface of the light conversion layer 420, and preferably, the coating covers the entire surface of the light conversion layer 420. For example, a red coating is used to coat the surface of the light conversion layer 420. When the LED filament is not lit, the surface of the LED filament is red, but when the LED filament is lit, the LED filament emits white light. Certainly, after the LED filament is lit, it can emit the same color of light as when the LED filament is not lit. For example, a white coating is used to coat the surface of the light conversion layer 420. When the LED filament is not lit, the surface of the LED filament is white, and when the LED filament is lit, the LED filament also emits white light. The white coating may be aluminum oxide. In some embodiments, the surface of the top layer 420a and/or the carrying layer is covered with a film, and the color of the film is black, gray, red, or the like. Generally, substances have a certain light absorption, preferably a film with high light transmittance. For example, the light transmittance of the film is at least greater than 80, which can prevent the luminous flux from decreasing after the LED filament is lit. In some embodiments, the thickness of the film is smaller than the thickness of the top layer 420a, and the heat emitted by the LED chip 442 is not easily accumulated in the film, so as to meet the requirements of the appearance and heat dissipation of the LED filament. The film may contain or not contain phosphors. When the film contains phosphors, the phosphor content of the film is less than the phosphor concentration of the top layer 420a or the carrying layer. If the top layer 420a or the carrying layer is a multi-layer structure, the phosphor content of the film is at least less than the phosphor content of one of the layers. Due to the film, the thickness of the LED filament increases, and the heat conduction path of the LED filament becomes longer. If the phosphor content in the film is increased to improve the heat dissipation performance of the LED filament, the hardness of the LED filament will increase due to the increase of the phosphor content in the film, so that the flexibility of the LED filament becomes worse, and the probability of cracks when the LED filament is bent increases. Therefore, this application adds a certain amount of phosphors to the film, which can change the color of the LED filament when it is not lit while taking into account the heat dissipation performance and flexibility of the LED filament. In some embodiments, after the surface of the top layer 420a and/or the base layer is covered with a film, when the filament is not lit, the color of the filament body is gray-black (close to the original color of tungsten filament), and when the LED filament is lit, the light emitted by the LED filament is white. In some embodiments, the color of the light conversion layer, the main body of the filament, etc. when the filament is not lit, or the color of the light emitted after the LED filament is lit includes primary colors and colors that are prepared from at least two primary colors. For example, the primary colors are the three primary colors (RGB) of light.

Figure 1B:
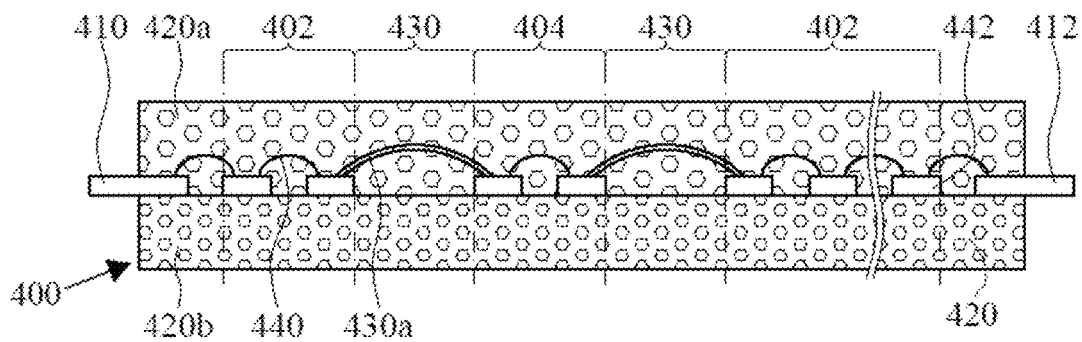
FIG. 1B is a schematic structural diagram of another embodiment of an LED filament according to this application.
Figure 1C:
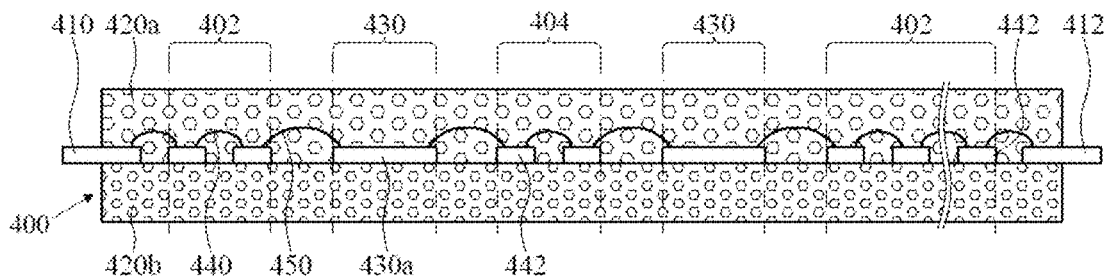
FIG. 1C is a schematic structural diagram of another embodiment of an LED filament according to this application.
Figure 1D:
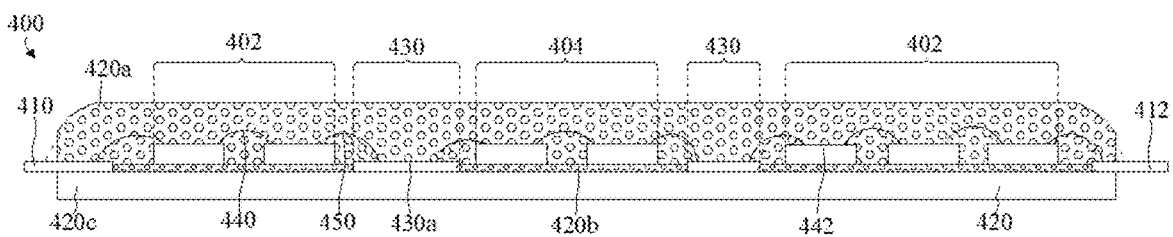
FIG. 1D to FIG. 1G are schematic structural diagrams of a plurality of embodiments of an LED filament according to this application.
Figure 1E:
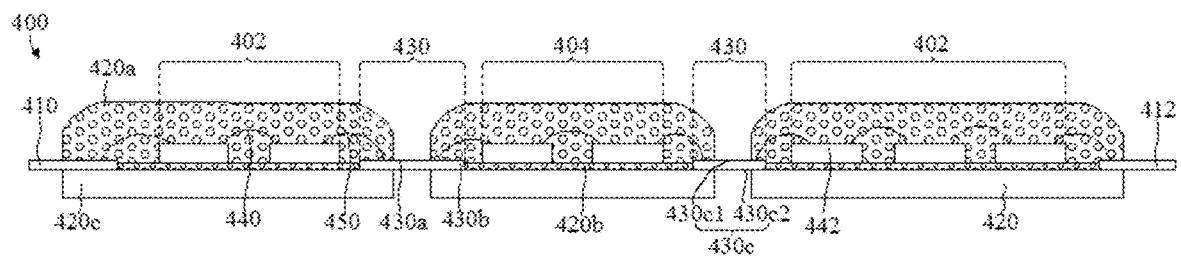
Figure 1F:
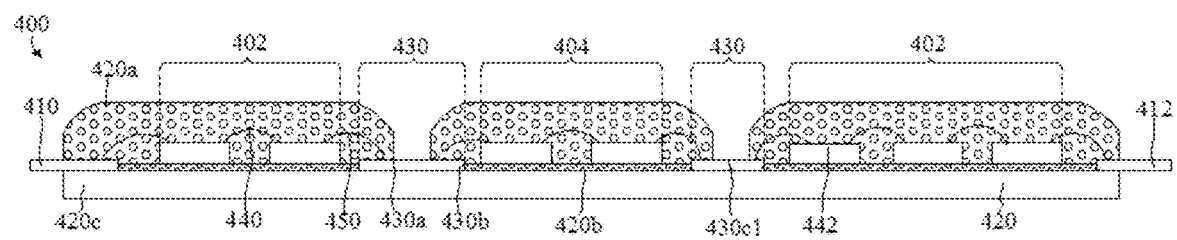
Figure 1G:
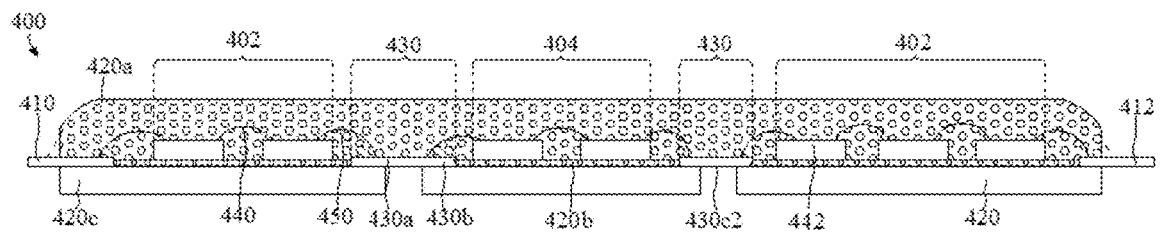
Figure 1H:
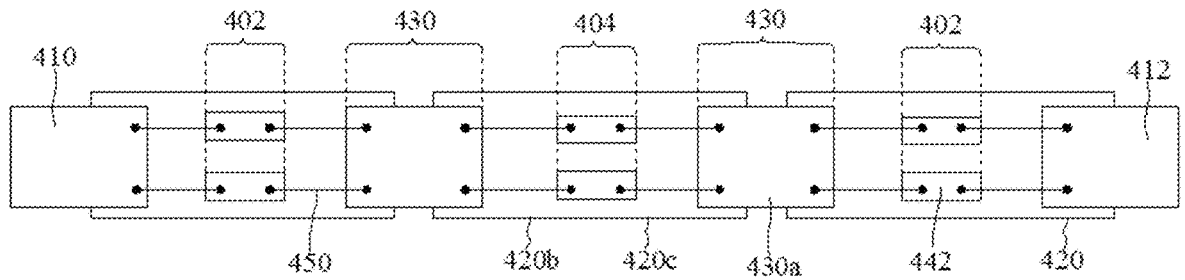
FIG. 1H is a top view of an embodiment of an LED filament with a top layer removed according to this application.
Figure 1I:
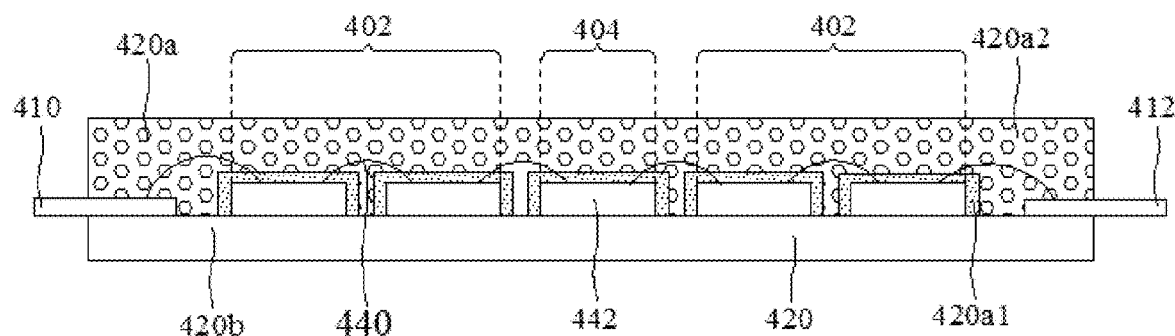
FIG. 1I is a schematic structural diagram of another embodiment of an LED filament according to this application.
Figure 1J:
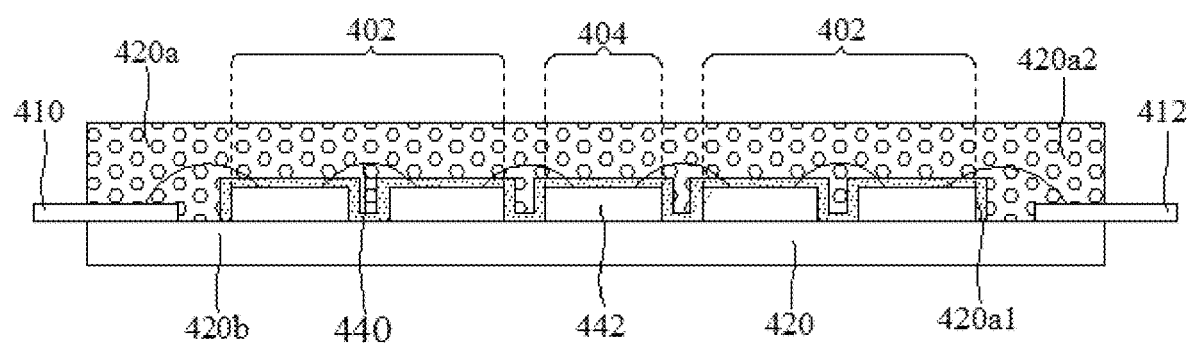
FIG. 1J is a schematic structural diagram of another embodiment of an LED filament according to this application.
Figure 1K:
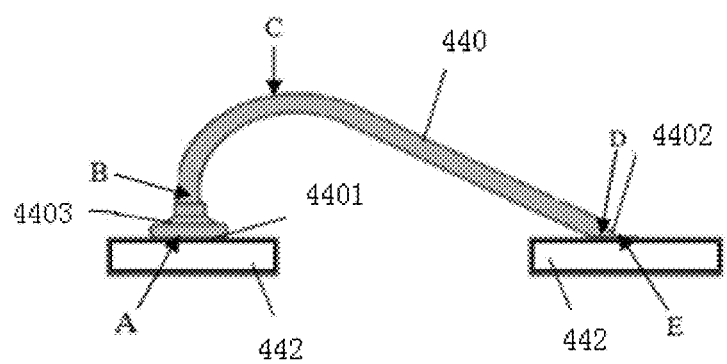
FIG. 1K is a schematic structural diagram of wire bonding of an LED chip according to an embodiment.
Figure 1L:
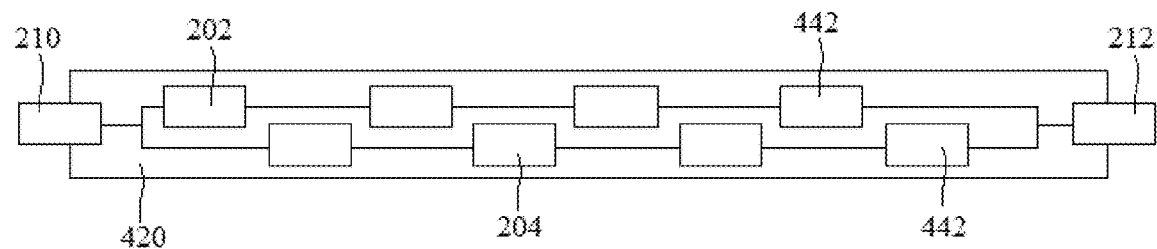
FIG. 1L is a top view of an embodiment of an LED filament with a top layer removed in an unbent state according to an embodiment of this application.
Figure 1M:
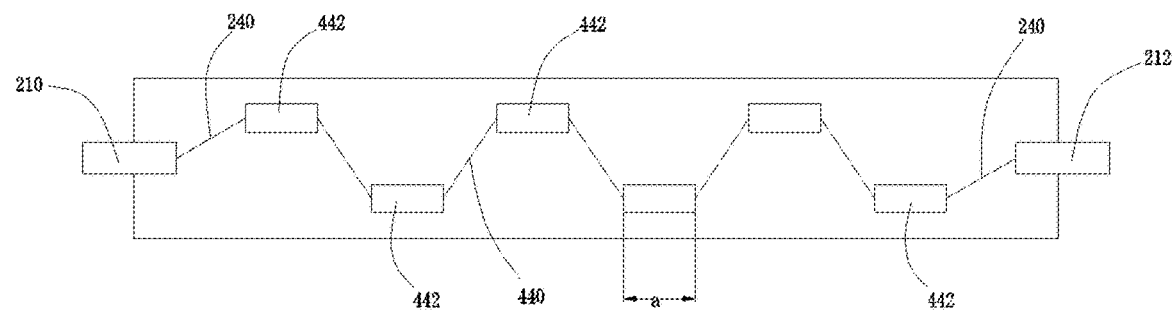
FIG. 1M is a top view of an embodiment of an LED filament with a top layer removed in an unbent state according to an embodiment of this application.
Figure 1N:
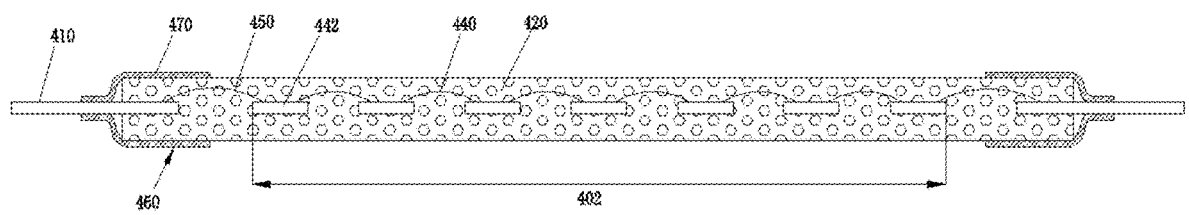
FIG. 1N is a schematic structural diagram of an LED filament in an unbent state according to an embodiment of this application.
Figure 1O:
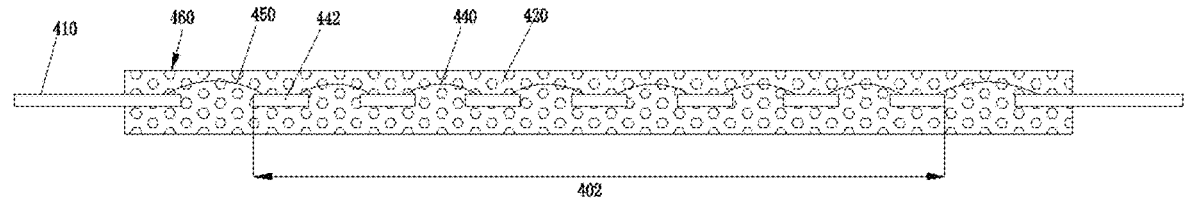
FIG. 1O is a schematic structural diagram of an LED filament in an unbent state according to some embodiments of this application.
Figure 1P:
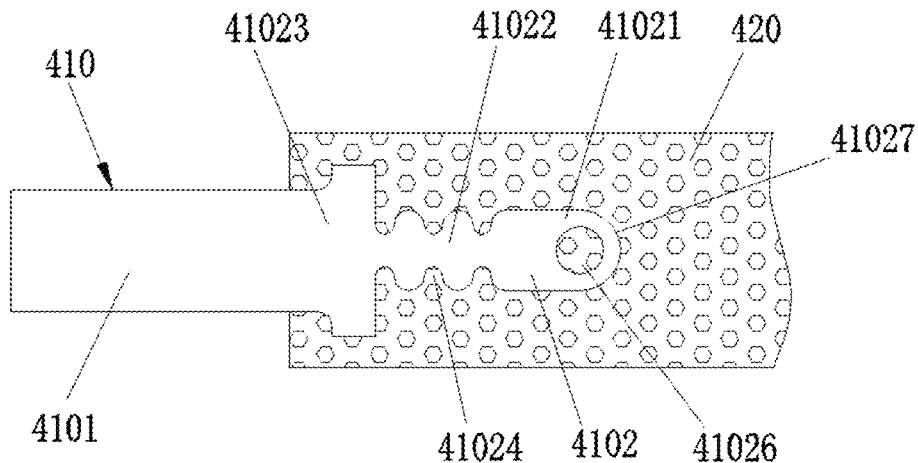
FIG. 1P is a schematic structural diagram of a part of an LED filament according to an embodiment of this application.
Figure 1Q:
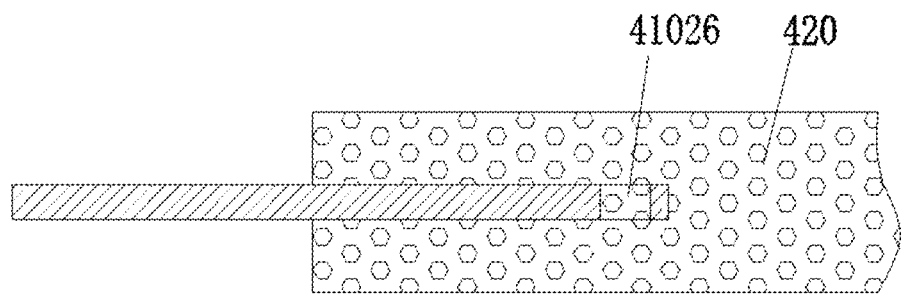
FIG. 1Q is a cross-sectional view of FIG. 1P.
Figure 1R:
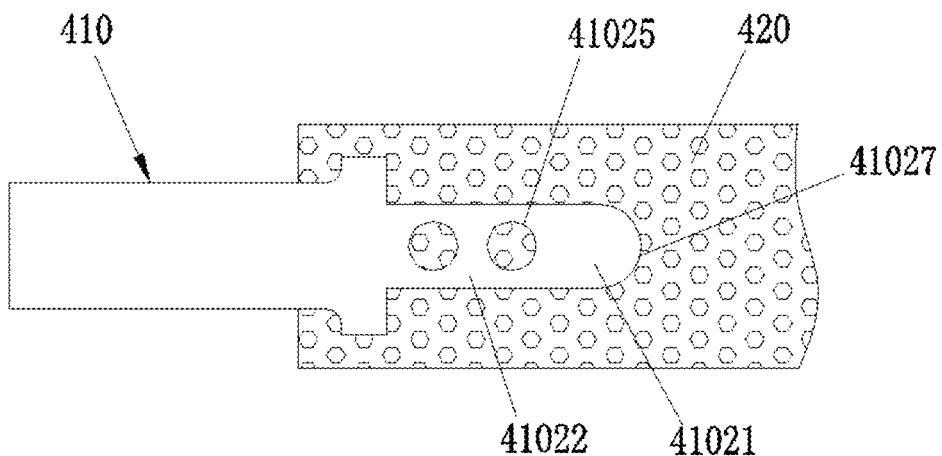
FIG. 1R is a schematic structural diagram of a part of an LED filament according to an embodiment of this application.
Figure 1S:
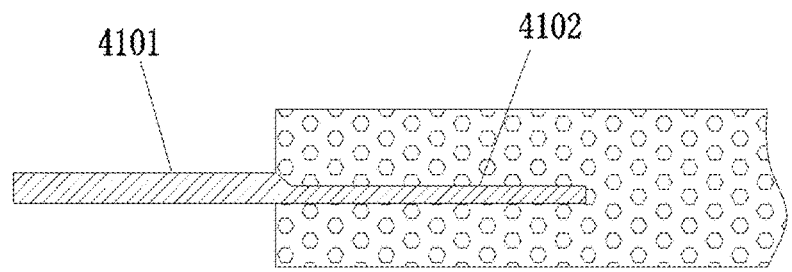
FIG. 1S is a schematic structural diagram of a part of an LED filament according to an embodiment of this application.
Figure 1T:
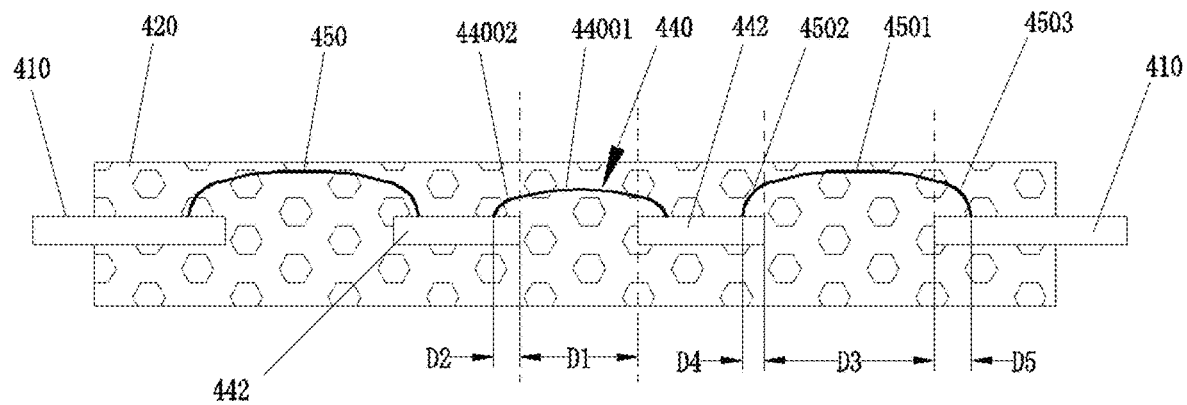
FIG. 1T is a schematic structural diagram of an LED filament in an unbent state according to an embodiment of this application.
Figure 1U:
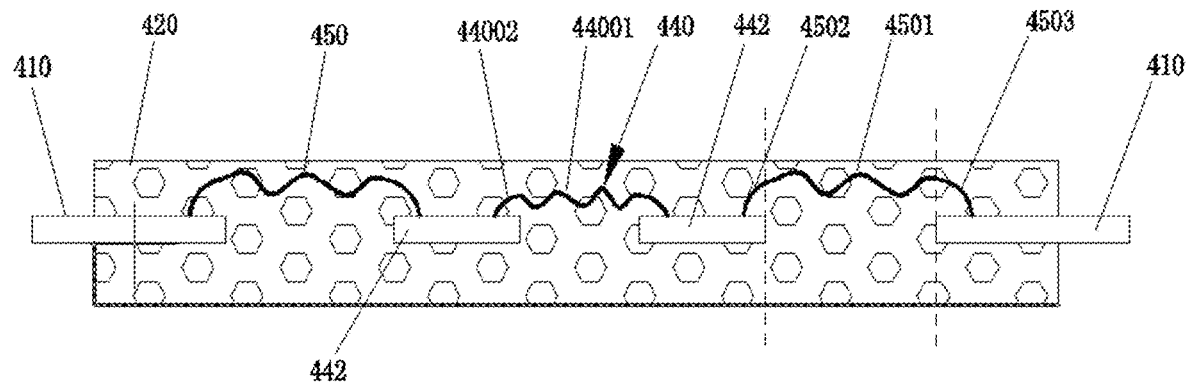
FIG. 1U is a schematic structural diagram of an LED filament in an unbent state according to some embodiments of this application.
Figure 1V:
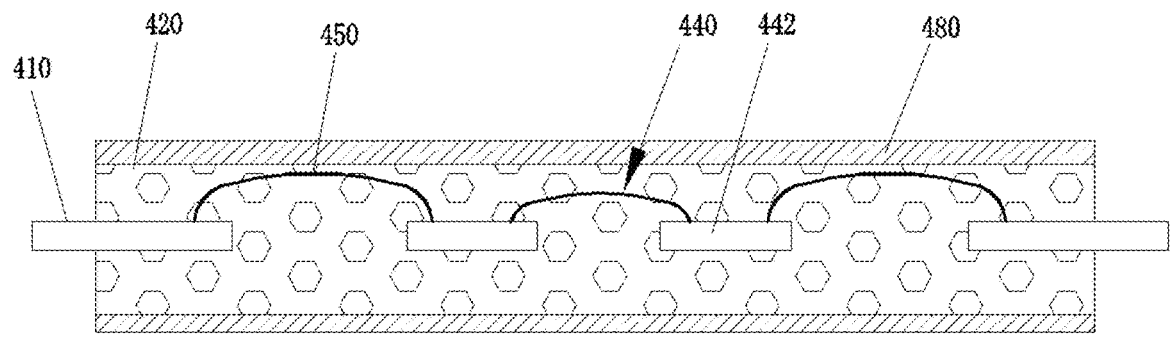
FIG. 1W is a schematic structural diagram of an LED filament in an unbent state according to some embodiments of this application.
Figure 1W:
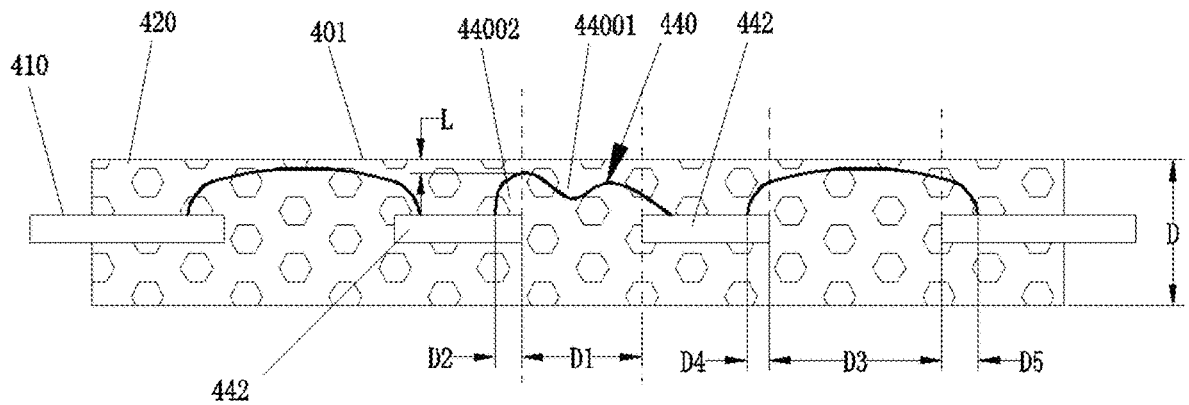

As shown in FIG. 1W, the coating or film is a layered body 480 disposed on the outer surface of the light conversion layer 420. In some embodiments, the hardness of the layered body 480 is smaller than that of the light conversion layer 420, so as to prevent the hardness of the layered body 480 from being too high to affect the normal bending of the filament. In some embodiments, the hardness of the layered body 480 may be greater than that of the light conversion layer 420 to further support the entire filament. Regardless of the hardness of the layered body 480, the supportability of the entire filament can be improved by the arrangement of the layered body 480.

The bulb of the filament lamp is filled with gas, and the refractive indices of the light conversion layer 420, the layered body 480, and the gas filled in the bulb decrease sequentially. Compared with no layered body, since the refractive index difference between the light conversion layer and the filling gas is large, a large optical loss can be caused. However, in this embodiment, through the above arrangement of the layered body 480, the LED chip 442 can have less optical loss on the light emission path.

The layered body 480 may be made of silica gel or materials mainly including silica gel. When the silica gel is directly used, the layered body 480 can be rendered white by the color of the silica gel itself, so that the appearance of the filament appears white. After adding a toner in the silica gel, the layered body 480 can exhibit different colors as described above. In addition, a photoreactive substance may also be added in the layered body 480, so that after the LED chip emits light, the light passes through the light conversion layer 420 for first light conversion, and then passes through the photoreactive substance in the layered body 480 for second light conversion. Therefore, when the LED filament is not lit, it has a first color, and after it is lit, it has a second color different from the first color, and the first color and the second color have differences in primary colors.

In one embodiment, the light conversion layer 420 includes a top layer 420a and a carrying layer, the top layer 420a and the carrying layer may separately be a layered structure having at least one layer, and the upper surface of the top layer 420a and the lower surface of the carrying layer have different colors. Since the LED filament exhibits two different colors when it is not lit, it can be applied to multi-color usage scenarios.

Figure 2A:
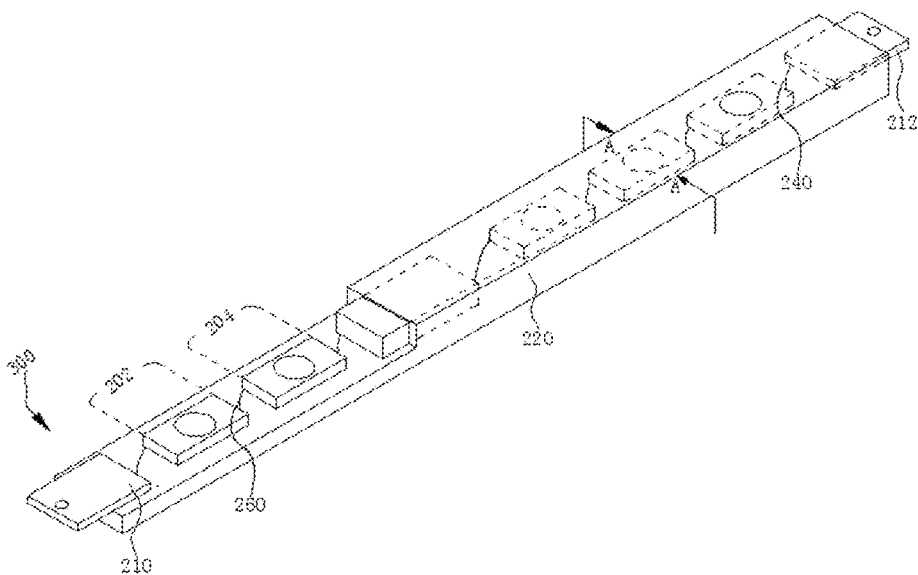
FIG. 2A is a schematic structural diagram of an embodiment of an LED filament according to this application.
Figure 2B:
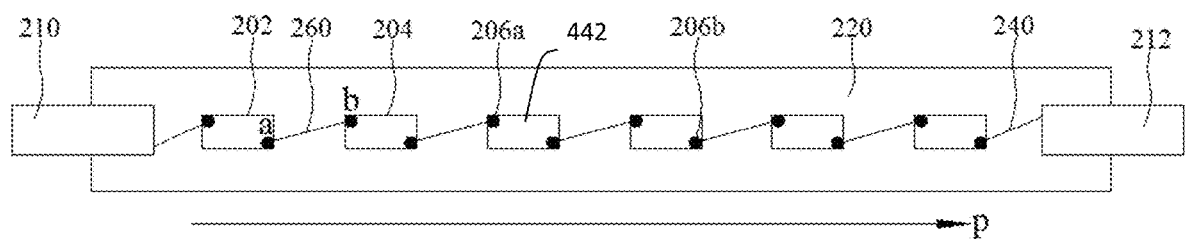
FIG. 2B is a bottom view of FIG. 2A.

In some embodiments, when there is only one column of LED chips 442 in the width direction of the LED filament (as shown in FIG. 2B, the LED chips 442 (in FIG. 2B) are arranged in the same direction), there are bendable sections and unbendable sections in the length direction of the LED filament. The total length of the bendable sections is smaller than the total length of the unbendable sections, so that the entire LED filament has better supportability. The unbendable sections are the total length of the LED chip 442 or the part of the electrodes 210, 212/410, 412 in the length direction of the LED filament. The bendable sections only include the light conversion layer 220/420 and/or wires (the wires herein refer to wires connecting adjacent LED chips or wires connecting the LED chip and the electrode). That is, the parts in the length direction of the LED filament that are not provided with the LED chip 442 or the electrodes 210, 212/410, 412 form the bendable sections.

In some embodiments, in the length direction of the LED filament, the total length of the bendable sections at least accounts for more than 30% of the total length of the LED filament, so as to ensure the bendability of the filament.

In some embodiments, in the length direction of the LED filament, the total length of the bendable sections at least accounts for more than 30% and no more than 50% of the total length of the LED filament, so as to ensure the bendability and supportability of the LED filament.

In some embodiments, when there are two columns of LED chips 442 in the width direction of the LED filament and the two columns of LED chips 442 are connected in parallel (as shown in FIG. 1L), there are also bendable sections and unbendable sections in the length direction of the LED filament. The total length of the bendable sections is smaller than the total length of the unbendable sections, so that the entire LED filament has better supportability and bendability. The unbendable sections are the total length of the LED chip 442 or the part of the electrodes 210, 212/410, 412 in the length direction of the LED filament. The bendable sections only include the light conversion layer 220/420 and/or wires (the wires herein refer to wires connecting adjacent LED chips or wires connecting the LED chip and the electrode). That is, the parts in the length direction of the LED filament that are not provided with the LED chip 442 or the electrodes 210, 212/410, 412 form the bendable sections.

In some embodiments, the total length of the bendable sections at least accounts for more than 0.001% and no more than 20% of the total length of the LED filament. In some embodiments, the part of the LED filament where the LED chip is disposed in the length direction (that is, in FIG. 1L, the region between the leftmost LED chip and the rightmost LED chip) may not have bendable sections. Since the adjacent LED chips are arranged alternately, it can still have bendability.

In some embodiments, when there are two columns of LED chips 442 in the width direction of the LED filament and the two columns of LED chips 442 are connected in series (as shown in FIG. 1M), there are bendable sections and unbendable sections in the length direction of the LED filament. The total length of the bendable sections is smaller than the total length of the unbendable sections, so that the entire LED filament has better supportability. The unbendable sections are the total length of the LED chip 442 or the part of the electrodes 210, 212/410, 412 in the length direction of the LED filament. The bendable sections only include the light conversion layer 220/420 and/or wires (the wires herein refer to wires connecting adjacent LED chips or wires connecting the LED chip and the electrode). That is, the parts in the length direction of the LED filament that are not provided with the LED chip 442 or the electrodes 210, 212/410, 412 form the bendable sections.

In some embodiments, in the length direction of the LED filament, the total length of the bendable sections at least accounts for more than 0.001% and no more than 30% of the total length of the LED filament, so as to ensure the bendability and supportability of the LED filament.

In some embodiments, whether one column of LED chips or two columns of LED chips are arranged on the LED filament, more than 0.5 LED chips are arranged per unit length (per millimeter of length), so that a proper spacing can be set between the LED chips, to meet the requirements of the uniformity of light emission and to prevent serious thermal influence between the LED chips.

FIG. 1A is a schematic structural diagram of an embodiment of an LED filament according to this application. An LED filament 400 includes: a light conversion layer 420, LED sections 402/404, and electrodes 410/412. The LED sections 402/404 have at least one LED chip 442. In the LED filament, the two adjacent LED chips are electrically connected to each other, and the LED chips and the electrodes 410/412 are electrically connected. For example, the electrical connection may be achieved by using a circuit film or a first conductive wire in FIG. 1B described below. The light conversion layer 420 includes a top layer 420a and a carrying layer, the carrying layer includes a base layer 420b and a transparent layer 420c, and the base layer 420b is located between the top layer 420a and the transparent layer 420c (at least located on a certain section of the LED filament 400). In one embodiment, the base layer 420b includes an upper surface and a lower surface opposite to each other, the upper surface of the base layer 420b is in contact with a part of the top layer 420a, and the lower surface of the base layer 420b is in contact with the transparent layer 420c. In some embodiments, a part of the lower surface of the base layer 420b is in contact with the transparent layer 420c, and the transparent layer 420c supports a part of the base layer 420b, thereby enhancing the strength of the base layer 420b and facilitating die bonding, and the part of the base layer 420b that is not covered by the transparent layer 420c can allow heat generated by some LED chips 442 to be directly dissipated through the base layer 420b. In this embodiment, the total length of the base layer 420b is the same as the total length of the top layer 420a. In one embodiment, the total length of the transparent layer 420c is 5-100% of the total length of the base layer 420b. In one embodiment, the length of the transparent layer 420c is less than that of the base layer 420b, the total length of the transparent layer 420c is 10-80% of the total length of the base layer 420b. In one embodiment, the total length of the transparent layer 420c is 10-50% of the total length of the base layer 420b. When the LED filament is thinner (for example, the width of the LED filament is ≤120 μm), the heat dissipation area of the LED chips 442 is relatively reduced. By providing the transparent layer 420c located below the base layer 420b, on the one hand, the deformation of the base layer 420b caused by heating can be reduced; and on the other hand, the transparent layer 420c can assist in supporting the LED chips 442, helping die bonding. In one embodiment, the transparent layer 420c includes a first transparent layer 420c1 and a second transparent layer 420c2. The first transparent layer 420c1 and the second transparent layer 420c2 both extend in the length direction of the LED filament 400. The first transparent layer 420c1 extends from one end of the base layer 420b, the second transparent layer 420c2 extends from the other end of the base layer 420b, and the extending direction of the first transparent layer 420c1 is opposite to the extending direction of the second transparent layer 420c2. In one embodiment, the light conversion layer 420 has a first end and a second end opposite to the first end. In one embodiment, the LED chips 442 are located between the first end and the second end of the light conversion layer 420. If the LED chip 442 closest to the first end is denoted as LED chip $n_1$, then LED chips from the first end to the second end are sequentially LED chip $n_2$, LED chip $n_3$, . . . , and LED chip $n_m$, where m is an integer and m≤800. In one embodiment, the value of m is 50≤m≤300. In the length direction of the LED filament 400, the length of the first transparent layer 420c1/the second transparent layer 420c2 is at least greater than the distance from the first end of the light conversion layer 420a to the LED chip $n_2$. There is a gap between the first transparent layer 420c1 and the second transparent layer 420c2. In the length direction of the LED filament 400, the distance between the first transparent layer 420c1 and the second transparent layer 420c2 is greater than the length of the first transparent layer 420c1 and/or the second transparent layer 420c2. When the LED filament 400 is bent, the electrode 410/412 is prone to be separated from the light conversion layer 420, or the part where the light conversion layer 420 is in contact with the electrode 410/412 is prone to cracks. The first transparent layer 420c1 and the second transparent layer 420c2 can perform structural reinforcement on the part where the light conversion layer 420 is in contact with the electrodes 410, 412, which prevents the part where the light conversion layer 420 is in contact with the electrodes 410, 412 from cracks.

FIG. 1B is a schematic structural diagram of another embodiment of an LED filament according to this application. As shown in FIG. 1B, an LED filament 400 includes: a light conversion layer 420, LED sections 402, 404, electrodes 410, 412, and conductive sections 430 configured to electrically connect two adjacent LED sections 402, 404. The LED sections 402, 404 include at least two LED chips 442, and two adjacent LED chips 442 are electrically connected to each other by a first conductive wire 440. In this embodiment, the conductive section 430 includes a conductor 430a connecting the LED sections 402, 404.

The shortest distance between two LED chips 442 respectively located in two adjacent LED sections 402, 404 is greater than the distance between two adjacent LED chips 442 in the LED section 402/404, and the length of the first conductive wire 440 is less than the length of the conductor 430a. Therefore, it is ensured that, when bending occurs between the two LED sections 402, 404, the conductive section 430 is not easily broken due to the stress generated. The light conversion layer 420 is coated on at least two sides of the LED chips 442/the electrodes 410, 412. Parts of the electrodes 410, 412 are exposed outside the light conversion layer 420. The light conversion layer 420 has a top layer 420a and a carrying layer as an upper layer and a lower layer of the LED filament 400 respectively. In this embodiment, the carrying layer includes a base layer 420b, and the base layer 420b includes an upper surface and a lower surface opposite to the upper surface. The upper surface of the base layer 420b is close to the top layer 420a relative to the lower surface of the base layer 420b. The LED sections 402/404 and parts of the electrodes 410/412 are disposed on the upper surface of the base layer 420b, or at least one side of the LED sections 402/404 is in contact (direct contact or indirect contact) with the upper surface of the base layer 420b.

As shown in FIG. 1C, in this embodiment, the conductive section 430 is also located between the two adjacent LED sections 402, 404, and a plurality of the LED chips 442 in the LED sections 402, 404 are electrically connected to each other by the first conductive wires 440. However, the conductor 430a in the conductive section 430 in FIG. 1C is not in the form of a conductive wire but in a sheet or film form. In some embodiments, the conductor 430a may be copper foil, gold foil, or other materials that can perform electrical conduction. In this embodiment, the conductor 430a is attached to the surface of the base layer 420b and adjacent to the top layer 420a, that is, located between the base layer 420b and the top layer 420a. Moreover, the conductive section 430 and the LED sections 402, 404 are electrically connected by second conductive wires 450, that is, the two LED chips 442 respectively located in two adjacent LED sections 402, 404 and having the shortest distance from the conductive section 430 are electrically connected to the conductor 430a in the conductive section 430 by the second conductive wires 450. The length of the conductive section 430 is greater than the distance between two adjacent LED chips 442 in one LED section 402/404, and the length of the first conductive wire 440 is less than the length of the conductor 430a. This design ensures that the conductive section 430 has good bendability because the conductive section 430 has a relatively long length. Assuming that a maximum thickness of the LED chip 442 in the radial direction of the filament is H, the thickness of the electrodes 410, 412 and the conductor 430a in the radial direction of the LED filament is 0.5H to 1.4H, preferably 0.5H to 0.7H. Due to the height difference between the LED chip 442 and the electrode 410/412, the LED chip 442 and the conductor 430a, it can ensure the wire bonding process can be carried out while ensures the quality of the wire bonding process (that is, having good strength), thereby improving the stability of the product.

As shown in FIG. 1D, an LED filament 400 includes: a light conversion layer 420, LED sections 402, 404, electrodes 410, 412, and conductive sections 430 configured to electrically connect two adjacent LED sections 402, 404. The LED section 402, 404 includes at least one LED chip 442. The conductive section 430 and the LED section 402, 404 are electrically connected by a second conductive wire 450, that is, the two LED chips 442 respectively located in two adjacent LED sections 402, 404 and having the shortest distance from the conductive section 430 are electrically connected to the conductor 430a in the conductive section 430 by the second conductive wires 450. The LED chips 442 are electrically connected to each other by the first conductive wire 440. The conductive section 430 includes the conductor 430a connecting the LED sections 402, 404. For example, the conductor 430a is a conductive metal sheet or metal strip, such as a copper sheet or an iron sheet. The shortest distance between two LED chips 442 respectively located in two adjacent LED sections 402, 404 is greater than the distance between two adjacent LED chips 442 in the LED section 402/404, and the length of the first conductive wire 440 is less than the length of the conductor 430a. Therefore, it is ensured that, when bending occurs between the two LED sections 402, 404, the conductive section 430 has a large force area, and the conductive section 430 is not easily broken due to the stress generated. The light conversion layer 420 covers at least two sides of the LED chips 442/the electrodes 410, 412. Parts of the electrodes 410, 412 are exposed outside the light conversion layer 420. The light conversion layer 420 includes a top layer 420a and a carrying layer, the carrying layer includes a base layer 420b and a transparent layer 420c, and the base layer 420b is located between the top layer 420a and the transparent layer 420c. The base layer 420b and the top layer 420a cover at least two sides of the LED chips 442. The thermal conductivity of the transparent layer 420c is greater than the thermal conductivity of the base layer 420b. The thickness of the base layer 420b in the radial direction of the LED filament 400 is less than or equal to the thickness of the conductor 430a in the radial direction of the LED filament 400. When the LED filament is thinner (for example, the width of the LED filament is ≤120 μm), the heat dissipation area of the LED chips is relatively reduced. By providing the transparent layer 420c located below the base layer 420a, on the one hand, the deformation of the base layer 420a caused by heating can be reduced, and on the other hand, the transparent layer 420c can assist in supporting the LED chips 442, helping die bonding. For example, the transparent layer 420c may be a hard substrate such as an alumina ceramic plate or a sapphire substrate, or a soft substrate with high thermal conductivity (for example, the thermal conductivity≥2.0 (W/(m·K))). A translucent alumina ceramic plate or a transparent sapphire substrate facilitates the penetration of the light emitted by the LED chips 442 toward the transparent layer 420c, thereby realizing omnidirectional light of the LED filament 400. In this embodiment, the top layer 420a, the base layer 420b, and the transparent layer 420c wrap the conductor 430a. On one hand, the impact of the external environment on the conductor 430a is reduced, and on the other hand, the carrying capacity of the conductor 430a in electrical connection is improved, and the stability of the electrical connection when the conductor 430a is bent is improved. In some embodiments, the thickness of the base layer 420b in the height direction of the LED filament 400 is less than or equal to the thickness of the conductor 430a in the height direction of the LED filament 400. The heat conduction path of the heat generated by the LED chips 442 to the transparent layer 420c is short, such that the heat dissipation effect of the LED filament 400 is improved. In other embodiments, the thickness of the transparent layer 420c in the height direction of the LED filament 400 is greater than the thickness of the base layer 420b in the height direction of the LED filament 400. The heat conduction path of the heat generated by the LED chips 442 to the transparent layer 420c is short, such that the heat dissipation effect of the LED filament 400 is improved. In some embodiments, the absolute value of the height difference between the LED chip 442 and the conductor 430a in the height direction of the LED filament 400 is greater than the height of the LED chip 442 in the height direction of the LED filament 400. When the LED filament 400 is bent, the second conductive wire 450 is less deformed after being stretched under force, and the second conductive wire 450 is not prone to be broken. In some embodiments, the base layer 420b is in contact with at least one side of the LED chips 442 and one side of the conductive section 430. In this embodiment, the LED chips 442 and the conductors 430a are located on different sides of the base layer 420b.

Referring to FIG. 1E to FIG. 1G, in some embodiments, the conductor 430a includes a covering portion 430b and an exposed portion 430c, and the length of the exposed portion 430c in the axial direction of the LED filament 400 is less than the distance between adjacent LED chips 442 in any LED section 402/404. When the LED filament 400 is bent, the exposed portion 430c is slightly deformed under force with a small bending region and a small deformation degree, which is beneficial to keeping a bending shape of the LED filament 400. As shown in FIG. 1E, the exposed portion 430c includes a first exposed portion 430c1 and a second exposed portion 430c2, the portion of the top layer 420a where the conductor 430a is exposed is the first exposed portion 430c1, and the portion of the transparent layer 420c where the conductor 430a is exposed is the second exposed portion 430c2. The length of the first exposed portion 430c1 in the axial direction (length direction) of the LED filament 400 is greater than or equal to the length of the second exposed portion 430c2 in the axial direction of the LED filament 400 to ensure the stability of the electrical connection and the uniform force when the conductor 430a is bent. As shown in FIG. 1F, the exposed portion only includes the first exposed portion 430c1. The length of the first exposed portion 430c1 in the axial direction of the LED filament is less than or equal to the distance between adjacent LED chips in any LED section 402/404. When the LED filament 400 is bent, the stress generated during the bending is concentrated on the conductive section 430, which reduces the risk of breakage of the conductive wires 440 connecting adjacent LED chips 442. As shown in FIG. 1G, the exposed portion only includes the second exposed portion 430c2, which can relieve stress concentration of the conductors 430a. The length of the second exposed portion 430c2 in the axial direction of the LED filament 400 is less than or equal to the distance between adjacent LED chips 442 in any LED section 402/404. Since a part of the conductors 430a are located between adjacent transparent layers 420c, the stability of the support of the transparent layers 420c to the conductors 430a can be ensured.

Referring to FIG. 1H, an LED filament 400 has: a light conversion layer 420, LED sections 402, 404, electrodes 410, 412, and conductive sections 430 configured to electrically connect two adjacent LED sections 402, 404. The LED section 402, 404 includes at least one LED chip 442. The conductive section 430 and the LED section 402, 404 are electrically connected by a second conductive wire 450, that is, the two LED chips 442 respectively located in two adjacent LED sections 402, 404 and having the shortest distance from the conductive section 430 are electrically connected to the conductor 430a in the conductive section 430 by the second conductive wires 450. The conductive section 430 includes the conductor 430a connecting the LED sections 402, 404. For example, the conductor 430a is a conductive metal sheet or metal strip, such as a copper sheet or an iron sheet. The shortest distance between two LED chips 442 respectively located in two adjacent LED sections 402, 404 is greater than the distance between two adjacent LED chips 442 in the LED section 402/404, the two adjacent LED chips 442 are electrically connected to each other by the first conductive wire 440, and the length of the first conductive wire 440 is less than the length of the conductor 430a. When bending occurs between the two LED sections 402, 404, the conductive section 430 has a large force area, and the conductive section 430 is not easily broken due to the stress generated. The light conversion layer 420 covers at least two sides of the LED chips 442/the electrodes 410, 412. Parts of the electrodes 410, 412 are exposed outside the light conversion layer 420. The light conversion layer 420 includes a top layer (not shown) and a carrying layer. The carrying layer includes a base layer 420b and a transparent layer 420c. The LED chips 442 in the LED section 402/404 are arranged along the radial direction of the LED filament (or the width direction of the LED filament). Each LED chip 442 in the LED section 402/404 is connected to the conductor 430a and/or the electrode 410/412. In this embodiment, the widths of the base layer 420b and the transparent layer 420c in the radial direction of the LED filament are equal, the contact area between the base layer 420b and the transparent layer 420c is large, and there is no delamination between the base layer 420b and the transparent layer 420c. In other embodiments, the width of the base layer 420b in the radial direction of the LED filament is less than the width of the transparent layer 420c in the radial direction of the LED filament, the top layer (not shown) is in contact with the base layer 420b and the transparent layer 420c, and the thickness of the base layer 420b is less than the thickness of the top layer. The heat emitted by the LED chips 442 is conducted to the top layer and the transparent layer 420c at the same time through the base layer 420b, thereby improving the heat dissipation efficiency of the LED filament. Besides, the top layer and the transparent layer 420c completely wrap the base layer 420b, which can protect the base layer 420b from the external environment, and further can reduce the probability of the breakage of the second conductive wires 450 due to the protection from a plurality of sides of the top layer when the LED filament is bent, improving the yield of the product.

Referring to FIG. 1I and FIG. 1J, an LED filament includes: a light conversion layer 420; LED sections 402/404, and electrodes 410/412. The LED sections 402/404 have at least one LED chip 442. In the LED filament, the two adjacent LED chips 442 are electrically connected to each other, and the LED chips 442 and the electrodes 410/412 are electrically connected. The adjacent LED chips 442 are connected by a wire 440. The light conversion layer 420 covers each side of the wire 440. That is, the wire 440 is located in the light conversion layer 420, so as to prevent the LED filament from being broken caused by being accidentally touched by an instrument or a worker due to the exposure of the wire 440 when the LED filament is wound. The light conversion layer 420 wraps the LED sections 402/404 and the electrodes 410/412, and at least parts of two conductive electrodes 210, 212 are exposed outside. The light conversion layer 420 includes a top layer 420a and a carrying layer. The top layer 420a covers each side of the wire 440. The wire 440 has a certain distance from the carrying layer. The top layer 420a and the carrying layer may separately be a layered structure having at least one layer. The top layer 420a includes a phosphor layer 420a1 and a phosphor film layer 420a2, or the top layer 420a includes a phosphor layer 420a1 and a phosphor glue layer 420a2. The thermal conductivity of the phosphor layer 420a1 is greater than that of the phosphor film layer (or phosphor glue layer) 420a2. The phosphor layer 420a1 is in contact with at least one surface of the LED chip 42. On the one hand, the heat generated by the LED chip 442 is directly transferred to the phosphor film layer/phosphor glue layer 420a2 through the phosphor layer 420a1. Since the phosphor layer 420a1 has good thermal conductivity because there is no silica gel with no thermal conductivity or poor thermal conductivity, the heat generated by the LED chip 442 can be quickly transferred to the phosphor film layer/ phosphor glue layer 420a2 through the phosphor layer 420a1, so as to prevent heat from accumulating near the LED chip 442. The phosphor film layer/phosphor glue layer 420a2 is in contact with the phosphor layer 420a1. On the other hand, the light emitted by the LED chip 442 excites the phosphor layer 420a1 to generate light of one color (such as red), and the phosphor layer 420a1 has a weak ability to absorb the light emitted by the LED chip, so the optical loss caused is small, and the luminous flux of the LED light bulb will not be affected. The light emitted by the LED chip 442 is converted into white light through the phosphor film layer/phosphor glue layer 420a2, and the light generated by exciting the phosphor layer 420a1 can supplement the white light with color light in a certain wavelength range (such as red light in a wavelength of 610-650 nm), so that the color rendering index (Ra) of the LED light bulb is at least greater than 85 and/or R9 is greater than 45. After the LED light bulb is lit, the color gamut of the color reproduction of the lighting environment can be increased, and the quality of the lighting environment can be improved. Further, the phosphor layer 420a1 only covers the upper surface (or light-emitting surface) of the LED chip 442 or the phosphor layer 420a1 is only in contact with the upper surface (or light-emitting surface) of the LED chip 442. Because the light-emitting angle (or beam angle) of the LED chip 442 is generally 120 degrees, and the phosphor is generally expensive, the phosphor layer 420a1 only covers the upper surface (or light-emitting surface) of the LED chip, which can not only achieve the above-mentioned light-emitting effect, but also reduce the material cost of the LED light bulb.

In some embodiments, the phosphor layer 420a1 wraps one part of the wire 440, the phosphor film/phosphor glue layer 420a2 wraps the other part of the wire 440, and the phosphor layer 420a1 and the phosphor film (or phosphor glue) layer 420a2 together cover the wire 440. The hardness of the phosphor layer 420a1 is greater than that of the phosphor film layer/phosphor glue layer 420a2, or the flexibility or bendability of the phosphor layer 420a1 is lower than that of the phosphor film layer/phosphor glue layer 420a2. The connection between the wire 440 and the LED chip 442 is wrapped by the phosphor layer 420a1, so the bendability of the connection between the wire 440 and the LED chip 442 can be reduced. In addition, due to the protective effect of the phosphor layer 420a1, the risk of breakage at the connection between the wire 440 and the LED chip 442 can be further reduced. Moreover, the phosphor layer 420a1 and the phosphor film layer/phosphor glue layer 420a2 can double protect the wire 440 to prevent the wire from breaking when the LED filament is bent. The quality of wire bonding is mainly determined by five points A, B, C, D, and E. A is the connection between a chip bonding pad 4401 and a gold ball 4403. B is the connection between the gold ball 4403 and the wire 440. C is between two sections of the wire 440. D is the connection between the wire 440 and a two-spot bonding bar 4402. E is between the two-spot bonding bar 4402 and the surface of the chip 442. Because point B is a first bending point of the wire 440 that is laid out in arc, and the wire diameter of the wire 440 at point D is relatively thin, so the wire 440 is easily broken at points B and D. Therefore, for example, in a case that the structure shown in FIG. 1K is implemented, when the LED filament is bent, the part of the wire 440 located in the phosphor film layer/phosphor glue layer 420a2 is mainly stressed, while the part of the wire 440 located in the phosphor layer 420a1 is less stressed, so the thickness of the phosphor layer 420a1 can be smaller than the thickness of the phosphor film layer (or phosphor glue layer) 420a2, and the phosphor layer 420a1 can cover points B and D of the wire. Due to the material properties (hardness, flexibility, or bendability) of the phosphor layer 420a1, the wire can be prevented from breaking at points B and D.

As shown in FIG. 1I, each LED chip 442 is covered with a phosphor layer 420a1, and a part of the phosphor film layer (or phosphor glue layer) 420a2 in the LED filament is in direct contact with the carrying layer. In some embodiments, this part is located between two adjacent LED chips 442, and the phosphor layer 420a1 only covers the LED chip 442, which can not only achieve the above-mentioned light-emitting effect, but also reduce the production cost of the LED light bulb.

As shown in FIG. 1J, the phosphor layer 420a1 extends along the length direction of the LED filament. The phosphor layer 420a1 may be coated on a single LED filament or on a plurality of LED filaments together. The coating process is simple and the production efficiency is high. In the LED filament, a part of the phosphor layer 420a1 is in direct contact with the carrying layer. In some embodiments, this part is located between two adjacent LED chips. Since the area of the phosphor layer 420a1 increases (the heat dissipation area also increases) and the phosphor layer 420a1 is thin, the heat generated by the LED chip 442 is easily transferred from the phosphor layer 420a1 to the phosphor film layer (or phosphor glue layer) 420a2.

In some embodiments, the phosphor layer 420a1 includes phosphor and silica gel. The viscosity of silica gel is not greater than 1600 mPa·s (25° C., 10 rpm). The phosphor is easy to mix uniformly with the silica gel. The phosphor layer is relatively flat after coating. If the viscosity of silica gel is greater than 1500 mPa·s (25° C., 10 rpm), when the phosphor layer 420a1 is prepared, a diluent (such as kerosene) may be added. The silica gel is mixed with the diluent first to reduce the viscosity, and then mixed with the phosphor. After the phosphor layer 420a1 is coated, the diluent is volatilized (for example, by means of air drying), to form the phosphor layer 420a1 on the surface of the LED chip 442. The phosphor may be a phosphor with a narrow full width at half maximum (the full width at half maximum is not greater than 50 nm), which has a narrow full width at half maximum, strong energy, and high excitation efficiency. In order to supplement red light in general lighting devices, some phosphors in the low peak wavelength band (the peak wavelength is not greater than 630 nm) and some phosphors in the high peak wavelength band (the peak wavelength is greater than 640 nm) are combined for use. However, these phosphors generally have a wide full width at half maximum and a low excitation efficiency. After the lighting device is lit, the R9 value is small, and the color gamut of color reproduction is reduced. In one embodiment, phosphors with a full width at half maximum (FWHM) of 10-30 nm and a peak wavelength of 630-635 nm may be used to supplement red light within a certain peak wavelength range, so that the color gamut of color reproduction is increased.

Next, the chip bonding related design of the LED filament is described. FIG. 1L is a top view of an LED filament with a top layer removed in an unbent state according to an embodiment of this application. The LED filament includes a first LED chip unit 202, a second LED chip unit 204, and electrodes 210/212. The first LED chip unit 202 and the second LED chip unit 204 are electrically connected to the electrodes 210/212 respectively. The extending direction of the first LED chip unit 202 is parallel or substantially parallel to the extending direction of the second LED chip unit 204. The first LED chip unit 202 and the second LED chip unit 204 are connected in parallel. The first LED chip unit 202 and the second LED chip unit 204 respectively include a plurality of LED chips 442. The distance between two adjacent LED chips 442 in the first LED chip unit 202 is equal to the distance between two adjacent LED chips 442 in the second LED chip unit 204. In other embodiments, the distance between two adjacent LED chips 442 in the first LED chip unit 202 may not be equal to the distance between two adjacent LED chips 442 in the second LED chip unit 204. The light conversion layer 420 has a first end and a second end opposite to the first end. The LED chips 442 are located between the first end and the second end. If the LED chip 442 closest to the first end in the first LED chip unit 202 is denoted as LED chip $a_1$, then LED chips 442 from the first end to the second end are sequentially LED chip $a_2$, LED chip $a_3$, ..., and LED chip $a_m$, where m is an integer. If the LED chip 442 closest to the first end in the second LED chip unit 204 is denoted as LED chip $b_1$, then LED chips 442 from the first end to the second end are sequentially LED chip $b_2$, LED chip $b_3$, ..., and LED chip $b_n$, where n is an integer. In the length direction of the LED filament, the LED chip $b_n$ is located between the LED chip $a_m$ and the LED chip $a_{m+1}$, and the projection of the LED chip $a_m$ in the width direction of the LED filament and the projection of the LED chip $b_n$ in the width direction of the LED filament do not have an overlapping region (n=m). That is, the LED chips 442 of the first LED chip unit 202 and the LED chips 442 of the second LED chip unit 204 are arranged alternately in the length direction of the LED filament. With the same quantity of LED chips, a larger length of the LED filament indicates a larger distance between two adjacent LED chips, and more significant light spots (or graininess) observed by the naked eye after the filament is lit, which seriously affects the visual comfort of users. In addition, for the same length of LED filament, a larger quantity of LED chips indicates a smaller distance between two adjacent LED chips, and the heat generated by the adjacent LED chips will affect each other. In order to ensure that the LED filament has excellent light emitting effect and heat dissipation performance, in this embodiment, the first LED chip unit 202 and the second LED chip unit 204 are connected in parallel, and the LED chips 442 in the second LED chip unit 204 are located between two adjacent LED chips 442 in the first LED chip unit 202. Since the light emitted by the second LED chip unit 204 can supplement the light spot generated by the first LED chip unit 202, the light emitting effect of the LED filament is improved. In addition, compared with the LED filament with the same LED filament length and the same quantity of LED chips, the distance between two adjacent LED chips in the first LED chip unit 202 and the second LED chip unit 204 is larger, the heat generated by adjacent LED chips is not prone to affect each other, and the junction temperature of the LED filament is reduced.

In another embodiment, the projections of the LED chips 442 in the first LED chip unit 202 and the LED chips 442 in the second LED chip unit 204 respectively have an overlapping region in the length direction of the LED filament. The projections of the LED chip $a_m$ and the LED chip $b_n$ have an overlapping region in the length direction of the LED filament. In the width direction of the LED filament, the distance between the LED chip $a_m$ and the LED chip $b_n$ is reduced, so the width of the LED filament is narrowed. When the width of the LED filament is close to that of a conventional tungsten filament lamp, the LED filament is more beautiful when winding. Specifically, the LED chip $a_m$ and the LED chip $b_n$ respectively have a plurality of side surfaces. In the length direction of the LED filament, a side surface of the LED chip $b_n$ is located between a side surface $S_1$ of the LED chip $a_m$ and a side surface $S_2$ of the LED chip $a_{m+1}$. In one embodiment, the side surface $S_1$ is opposite to the side surface $S_2$. In one embodiment, in the width direction of the LED filament, the widths of the LED chip $a_m$ and the LED chip $b_n$ are Wa and Wb respectively, and the width W of the LED filament is not less than the sum of Wa and Wb, that is, W≥Wa+Wb.

In one embodiment, the LED chip has a first light-emitting surface and a second light-emitting surface. The first light-emitting surface and the second light-emitting surface are opposite to each other. The light from the first light-emitting surface (front side) is directed toward a top layer, and the light from the second light-emitting surface (reverse side) is directed toward a carrying layer. The luminous flux of the light emitted from the front side of the LED chip is equal to or approximately equal to the luminous flux of the light emitted from the reverse side of the LED chip (the absolute value of the difference between the luminous fluxes of the front and reverse sides is less than or equal to 30 lm). The brightness difference between the front side and reverse side of the LED chip is small. If the above LED chips are used in the LED filament, after the LED filament is wound, the light is emitted uniformly in all directions, and the LED light bulb has an excellent light emission effect.

FIG. 1M is a top view of an LED filament with a top layer removed in an unbent state according to an embodiment of this application. The LED filament includes electrodes 210/212, LED chips 442, and a wire 440. There are a plurality of LED chips 442, the plurality of LED chips 442 are arranged on the LED filament in two columns (that is, adjacent LED chips 442 are arranged alternately in the width direction of the LED filament), and the two columns of LED chips 442 are respectively arranged along the length direction of the LED filament. The LED chips 442 are connected in series. In the length direction of the LED filament, adjacent LED chips 442 are connected by the wire 440. In FIG. 1M, the LED chip 442 closest to the electrode 210 in the length direction of the LED filament is electrically connected to the electrode 210 through a first conductive portion 240. The LED chip 442 closest to the electrode 212 in the length direction of the LED filament is electrically connected to the electrode 210 through the first conductive portion 240. The first conductive portion 240 may be a conductive wire.

In this embodiment, the LED chip 442 has a length dimension a along the length direction of the filament, and the ratio of the sum of the lengths a (that is, Ea) of all the LED chips 442 to the length of the LED filament is greater than 0.5, 0.6, 0.65, or 0.7, to ensure the arrangement density of the LED chips 442 in the length direction of the LED filament, so as to increase the total luminous flux and effectively reduce the graininess of the emitted light. In addition, since the adjacent LED chips 442 are arranged alternately in the width direction of the LED filament, the LED chips can have better bendability under the premise that the LED chips have the same spacing. Conversely, the ratio of the sum of the lengths of all the LED chips 442 to the length of the LED filament is greater than 0.5, 0.6, 0.65, or 0.7, and the LED chips 442 are arranged in a single column, which may cause poor bendability of the LED filament, so the LED filament cannot be bent normally, and the shape of the filament is limited.

Figure 2C:
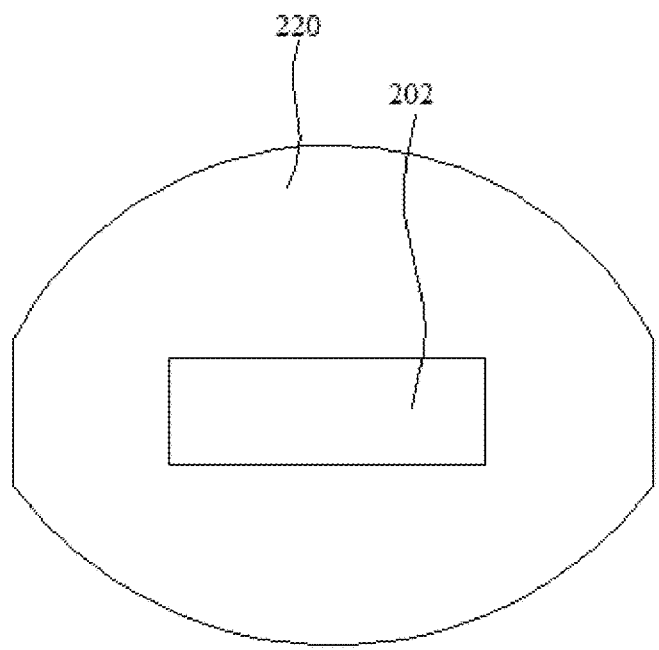
FIG. 2C is a schematic partial cross-sectional view of a position A-A in FIG. 2A.

Still referring to FIG. 2A to FIG. 2C, FIG. 2A is a schematic three-dimensional partial cross-sectional view of an embodiment of an LED filament according to this application, FIG. 2B is a bottom view of FIG. 2A, and FIG. 2C is a schematic partial cross-sectional view of a position A-A in FIG. 2A. An LED filament 300 includes a plurality of LED chip units 202, 204, at least two conductive electrodes 210, 212, and a light conversion layer 220. The LED chip units 202, 204 are electrically connected to each other. The conductive electrodes 210, 212 are configured corresponding to the LED chip units 202, 204 and are electrically connected to the LED chip units 202, 204 by first conductive portions 240. The light conversion layer 220 wraps the LED chip units 202, 204 and the conductive electrodes 210, 212, and exposes at least parts of the two conductive electrodes 210, 212. The light conversion layer 220 includes silica glue, phosphor, and heat dissipation particles. In some embodiments, the LED chip unit 202/204 includes at least one LED chip. The concentration of phosphor corresponding to each surface of the LED chip is the same, so that the light conversion rate of each surface is the same, and the light uniformity of the LED filament is good.

The LED chip unit 202/204 includes at least one LED chip, and the LED chip unit 202/204 has a first electrical connecting portion 206a and a second electrical connecting portion 206b. In the length direction of the LED filament, the distance between first connecting portions 206a of two adjacent LED chip units is greater than the distance between the two adjacent LED chip units. In some embodiments, in the length direction of the LED filament, the distance between the first connecting portion 206a and the second connecting portion 206b of two adjacent LED chip units 202, 204 is greater than the distance between the two adjacent LED chip units 202, 204, and at least a part of the first electrical connecting portion 206a and the second electrical connecting portion 206b is in contact with the light conversion layer 220. The first electrical connecting portion 206a and the second electrical connecting portion 206b are located on the same side of the LED chip unit 202/204.

In one embodiment, the second electrical connecting portion 206b of the LED chip unit 202 is electrically connected to the first electrical connecting portion 206a of the LED chip unit 204. For example, the second electrical connecting portion 206b of the LED chip unit 202 may be electrically connected to the first electrical connecting portion 206a of the LED chip unit 204 by the second conductive portion 260. The second conductive portion 260 has an end point a and an end point b, a line connecting the end point a and the end point b forms a straight line ab, and the straight line ab intersects the length direction p of the LED filament. In some embodiments, the light conversion layer 220 includes a top layer and a carrying layer (not shown). The top layer wraps the LED chip units 202, 204 and the conductive electrodes 210, 212, and exposes at least parts of the two conductive electrodes 210, 212. The carrying layer includes a base layer. The base layer includes an upper surface and a lower surface opposite to the upper surface. The upper surface of the base layer is close to the top layer relative to the lower surface of the base layer. At least one of the first conductive portion 240 and the second conductive portion 260 is in contact (direct contact or indirect contact) with the upper surface of the base layer. When the LED filament is bent, the curvature radius of the base layer after being bent under force is relatively small, and the first conductive portion and the second conductive portion are not prone to be broken. In one embodiment, the first electrical connecting portion 206a and the second electrical connecting portion 206b are in contact (direct contact or indirect contact) with the upper surface of the base layer. The LED chip unit may be a flip chip or a mini LED chip. The mini LED refers to an LED with a package size of 0.1-0.2 mm, also referred to as the mini light emitting diode. When the LED chip unit is electrically connected, for example, the second electrical connecting portion 206b of the LED chip unit 202 may be a positive connection point, and the first electrical connecting portion 206a of the LED chip unit 204 may be a negative connection point, the second electrical connecting portion 206b of the LED chip unit 202 is electrically connected to the first electrical connecting portion 206a of the LED chip unit 204 by the second conductive portion 260. In another example, the second electrical connecting portion 206b of the LED chip unit 202 may be a negative connection point, and the first electrical connecting portion 206a of the LED chip unit 204 may be a positive connection point, the second electrical connecting portion 206b of the LED chip unit 202 is electrically connected to the first electrical connecting portion 206a of the LED chip unit 204 by the second conductive portion 260. The first conductive portion 240 and the second conductive portion 260 may be in the form of wires or films, such as copper wires, gold wires, circuit films, or copper foil.

Figure 3A:
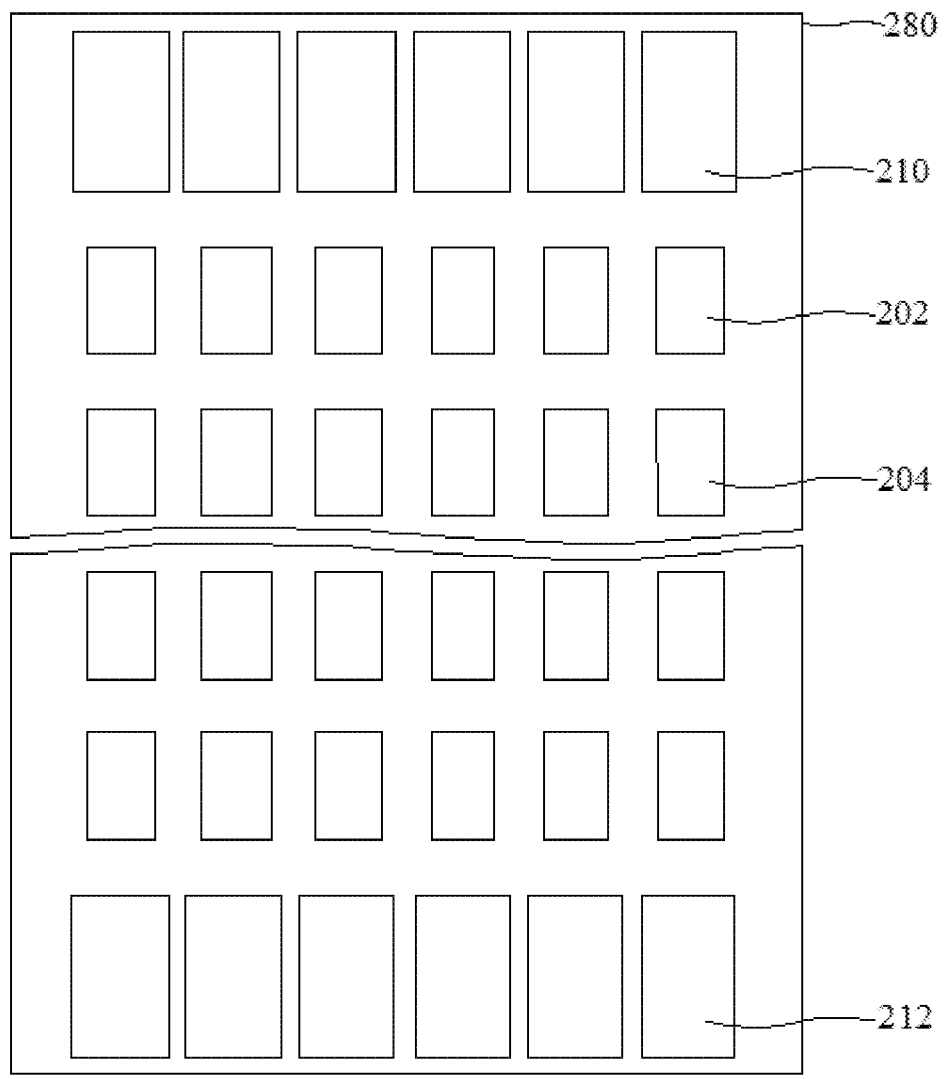
FIG. 3A to FIG. 3E are schematic diagrams of a first embodiment of a method for manufacturing an LED filament according to this application.

FIG. 3A to FIG. 3E are schematic diagrams of one embodiment of a method for manufacturing an LED filament according to this application. The method for manufacturing an LED filament includes the following steps:

S20. Lay LED chip units 202, 204 and conductive electrodes 210, 212 on a carrier 280 (as shown in FIG. 3A).

Figure 3B:
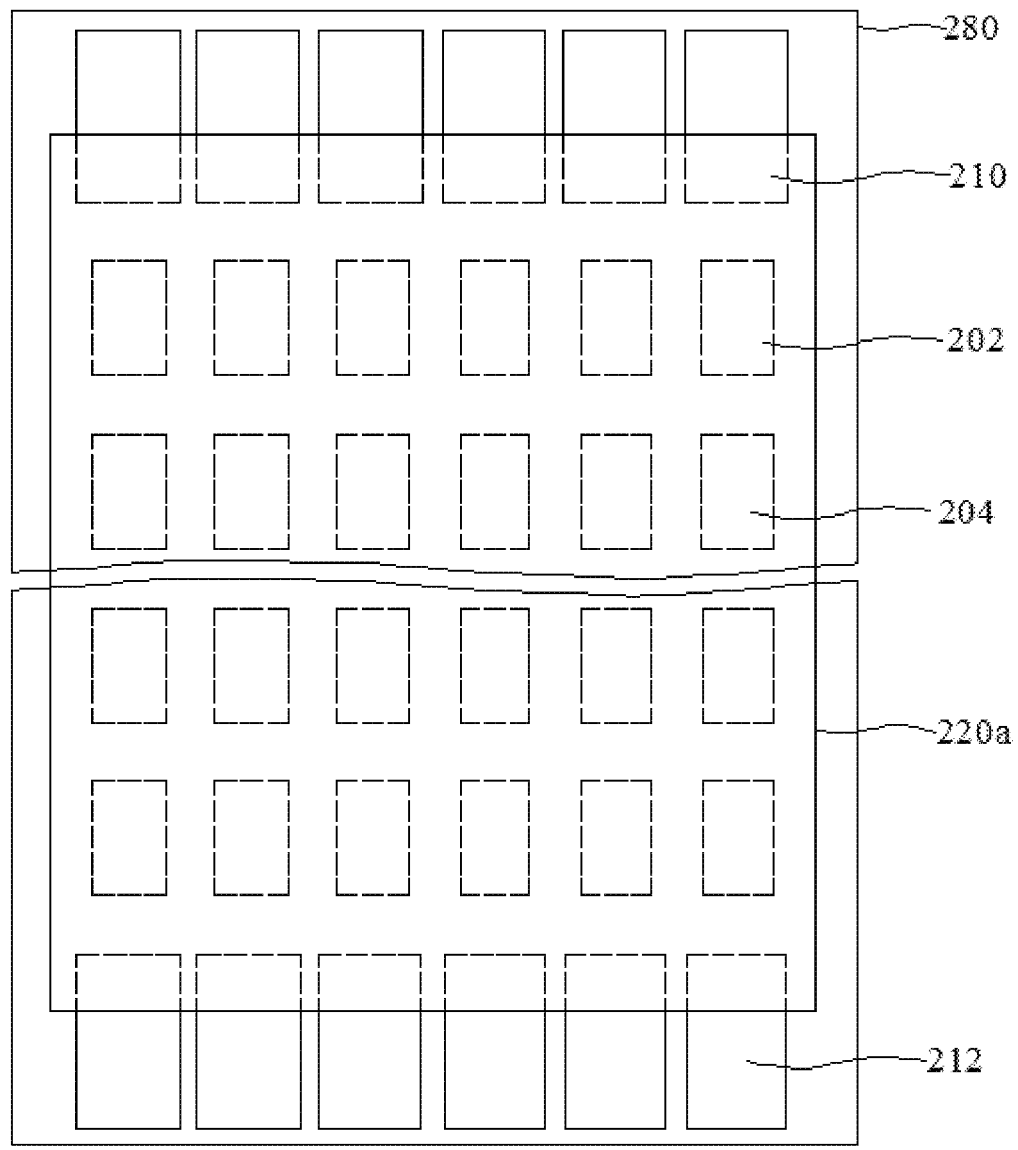

S22A. Coat the portion where the LED chip units 202, 204 and the conductive electrodes 210, 212 are not in contact with the carrier 280 with a top layer 220a, and then cure (or solidify) the LED chip units 202, 204 and the conductive electrodes 210, 212 that are coated with the top layer 220a, so that the top layer 220a is cured and covers the LED chip units 202, 204 and the conductive electrodes 210, 212 on the carrier, and at least parts of the two conductive electrodes 210, 212 are exposed (as shown in FIG. 3B). The curing procedure is, for example, but not limited to, heating or ultraviolet (UV) irradiation.

S22B. There are several ways to flip the LED chip units 202, 204 and the conductive electrodes 210, 212 that are coated with the top layer 220a, one is that the LED chip units 202, 204 and the conductive electrodes 210, 212 are only disposed on the carrier 280 with no adhesion therebetween and therefore can be flipped directly, and the flipped semi-finished product may be laid on the carrier 280.

The other is that, if there is a glue-like substance, such as a photoresist used in a semiconductor process or easy-to-remove die-bonding glue, for adhesion between the carrier 280 and the LED chip units 202, 204 and the conductive electrodes 210, 212, after being properly baked, the glue-like substance has the effect of temporarily fixing the LED chip units 202, 204 and the conductive electrodes 210, 212 on the carrier 280. Therefore, before or after the LED chip units 202, 204 and the conductive electrodes 210, 212 that are coated with the top layer 220a are flipped, the photoresist coated on the carrier 280 may be cleaned with acetone, or the die-bonding glue on the carrier may be removed with a corresponding solvent, so that the LED chip units 202, 204 and the conductive electrodes 210, 212 that are coated with the top layer 220a can be separated from the carrier 280. In addition, washing may be further performed to remove residual photoresist or die-bonding glue.

Figure 3C:
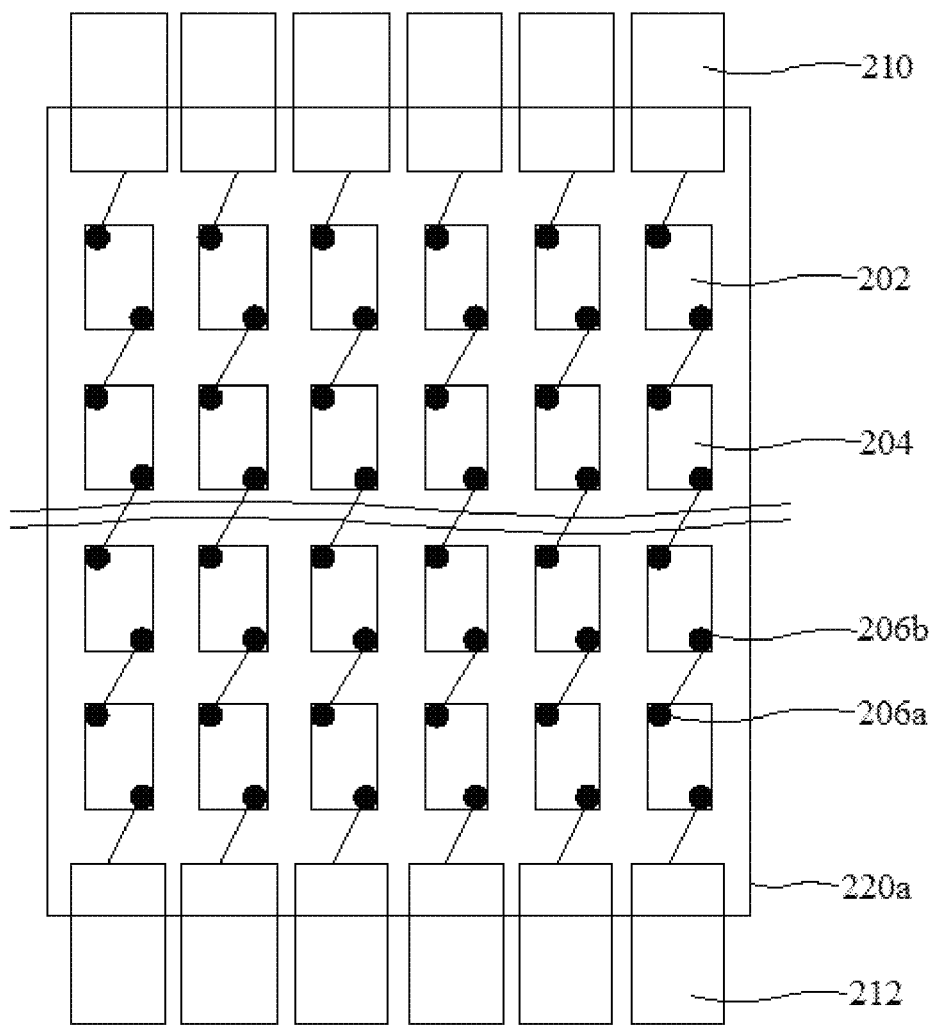

S24. Electrically connect adjacent LED chip units 202, 204, and the LED chip units 202/204 with the conductive electrodes 210, 212 (as shown in FIG. 3C).

Figure 3D:
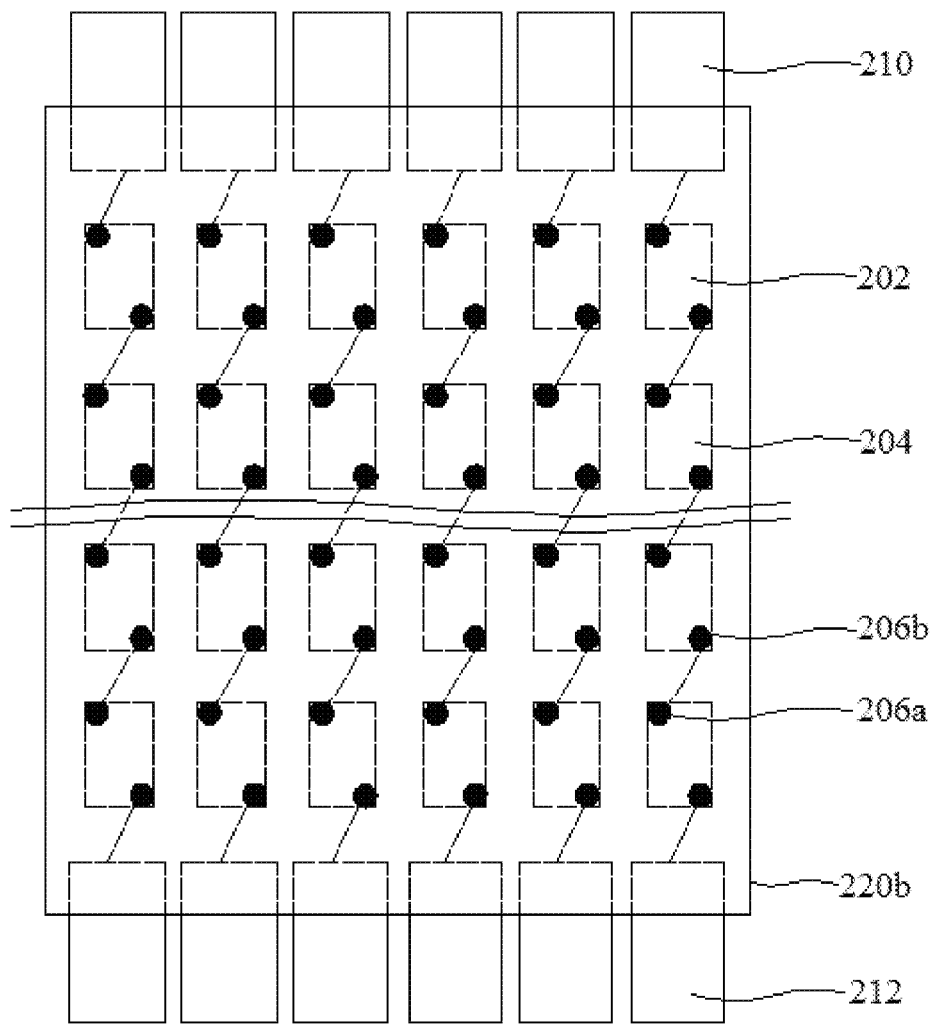

S26. After step S24, coat the portion where the LED chip units 202, 204 and the conductive electrodes 210, 212 are not coated with the top layer 220a with a base layer 220b, and perform curing after the coating is completed (as shown in FIG. 3D).

It is particularly noted that, in order to increase the adhesion, a die-bonding glue may be included between the base layer 220b and the chip units 202, 204. Further, in order to ensure that the chip units 202, 204 can be stably attached to the base layer 220b, at least 80% of the area of the bottom surface where each chip unit 202, 204 is attached to the base layer 220b is attached with the die-bonding glue. Further, at least 100% of the area of the bottom surface where each chip unit 202, 204 is attached to the base layer 220b is attached with the die-bonding glue.

Figure 3E:
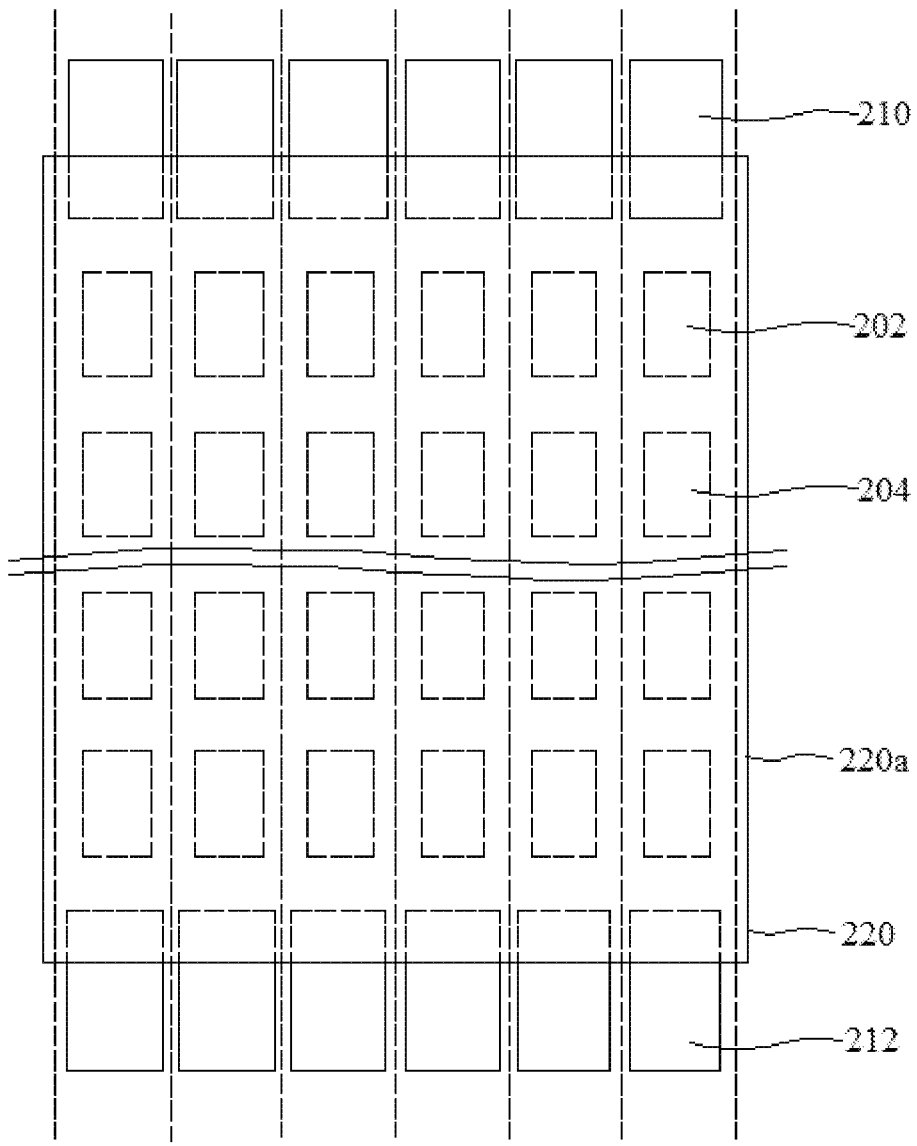

After step S26, another step S28 of cutting the LED chip units 202, 204 and the conductive electrodes 210, 212 that are wrapped with a light conversion layer 220 as cutting positions shown by dashed lines in FIG. 3E may be included. In this way, a strip-shaped element after cutting is the LED filament 300. The cutting method of step S28 is not limited to FIG. 3E, and every two adjacent columns of LED chip units 202, 204 may be cut into a single LED filament.

In the method for manufacturing an LED filament in this embodiment, the top layer 220a and the base layer 220b may be made of phosphor and silica glue in the same proportion. If the top layer 220a and the base layer 220b further contain oxidized nanoparticles, the proportions of phosphor, silica glue, and oxidized nanoparticles in the top layer 220a and the base layer 220b are the same. In other words, the materials of the top layer 220a and the base layer 220b are the same, and the top layer 220a and the base layer 220b are distinguished only for the convenience of description. Certainly, in other embodiments, the proportions of phosphor, silica glue, and oxidized nanoparticles in the top layer 220a and the base layer 220b may be different.

In one embodiment, the above mentioned base layer contains organosilicon-modified polyimide, a thermal curing agent, which is epoxy resin, isocyanate, or bisoxazoline compound, heat dissipation particles, and phosphor, the heat dissipation particles include silicon dioxide ($SiO_2$), aluminum oxide ($Al_2O_3$) and zirconium oxide ($ZrO_2$), etc. In one embodiment, based on the weight of the organosilicon-modified polyimide, the amount of the thermal curing agent is 3-12% of the weight of the organosilicon-modified polyimide. The organosilicon-modified polyimide includes a repeating unit represented by the following general formula (I):

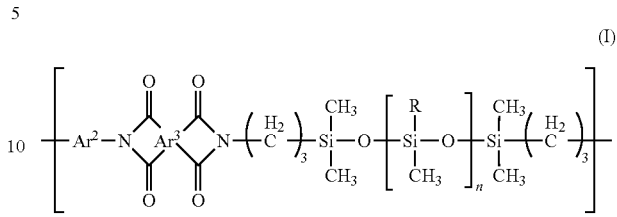

In the general formula (I), $Ar^1$ is a tetravalent organic group. The organic group has a benzene ring or an alicyclic hydrocarbon structure. The alicyclic hydrocarbon structure may be a monocyclic alicyclic hydrocarbon structure, or may have an alicyclic hydrocarbon structure containing a bridged ring, which may be a bicyclic alicyclic hydrocarbon structure or a tricyclic alicyclic hydrocarbon structure. The organic group may alternatively be a benzene-ring structure or an alicyclic hydrocarbon structure containing an active hydrogen functional group, wherein the active hydrogen functional group is any one or more of a hydroxy group, an amino group, a carboxyl group, an amido group, or a thiol group.

$Ar^2$ is a divalent organic group. The organic group may have, for example, a monocyclic alicyclic hydrocarbon structure, or may be a divalent organic group containing an active hydrogen functional group, wherein the active hydrogen functional group is any one or more of a hydroxy group, an amino group, a carboxyl group, an amido group, or a thiol group.

R is independently selected from methyl or phenyl.

n is 1-5, preferably 1, 2, 3, or 5.

The polymer of the general formula (I) has a number average molecular weight of 5,000-100,000, preferably 10,000-60,000, more preferably 20,000-40,000. The number average molecular weight is determined by gel permeation chromatography (GPC) and calculated based on a calibration curve obtained by using standard polystyrene. When the number average molecular weight is below 5,000, good mechanical properties are hard to be obtained after curing, especially the elongation tends to decrease. On the other hand, when the number average molecular weight exceeds 100,000, the viscosity becomes excessively high, making the resin hard to form.

$Ar^1$ is a component derived from a dianhydride, which may include an aromatic anhydride and an aliphatic anhydride. The aromatic anhydride includes an aromatic anhydride containing only a benzene ring, a fluorinated aromatic anhydride, an aromatic anhydride containing an amido group, an aromatic anhydride containing an ester group, an aromatic anhydride containing an ether group, an aromatic anhydride containing a sulfide group, an aromatic anhydride containing a sulfonyl group, and an aromatic anhydride containing a carbonyl group.

$Ar^2$ is a component derived from a diamine, which may include an aromatic diamine and an aliphatic diamine. The aromatic diamine includes an aromatic diamine containing only a benzene ring, a fluorinated aromatic diamine, an aromatic diamine containing an ester group, an aromatic diamine containing an ether group, an aromatic diamine containing an amido group, an aromatic diamine containing a carbonyl group, an aromatic diamine containing a hydroxyl group, an aromatic diamine containing a carboxy group, an aromatic diamine containing a sulfonyl group, and an aromatic diamine containing a sulfide group.

Adding different thermal curing agents imposes different effects on the light transmittance of the organosilicon-modified polyimide.

Even if the same thermal curing agent is added, different added amounts have different effects on the light transmittance. Table 1-1 shows that, when the added amount of the thermal curing agent BPA into the full aliphatic organosilicon-modified polyimide is increased from 4% to 8%, the light transmittance increases. However, when the added amount is further increased to 12%, the light transmittance keeps almost constant. It is shown that the light transmittance increases with the increase of the added amount of the thermal curing agent, but after the light transmittance increases to a certain degree, adding more thermal curing agent has a limited effect on the light transmittance.

TABLE 1-1

| Organosilicon-modified polyimide | Thermal curing agent | | Light transmittance (%) | | | Mechanical Strength | | |
|---|---|---|---|---|---|---|---|---|
| | Type | Added amount (%) | 380 nm | 410 nm | 450 nm | Thickness of film (μm) | Elongation (%) | Tensile strength (MPa) |
| Full aliphatic | BPA | 4.0 | 86.2 | 88.4 | 89.7 | 44 | 22.5 | 9.8 |
| Full aliphatic | | 8.0 | 87.1 | 89.1 | 90.6 | 44 | 24.4 | 10.5 |
| Full aliphatic | | 12.0 | 87.3 | 88.9 | 90.5 | 44 | 20.1 | 9.0 |

A phosphor composition as a part of the top layer 420b includes a first phosphor with a peak wavelength at 490-500 nm and a full width at half maximum (FWHM) of 29-32 nm under blue light excitation, a second phosphor with a peak wavelength at 520-540 nm and a FWHM of 110-115 nm under blue light excitation, a third phosphor with a peak wavelength at 660-672 nm and a FWHM of 15-18 nm under blue light excitation, and a fourth phosphor with a peak wavelength at 600-612 nm and a FWHM of 72-75 nm, or with a peak wavelength at 620-628 nm and a FWHM of 16-18 nm, or with a peak wavelength at 640-650 nm and a FWHM of 85-90 nm under blue light excitations. The median particle diameter (D50) of any one of the first phosphor, the second phosphor, the third phosphor, and the fourth phosphor ranges from 15 μm to 20 μm. The range of D50 of the second phosphor and the third phosphor is preferably 15-16 μm. The range of D50 of the first phosphor and the fourth phosphor is preferably 16-20 μm. When the phosphor is excited by blue light, the different thicknesses of the top layer with consistent phosphor concentration will affect the FWHM of the phosphor. In this embodiment, the thickness of the top layer 420b is 80-100 μm. The weight percentage of each phosphor in the phosphor composition is as follows: the first phosphor is 5.45-5.55%, the second phosphor is 70-88%, the third phosphor is 0.6-7%, and the fourth phosphor is the remaining. The phosphor is mixed under a certain ratio of phosphor to glue. Phosphors with different peak wavelengths are selected, and under the conditions of a blue LED chip with a wavelength peak of 451 nm and an FWHM of 16.3 nm, and a current of 30 mA, the results of light performance of different phosphor compositions are shown in Table 1:

TABLE 1

| | Content (%) | | | | | | | | |
|---|---|---|---|---|---|---|---|---|---|
| | First phosphor | Second phosphor | Third phosphor | Fourth phosphor | | Proportion of total phosphor to glue | Eff | | | CCT |
| No. | 495 nm | 535 nm | 670 nm | 630 nm | 652 nm | (%) | (lm/w) | Ra | R9 | (K) |
| 1 | 5.49 | 72.55 | 0.83 | | 21.13 | 27.4 | 103.5 | 94.7 | 93.0 | 2641 |
| 2 | 5.49 | 72.55 | 2.54 | | 15.45 | 27.4 | 107.0 | 92.8 | 81.9 | 2683 |
| 3 | 5.51 | 85.83 | 5.04 | 3.62 | | 27.6 | 102.0 | 197.0 | 91.5 | 2621 |
| 4 | 5.51 | 85.83 | 4.63 | 3.59 | | 27.6 | 106.8 | 97.1 | 84.9 | 2670 |

It can be learned from top layers No. 1 to No. 4 in Table 1 that the content of the third phosphor and the fourth phosphor in the phosphor composition affects the luminous efficiency (Eff), average color rendering index (Ra), and saturated red color (R9). It can be learned from compositions No. 1 and No. 2 that, when the content of the fourth phosphor with a peak wavelength at 670 nm increases, the Eff will increase, but Ra and R9 will decrease. When the phosphor with a peak wavelength at 652 nm is replaced with the phosphor with a peak wavelength at 630 nm, it can be learned from No. 3 and No. 4 in Table 1 that, when the content of the fourth phosphor with a peak wavelength at 670 nm increases, the Eff will decrease, but Ra and R9 will increase. Therefore, when the fourth phosphor with different wavelength peaks is selected, the amount of the third phosphor and the fourth phosphor may be adjusted according to actual needs to obtain relatively good luminous performance.

Ratio Between Phosphor and Glue

As shown in Table 2, the same phosphor is used, and the ratio of phosphor composition to glue is adjusted. It can be seen from Table 2 that different ratios of phosphor composition to glue result in different Eff, Ra, R9, and Correlated Color Temperature (CCT), and as the ratio of phosphor composition to glue increases, Eff, Ra, and CCT decrease, and R9 first decreases and then increases. In addition, when the phosphor composition with a glue (for example, silica glue) is used as the top layer of the LED filament, since the specific weight of the phosphor composition is greater than that of the silica glue, apparent precipitation of the phosphor will occur during the manufacturing process of the top layer, causing the white LED color temperature to drift. The more ratio of the phosphor composition to the glue, the more produced precipitation of the phosphor, resulting in a more severe color temperature drift. Therefore, the weight ratio of the phosphor composition to the glue in the top layer is 0.2-0.3:1, preferably 0.25-0.3:1. In one embodiment, a certain amount of hollow glass microbeads may be added into the phosphor composition. When the phosphor precipitates, the glass microbeads float up, and the light backscattering/emission degree decreases during floating, which offsets the effect of light scattering by phosphor settling, so that the drift in the color temperature can be alleviated. In addition, because the microbeads absorb less visible light, the addition of the glass microbeads has less effect on the initial brightness of the white light LEDs. The mass ratio of the glass microbeads to the phosphor composition is 1:5-15, and preferably the weight ratio of the glass microbeads to the phosphor composition is 1:10-15.

wavelength at 500-550 nm and a FWHM of 100-130 nm under blue light excitation, a second phosphor with a peak wavelength at 580-620 nm and a FWHM of 70-90 nm under blue light excitation, and a third phosphor with a peak wavelength at 620-670 nm and a FWHM of 70-95 nm under blue light excitation. The median particle diameter (D50) of any one of the first phosphor, the second phosphor, and the third phosphor ranges from 15 μm to 20 μm. The range of D50 of the first phosphor is preferably 15-16 μm. The range of D50 of the second phosphor and the third phosphor is preferably 16-20 μm. When the phosphor is excited by blue light, the different thicknesses of the top layer with consistent phosphor concentration will affect the FWHM of the phosphor. In this embodiment, the thickness of the top layer 420b is 80-100 μm. The amount of the first phosphor in the phosphor composition is less than or equal to 10 times the sum of the amounts of the second phosphor and the third phosphor, that is, the amount of the first phosphor≤10*(the amount of the second phosphor+the amount of the third phosphor). The weight ratio of phosphor composition to glue in the top layer is 0.4-0.8:1. The closer the amount of the phosphor composition is to the amount of the silica glue, the higher the conversion efficiency of the light emitted by the LED chips is. In addition, the contact area between the phosphor and the LED chips increases, and then the heat dissipation efficiency of the heat generated by the LED chips is improved.

As shown in FIG. 1N, an LED filament is provided in one embodiment, the basic structure of which may be the same as that in the above embodiments. That is, the LED filament includes a light conversion layer 420, an LED chip 442, and an electrode 410. The LED chips 442 are connected by a first wire 440, the LED chip 442 and the electrode 410 are connected by a second wire 450, and the light conversion layer 420 wraps the LED chip 442 and at least a part of the electrode 410. In addition, the basic structure or material composition of the light conversion layer 420 in this embodiment may also be the same as that in the above embodiments. In this embodiment, the LED chips 442 form an LED section 402. In this embodiment, the light conversion layer 420 at the connection of the light conversion layer 420 and the electrode 410 forms a connection portion 460, the connection portion 460 wraps at least part of the electrode 410, and the connection portion 460 does not cover (or include) the LED chip 442. In this embodiment, one end of the electrode 410 is exposed to the outside of the connection

TABLE 2

| | Content (%) | | | | | | | | |
|---|---|---|---|---|---|---|---|---|---|
| | First phosphor | Second phosphor | | Third phosphor | Fourth phosphor | Proportion of total phosphor to glue | Eff | | | CCT |
| No. | 495 nm | 500 nm | 535 nm | 670 nm | 600 nm | (%) | (lm/w) | Ra | R9 | (K) |
| 1 | 4.01 | 7.12 | 77.44 | 5.20 | 6.23 | 27.2 | 102.9 | 99.0 | 98.7 | 2718 |
| 2 | 4.03 | 7.10 | 77.46 | 5.19 | 6.22 | 35.2 | 91.9 | 98.6 | 98.5 | 2342 |
| 3 | 4.02 | 7.12 | 77.47 | 5.14 | 6.25 | 40.2 | 82.2 | 97.9 | 99.0 | 2128 |

In one embodiment, an LED filament is provided, wherein the provided LED filament is made of the above-mentioned phosphor composition with a blue chip. The blue chip has a peak wavelength at 450-500 nm, and a FWHM of 15-18 nm.

In some embodiments, a phosphor composition as a part of the top layer 420b includes a first phosphor with a peak portion 460, and the other end is wrapped/covered by the connection portion 460. The connection portion 460 extends beyond an end portion of an end of the electrode 410 in the length direction of the LED filament, and does not cover any LED chip 442 in the radial projection direction of the LED filament. The proportion of phosphors and/or heat dissipation particles in the light conversion layer 420 at the connection portion 460 is lower than that of the light conversion layer 420 at the LED section 402. By reducing the proportion of phosphors and/or heat dissipation particles in the light conversion layer 420 at the connection portion 460 (in this case, the proportion of silica gel is increased), the flexibility can be increased to prevent the connection portion 460 from cracking due to the stress generated by the bending of the electrode 410 when the connection portion 460 is bent. Otherwise, cracking at the connection portion 460 may cause the second wire 450 at the connection portion 460 to be broken.

As shown in FIG. 1N, the connection portion 460 includes a sleeve 470, and the phosphor content of the sleeve 470 is lower than the phosphor content of the light conversion layer 420 at the LED section 402. Through the arrangement of the sleeve 470, the overall phosphor proportion of the light conversion layer 420 at the connection portion 460 can be reduced. That is, the phosphor content of the region of the light conversion layer 420 covered by the sleeve 470 (the region may include the sleeve 470 itself) is lower than the phosphor content of the light conversion layer 420 at the LED section 402. In some embodiments, the sleeve 470 does not contain phosphors or heat dissipation particles.

One part of the sleeve 470 is directly sleeved on the outside of the electrode 410, and the other part is sleeved on the outside of the light conversion layer 420 at the connection portion 460. The light conversion layer 420 included by the sleeve 470 and the sleeve 470 itself together form the connection portion 460. Structurally, through the arrangement of the sleeve 470, the light conversion layer 420 at the connection portion 460 may also be prevented from cracking. An end of the sleeve 470 exceeds an end portion of an end of the electrode 410 in the length direction of the filament. The sleeve 470 may be sleeved on either end or both ends of the LED filament. The region where the sleeve 470 is sleeved on (covers) the light conversion layer 420 accounts for less than 10% in the length direction of the LED filament. That is, the total length of the sleeve 470 covering the light conversion layer 420 is less than 10% of the total length of the LED filament (excluding the electrode 410). In this way, it is ensured that the light-emitting region and the total light emission of the LED filament are not affected by the sleeve 470, and the structural reinforcement function of the LED filament by the sleeve 470 can be exerted.

In some embodiments, the sleeve 470 may be made of a transparent or translucent material (that is, a light-transmitting material), so as to reduce optical loss when light passes through the sleeve 470. In some embodiments, the sleeve 470 is the same or approximately the same color as the light conversion layer 420 to maintain color consistency in the appearance of the filament. The sleeve 470 may be a heat-shrink tubing. That is, when the sleeve 470 is sleeved on the electrode 410 and the light conversion layer 420, by heating the sleeve 470, the sleeve 470 is shrunk and wrapped on the electrode 410 and the light conversion layer 420. The specific material of the sleeve 470 may be selected from thermoplastic materials, such as PVC, PE, PP, PET, OPP, PVDC, POF, etc. The above materials are all in the related art, and are not described herein again.

In some embodiments, the above-mentioned sleeve 470 is formed by coating the outside of the light conversion layer 420 at the connection portion 460 with a glue. When the sleeve 470 is formed by the glue, it may not directly cover at least a part of the surface of the electrode 410, or it may directly cover at least a part of the surface of the electrode 410.

As shown in FIG. 10, in some embodiments, the phosphor proportion of the light conversion layer 420 at the connection portion 460 is lower than the phosphor proportion of the light conversion layer 420 at the LED section 402, and the proportion of silica gel of the light conversion layer 420 at the connection portion 460 is higher than the proportion of silica gel of the light conversion layer 420 at the LED section 402, so that the light conversion layer 420 at the connection portion 460 has better bendability, thereby reducing the risk of cracking.

Referring to FIG. 1P, in one embodiment, the electrode 410 has a second portion 4102 wrapped or covered by the light conversion layer 420 and a first portion 4101 exposed outside the light conversion layer 420. In the length direction of the LED filament, the bending performance of the second portion 4102 is better than that of the first portion 4101. In other words, when the same force is applied to the first portion 4101 and the second portion 4102, the warpage magnitude of the first portion 4101 is smaller than that of the second portion 4102. Therefore, the second portion 4102 can have the bending performance closer to that of the light conversion layer 420, and when the LED filament is bent, the probability of the light conversion layer 420 being broken due to stress caused by the large difference of the bending performance between the second portion 4102 and the light conversion layer 420 can be reduced.

In this embodiment, the first portion 4101 and the second portion 4102 have different bending performances due to different structural designs. Specifically, the area per unit length of the second portion 4102 is smaller than the area per unit length of the first portion 4101, so that the second portion 4102 has better bending performance.

The second portion 4102 has an end 41021, a bent section 41022, and a connection section 41023. The end 41021, the bent section 41022, and the connection section 41023 are arranged in sequence in the length direction of the second portion 4102, and the connection section 41023 is connected to the first portion 4101. The area per unit length of the bent section 41022 is smaller than the area per unit length of the end 41021 and the connection section 41023 respectively, so that when the second portion 4102 is subjected to force, the main bending portion thereof lies in the bent section 41022.

The area per unit length of the connection section 41023 is larger than the area per unit length of the bent section 41022 and the end 41021 respectively, so that the end portion of the light conversion layer 420 and the electrode 410 have a larger connection area to improve the connection fastness and prevent cracking at the connection of the end portion of the light conversion layer 420 and the electrode 410 when the LED filament is bent.

As shown in FIG. 1P, one or more groups of groove portions 41024 are provided on one or both sides of the bent section 41022 in the width direction to reduce the area per unit length of the bent section 41022, so as to improve the overall bendability. In addition, the connection fastness of the electrode 410 and the light conversion layer 420 can also be improved by the provision of the groove portion 41024. Specifically, the material of the light conversion layer 420 may pass through the groove portion 41024, so that the light conversion layers 420 on the opposite sides of the electrode 410 are connected by the material of the light conversion layer 420 in the groove portion 41024, to form a connection method similar to riveting.

As shown in FIG. 1R, one or more groups of holes 41025 are provided at the bent section 41022 to reduce the area per unit length of the bent section 41022. In addition, the connection fastness of the electrode 410 and the light conversion layer 420 can also be improved by the provision of the hole 41025. Specifically, the material of the light conversion layer 420 may pass through the hole 41025, so that the light conversion layers 420 at the front and reverse sides of the electrode 410 are connected by the material of the light conversion layer 420 in the hole 41025.

As shown in FIG. 1P and FIG. 1Q, the end 41021 of the electrode 410 may be provided with a through hole 41026 to improve the connection fastness of the end 41021 and the light conversion layer 420. The material of the light conversion layer 420 may pass through the through hole 41026, so that the light conversion layers 420 at the front and reverse sides of the electrode 410 are connected by the material of the light conversion layer 420 in the through hole 41026, to form a connection method similar to riveting.

As shown in FIG. 1P and FIG. 1R, the end portion of the end 41021 of the electrode 410 is provided with an arc surface 41027 to prevent the formation of stress concentration due to the sharp corner formed at the end 41021 to force the light conversion layer 420 to crack or even break. In some embodiments, the end portion of the end 41021 is configured as a spherical surface to achieve the same technical effect as described above.

In some embodiments, the second portion 4102 and the first portion 4101 are made of different materials, so that the second portion 4102 has better bending performance than the first portion 4101.

As shown in FIG. 1S, in some embodiments, the thickness (average thickness) of the second portion 4102 is smaller than the thickness (average thickness) of the first portion 4101, so that the second portion 4102 has better bending performance than the first portion 4101.

As shown in FIG. 1T, an LED filament is provided in one embodiment, the basic structure of which may be the same as that in the above embodiments. That is, the LED filament includes a light conversion layer 420, an LED chip 442, and an electrode 410. The LED chips 442 are connected by a first wire 440, the LED chip 442 and the electrode 410 are connected by a second wire 450, and the light conversion layer 420 wraps the LED chip 442 and at least a part of the electrode 410. In addition, the basic structure or material composition of the light conversion layer 420 in this embodiment may also be the same as that in the above embodiments.

In this embodiment, the first conductive wire 440 has a first portion 44001, and the first portion 44001 is located between two sets of LED chips 442 in the length direction of the LED filament (in the projection direction of the width/thickness of the LED filament, the first portion 44001 is located between the edge tangents of the two sets of LED chips 442). When the LED filament is bent, the region between the LED chips 442 is the main bending region (the portion with the LED chips 442 is not easy to bend). In order to reduce the risk of the first portion 44001 of the first conductive wire 440 being broken when the LED filament is bent, the length L1 of the first portion 44001 is set to be greater than the distance D1 between the two sets of LED chips 442. In other words, the length L1 of the first portion 44001 is set to be greater than the projection length of the first portion 44001 in the width direction of the LED filament, so as to provide the first conductive wire 440 with more margin when the LED filament is bent, to avoid breakage.

In some embodiments, the ratio of the length L1 of the first portion 44001 to the distance D1 between the two sets of LED chips 442 (or the projection length of the first portion 44001 in the width direction of the LED filament) is greater than 1.1, 1.2, 1.3, or 1.4. In this case, when the LED filament is bent, the first portion 44001 has a sufficient length to deform with the bending, so as to prevent the first portion 44001 from being broken. In some embodiments, it is greater than the projection length of the first portion 44001 in the width direction of the LED filament.

In some embodiments, the ratio of the length L1 of the first portion 44001 to the distance D1 between the two sets of LED chips 442 (or the projection length of the first portion 44001 in the width direction of the LED filament) is less than 2. If the length of the first portion 44001 is set to be too large, the coverage effect of the light conversion layer 420 will be unfavorable, and even the first conductive wire 440 may be exposed to the light conversion layer 420. In addition, the excessively long first portion 44001 also leads to waste of material.

In some embodiments, the first portion 44001 is configured to be arc-shaped, so that the length L1 is greater than the distance D1 between the two sets of LED chips 442 (the projection length of the first portion 44001 in the width direction of the LED filament).

As shown in FIG. 1U, in some embodiments, the first portion 44001 is configured to be wavy-shaped or spiral shaped, so that the length is greater than the distance between the two sets of LED chips 442 (the projection length of the first portion 44001 in the width direction of the LED filament).

As shown in FIG. 1V, in some embodiments, the first portion 44001 (or the entire first conductive wire 440 is generally "m" shaped when viewed from the side of the LED filament. In this case, the first portion 44001 of the first conductive wire 440 is longer per unit length, and has a greater buffer against bending of the LED filament, to prevent the first portion 44001 from being broken.

When the LED filament shown in FIG. 1T to FIG. 1V is bent, usually one side of the LED chip 442 with the first conductive wire 440 is configured outside (that is, toward the outside of the lamp body), and the other side is configured inside (that is, toward the inside of the lamp body). As shown in FIG. 1T to FIG. 1V, both sides in the length direction of the LED filament are generally bent downward, so that the side of the LED chip 442 with the first conductive wire is located outside the LED filament (that is, toward the outside of the lamp body). Through the configuration of the first conductive wire 440 in the embodiments of FIG. 1T to FIG. 1V, the LED filament has good bendability, and ensures that the first conductive wire 440 will not be broken due to the excessively large bending range of the LED filament. For example, the LED filament may be bent into a shape with a radius of curvature at the maximum curvature of less than 10 mm, 8 mm, or 5 mm. Considering that the maximum curvature of the LED filament after bending is not necessarily an arc, the following expression may be used. That is, on the premise that the LED chips 422 are electrically connected by wires, after the LED filament is bent, the maximum inscribed circle radius at the maximum curvature is less than 15 mm, 10 mm, or 8 mm. That is, in a case that the LED filament in this embodiment uses the first conductive wire 440 to electrically connect the LED chip 442, after the LED filament is bent, the maximum inscribed circle radius at the maximum curvature is less than 15 mm, 10 mm, or 8 mm, and the first conductive wire 440 is ensured not to be broken. In the related art, a flexible substrate is used to carry the LED chips and realize the electrical connection between the LED chips of the LED filament. Since it has no wires, there is no risk of wire breakage. Therefore, it may have a larger bending range, but the two obviously cannot be compared.

In this embodiment, after the LED filament is bent, the maximum inscribed circle at the maximum curvature should be greater than 3 mm or 3.5 mm, so as to reduce the risk of breaking the first conductive wire 440 due to the excessively large bending range.

In order to ensure the bendable range of the LED filament or to further increase the bendable range of the LED filament, the position of the first conductive wire 440 may also be set. When the LED filament is bent as described above (that is, one side of the LED chip 442 with the first conductive wire 440 is configured outside, and the other side is configured inside), the outer bent part of the LED filament has a larger radius of curvature, and the deformation or tension generated inside this part is also larger. Therefore, the first conductive wire 440 may be disposed on a surface 401 as far as possible from the LED filament in the width (or thickness) direction, and the surface 401 is the surface of the side of the LED chip 442 with the first conductive wire 440. Taking FIG. 1V as an example, the shortest distance from the first conductive wire 440 to the surface 401 is L, the width (or thickness) dimension of the LED filament is D, and the ratio of L to D is at least greater than 0.1.

In this embodiment, the first conductive wire 440 has a second portion 44002, and the second portion 44002 completely falls within the range defined by the LED chip 442 when projected onto the corresponding LED chip 442 in the width direction of the LED filament. One end of the second portion 44002 is connected to the LED chip 442, and the other end is connected to the first portion 44001 (the first portion 44001 and the second portion 44002 may be integrated as a single structure). In other words, one end of the second portion 44002 is connected to the LED chip 442, and the other end does not exceed the corresponding LED chip 442 in the length direction of the LED filament.

In this embodiment, the length L2 of the second portion 44002 is greater than the distance D2 from a connection point of the second portion 44002 and the LED chip 442 to the end portion of the LED chip 442 in the length direction (or the projection length of the second portion 44002 in the width direction of the LED filament). When the LED filament is bent, the first portion 44001 will pull the second portion 44002 after being bent. The above arrangement of the second portion 44002 can make the second portion 44002 have a deformation space to prevent the connection point between the second portion 44002 and the LED chip 442 from being broken due to the pulling force of the first portion 44001.

In this embodiment, the first conductive wire 440 has two sets of second portions 44002, and at least one set of the second portions 44002 is configured as described above.

In some embodiments, the ratio of the length L2 of the second portion 44002 to the distance D2 from a connection point of the second portion 44002 and the LED chip 442 to the end portion of the LED chip 442 in the length direction (the projection length of the second portion 44002 in the width direction of the LED filament) is greater than 1.15, 1.2, 1.3, or 1.4. In this case, the risk of breaking the connection point between the second portion 44002 and the LED chip 442 due to pulling force is reduced.

In some embodiments, the ratio of the length L2 of the second portion 44002 to the distance D2 from a connection point of the second portion 44002 and the LED chip 442 to the end portion of the LED chip 442 in the length direction (the projection length of the second portion 44002 in the width direction of the LED filament) is less than 2. If the second portion 44002 is too long, the second portion 44002 is bound to have a larger bending range or occupy space in the width direction of the LED filament, which will adversely affect the LED filament (if the bending range is larger, it may lead to greater internal stress of the second portion 44002, and occupy the space in the width direction of the LED filament, so a thicker light conversion layer is required for coverage, resulting in a thicker LED filament).

In this embodiment, the ratio of the length L2 of the second portion 44002 to the distance D2 from a connection point of the second portion 44002 and the LED chip 442 to the end portion of the LED chip 442 in the length direction (the projection length of the second portion 44002 in the width direction of the LED filament) is greater than the ratio of the length L1 of the first portion 44001 to the distance D1 between the two sets of LED chips 442 (or the projection length of the first portion 44001 in the width direction of the LED filament). The formula is expressed as follows:

$$L2/D2 > L1/D1$$

Usually, when the LED filament is bent, the connection point between the second portion 44002 and the LED chip 442 is more likely to be broken by tensile force. Therefore, by setting $L2/D2 > L1/D1$, the risk of breakage of the connection point between the second portion 44002 and the LED chip 442 can be reduced.

In some embodiments, both the first portion 44001 and the second portion 44002 are arc-shaped, and the radius of curvature of the second portion 44002 is smaller than the radius of curvature of the first portion 44001, so that the first portion 44001 and the second portion 44002 satisfy the above formula, that is, $L2/D2 > L1/D1$.

In other embodiments, it may be set as $L1/D1 > L2/D2$. In this way, it can be ensured that when the LED filament is bent, the first conductive wire (that is, the first portion) at the region where the LED filament is mainly bent has enough buffer space to prevent it from being easily broken.

In this embodiment, the second conductive wire 450 may also be configured as described above. Specifically, the second conductive wire 450 includes a first portion 4501 located between the LED chip 442 and the electrode 410 in the length direction of the LED filament. When the LED filament is bent, the region between the LED chip 442 and the electrode 410 may be one of the bending regions (the region with the LED chip 442 and the electrode 410 is not easy to bend). In order to reduce the risk of the first portion 4501 of the second conductive wire 450 being broken when the LED filament is bent, the length L3 of the first portion 4501 is set to be greater than the distance D3 between the LED chip 442 and the electrode 410. In other words, the length L3 of the first portion 4501 is set to be greater than the projection length of the first portion 4501 in the width direction of the LED filament.

In some embodiments, the ratio of the length L3 of the first portion 4501 to the distance D3 between the LED chip 442 and the electrode 410 (or the projection length of the first portion 4501 in the width direction of the LED filament) is greater than 1.1, 1.2, 1.3, or 1.4. In this case, when the LED filament is bent, the first portion 4501 has a sufficient length to deform with the bending, so as to prevent the first portion 4501 from being broken.

In some embodiments, the ratio of the length L3 of the first portion 4501 to the distance D3 between the LED chip 442 and the electrode 410 (or the projection length of the first portion 4501 in the width direction of the LED filament) is less than 2. If the length of the first portion 4501 is set to be too large, the coverage effect of the light conversion layer 420 will be unfavorable, and even the first conductive wire 4501 may be exposed to the light conversion layer 420. In addition, the excessively long first portion 4501 also leads to waste of material.

In some embodiments, the first portion 4501 is configured to be arc-shaped, so that the length L3 is greater than the distance D3 between the LED chip 442 and the electrode 410 (the projection length of the first portion 44001 in the width direction of the LED filament).

As shown in FIG. 1U, in some embodiments, the first portion 4501 is configured to be wavy-shaped, so that the length is greater than the distance between the LED chip 442 and the electrode 410 (the projection length of the first portion 44001 in the width direction of the LED filament).

In this embodiment, the second conductive wire 450 has a second portion 4502, and the second portion 4502 completely falls within the range defined by the LED chip 442 when projected onto the corresponding LED chip 442 in the width direction of the LED filament. One end of the second portion 4502 is connected to the LED chip 442, and the other end is connected to the first portion 4501 (the first portion 4501 and the second portion 4502 may be integrated as a single structure). In other words, one end of the second portion 4502 is connected to the LED chip 442, and the other end does not exceed the corresponding LED chip 442 in the length direction of the LED filament.

In this embodiment, the length L4 of the second portion 4502 is greater than the distance D4 from a connection point of the second portion 4502 and the LED chip 442 to the end portion of the LED chip 442 in the length direction (or the projection length of the second portion 4502 in the width direction of the LED filament). When the LED filament is bent, the first portion 4501 will pull the second portion 4502 after being bent. The above arrangement of the second portion 4502 can make the second portion 4502 have a deformation space to prevent the connection point between the second portion 4502 and the LED chip 442 from being broken due to the pulling force of the first portion 4501.

In some embodiments, the ratio of the length L4 of the second portion 4502 to the distance D4 from a connection point of the second portion 4502 and the LED chip 442 to the end portion of the LED chip 442 in the length direction (the projection length of the second portion 4502 in the width direction of the LED filament) is greater than 1.15, 1.2, 1.3, or 1.4. In this case, the risk of breaking the connection point between the second portion 4502 and the LED chip 442 due to pulling force is reduced.

In some embodiments, the ratio of the length L4 of the second portion 4502 to the distance D4 from a connection point of the second portion 4502 and the LED chip 442 to the end portion of the LED chip 442 in the length direction (the projection length of the second portion 4502 in the width direction of the LED filament) is less than 2. If the second portion 4502 is too long, the second portion 4502 is bound to have a larger bending range or occupy space in the width direction of the LED filament, which will adversely affect the LED filament (if the bending range is larger, it may lead to greater internal stress of the second portion 4502, and occupy the space in the width direction of the LED filament, so a thicker light conversion layer is required for coverage, resulting in a thicker LED filament).

In this embodiment, the ratio of the length L4 of the second portion 4502 to the distance D4 from a connection point of the second portion 4502 and the LED chip 442 to the end portion of the LED chip 442 in the length direction (the projection length of the second portion 4502 in the width direction of the LED filament) is greater than the ratio of the length L3 of the first portion 4501 to the distance D3 between the LED chip 442 and the electrode 410 (or the projection length of the first portion 4501 in the width direction of the LED filament). The formula is expressed as follows:

$$L4/D4 > L3/D3$$

Usually, when the LED filament is bent, the connection point between the second portion 4502 and the LED chip 442 is more likely to be broken by tensile force. Therefore, by setting $L4/D4 > L3/D3$, the risk of breakage of the connection point between the second portion 4502 and the LED chip 442 can be reduced.

In some embodiments, both the first portion 4501 and the second portion 4502 are arc-shaped, and the radius of curvature of the second portion 4502 is smaller than the radius of curvature of the first portion 4501, so that the first portion 4501 and the second portion 4502 satisfy the above formula, that is, $L4/D4 > L3/D3$.

In some embodiments, the second conductive wire 450 has a third portion 4503, and the third portion 4503 completely falls within the range defined by the electrode 410 when projected onto the corresponding electrode 410 in the width direction of the LED filament. One end of the third portion 4503 is connected to the electrode 410, and the other end is connected to the first portion 4501 (the first portion 4501 and the third portion 4503 may be integrated as a single structure). In other words, one end of the third portion 4503 is connected to the electrode 410, and the other end does not exceed the corresponding electrode 410 in the length direction of the LED filament.

In this embodiment, the length L5 of the third portion 4503 is greater than the distance D5 from a connection point of the third portion 4502 and the electrode 410 to the end portion of the electrode 410 in the length direction (or the projection length of the third portion 4503 in the width direction of the LED filament). When the LED filament is bent, the first portion 4501 will pull the third portion 4503 after being bent. The above arrangement of the third portion 4503 can make the third portion 4503 have a deformation space to prevent the connection point between the third portion 4503 and the electrode 410 from being broken due to the pulling force of the first portion 4501.

In some embodiments, the ratio of the length L5 of the third portion 4503 to the distance D5 from a connection point of the third portion 4503 and the electrode 410 to the end portion of the electrode 410 in the length direction (the projection length of the third portion 4503 in the width direction of the LED filament) is greater than 1.15, 1.2, 1.3, or 1.4. In this case, the risk of breaking the connection point between the third portion 4503 and the electrode due to pulling force is reduced.

In some embodiments, the ratio of the length L5 of the third portion 4503 to the distance D5 from a connection point of the third portion 4503 and the electrode 410 to the end portion of the electrode 410 in the length direction (the projection length of the third portion 4503 in the width direction of the LED filament) is less than 2. If the third portion 4503 is too long, the third portion 4503 is bound to have a larger bending range or occupy space in the width direction of the LED filament, which will adversely affect the LED filament (if the bending range is larger, it may lead to greater internal stress of the third portion 4503, and occupy the space in the width direction of the LED filament, so a thicker light conversion layer is required for coverage, resulting in a thicker LED filament).

Figure 4A:
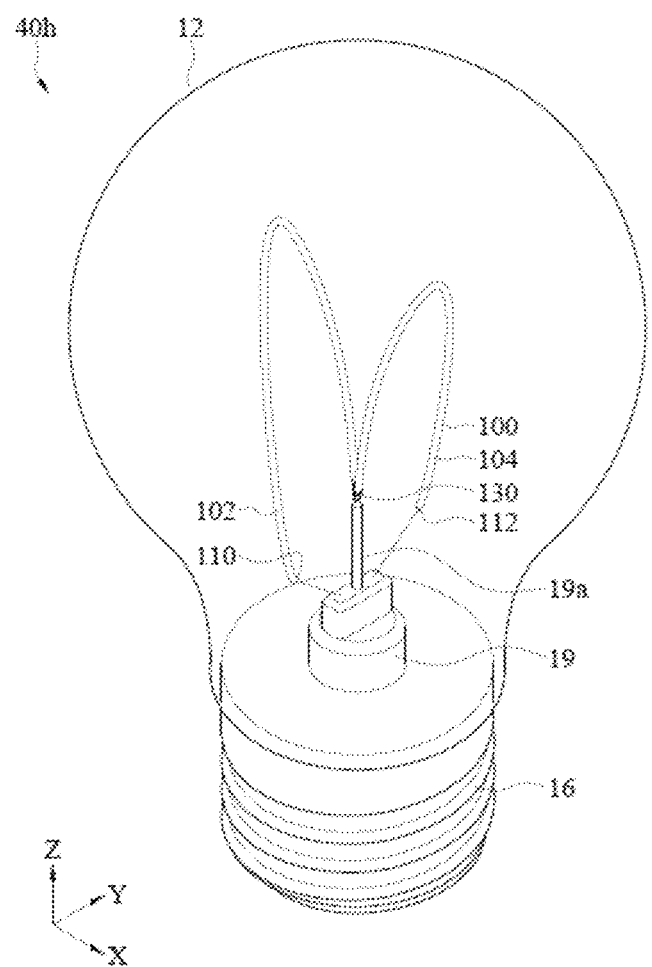
FIG. 4A to FIG. 4D are respectively a schematic diagram, a side view, another side view, and a top view of an LED light bulb according to an embodiment of this application.
Figure 4B:
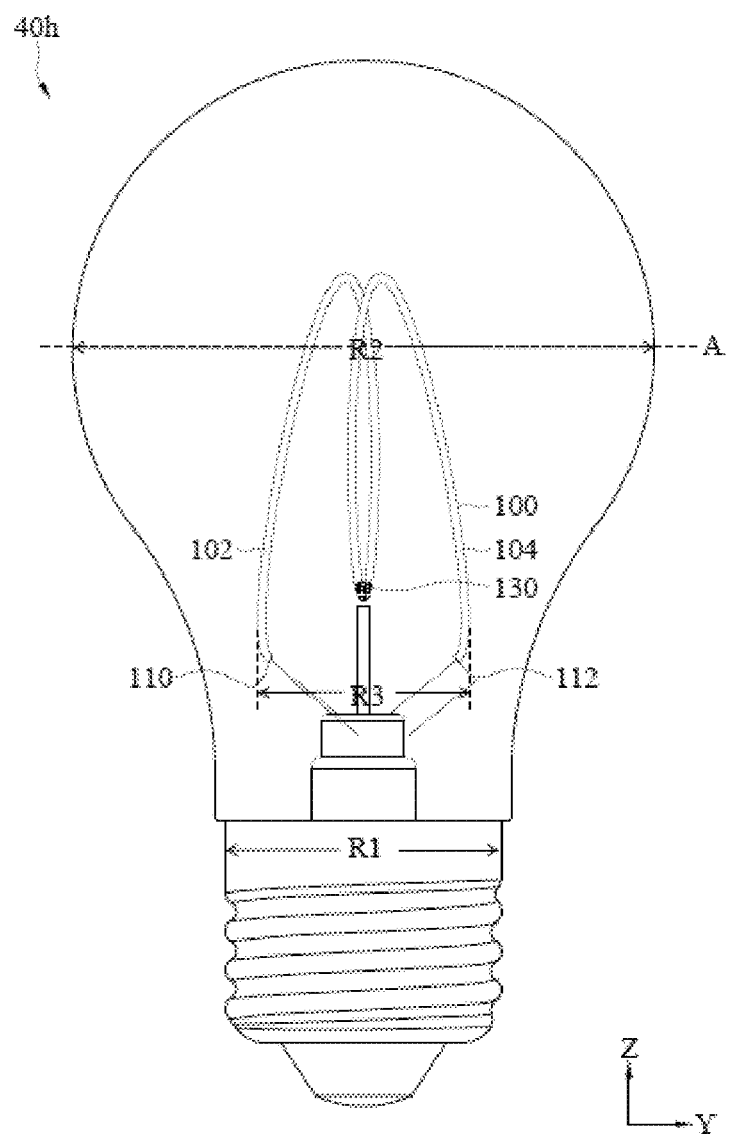
Figure 4C:
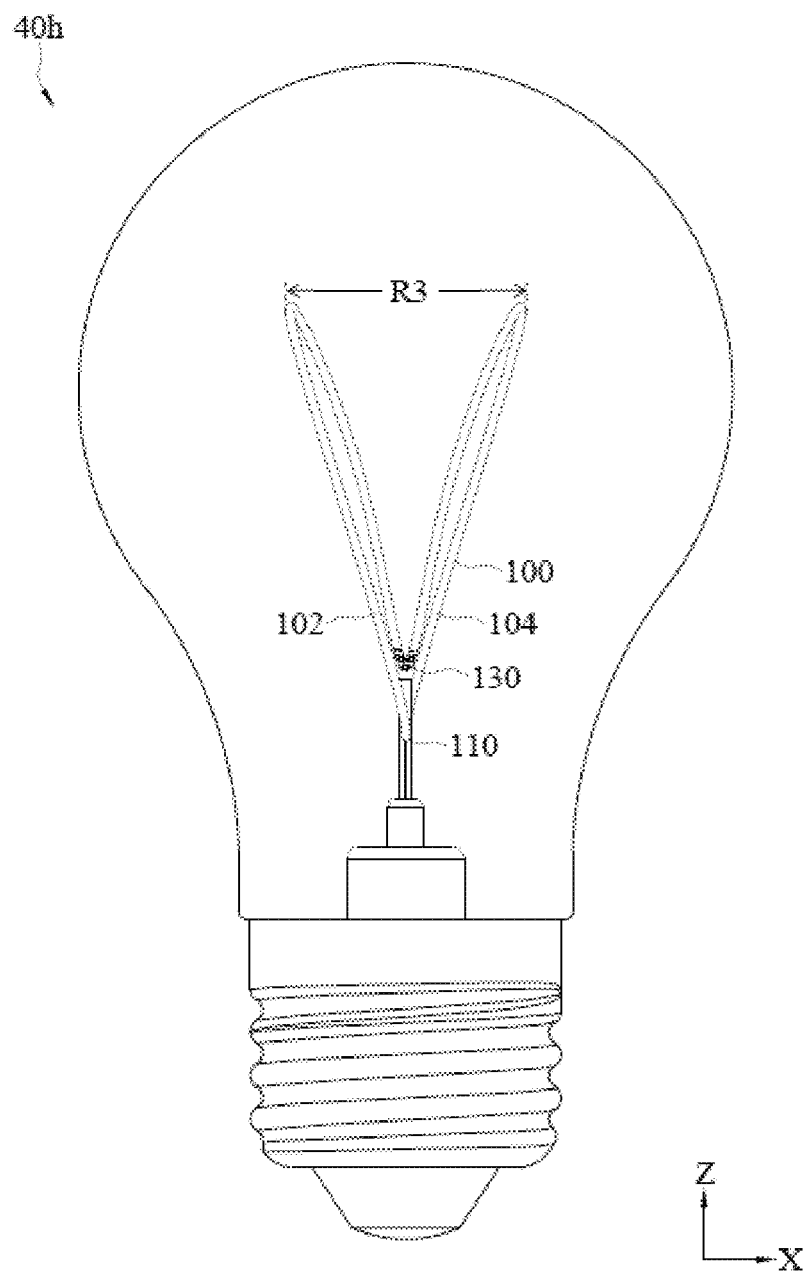
Figure 4D:
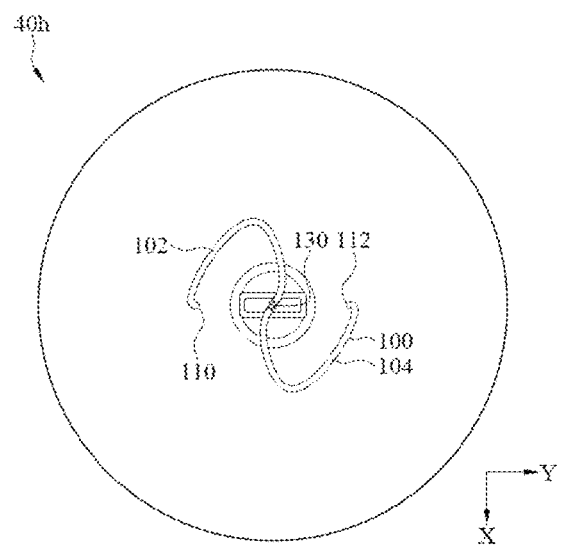

Referring to FIG. 4A to FIG. 4D, FIG. 4A is a schematic diagram of an LED light bulb 40h according to an embodiment of this application, and FIG. 4B to FIG. 4D are a side view, another side view, and a top view of the LED light bulb 40h in FIG. 4A, respectively. In this embodiment, as shown in FIG. 4A to FIG. 4D, the LED light bulb includes a lamp housing 12, a lamp cap 16 connected to the lamp housing 12, at least two conductive brackets disposed in the lamp housing 12, a supporting arm (not shown), a stem 19, and a single LED filament 100. The stem 19 includes a stem bottom portion and a stem top portion that are opposite to each other. The stem bottom portion is connected to the lamp cap 16. The stem top portion extends to the inside of the lamp housing 12, for example, the stem top portion may be located approximately at the center of the lamp housing 12. The conductive brackets are connected to the stem 19. The LED filament 100 includes a filament body and two filament electrodes (electrodes or conductive electrodes) 110, 112. The two filament electrodes 110, 112 are located at two opposite ends of the filament body. The filament body is the other portion of the LED filament 100 excluding the filament electrodes 110, 112. The two filament electrodes 110, 112 are connected to the two conductive brackets, respectively. One end of the supporting arm is connected to the stem 19, and the other end is connected to the filament body.

During the manufacturing process of traditional bulbs, in order to avoid a tungsten wire burning in the air thereby causing the oxidative fracture failure, a glass structure with a horn shape (hereinafter refer to as "horn stem") is designed to be disposed at the opening of the glass lamp housing and then the horn stem is sintered and sealed to the glass lamp housing. Then, a vacuum pump is connected to the lamp housing through the port of the horn stem to replace the air inside the lamp housing with nitrogen so as to suppress the combustion and oxidation of the tungsten wire inside the lamp housing. Eventually, the port of the horn stem will be sintered and sealed. Therefore, the vacuum pump can pump out the air inside the lamp housing and substitute it with all nitrogen or a combination of nitrogen and helium in a proper ratio through the stem, to improve the thermal conductivity of the gas inside the lamp housing and remove water mist hidden in the air at the same time. In one embodiment, the air may alternatively be pumped out and substitute it with a combination of nitrogen and oxygen or nitrogen and air in a proper ratio. The content of oxygen or air is 1-10% of the volume of the lamp housing, preferably 1-5%. When a base layer contains saturated hydrocarbons, during the use of the LED light bulb, the saturated hydrocarbons will generate free radicals under the effect of light, heat, stress, etc. The generated free radicals or activated molecules will combine with oxygen to form peroxide free radicals. Thus, filling the lamp housing with oxygen can improve the heat and light resistance of the base layer containing the saturated hydrocarbons.

In the manufacturing process of the LED light bulb, in order to increase the refractive index of the lamp housing 12 to the light emitted by the LED filament, some foreign matter, for example, rosin, may be attached to an inner wall of the lamp housing 12. The average thickness of the foreign matter deposited per square centimeter of the inner wall area of the lamp housing 12 is 0.01-2 mm, and the thickness of the foreign matter is preferably 0.01-0.5 mm. In one embodiment, the content of the foreign matter per square centimeter of the inner wall area of the lamp housing 12 is 1-30% of the content of the foreign matter on the inner wall of the entire lamp housing 12, preferably 1-10%. For example, the content of the foreign matter may be adjusted by vacuum drying the lamp housing. In another embodiment, some impurities may be left in the gas filled in the lamp housing 12. The content of the impurities in the gas filled is 0.1-20% of the volume of the lamp housing 12, preferably 0.1-5%. For example, the content of the impurities may be adjusted, for example, by a method of vacuum drying to the lamp housing. Because the gas filled contains a small amount of impurities, the light emitted by the LED filament is emitted or refracted by the impurities to increase a luminous angle, which is beneficial to improving the luminous effect of the LED filament.

A Cartesian coordinate system having an X-axis, a Y-axis and a Z-axis is oriented for the LED light bulb, where the Z-axis is parallel to the stem 19, and the total length of the projection of the LED filament 100 on the XY plane, YZ plane and XZ plane is respectively the length L1, length L2, and length L3. In this embodiment, the length L1, the length L2, and the length L3 are approximately in a ratio of 0.8:1:0.9. In some embodiments, the length L1, the length L2, and the length L3 are approximately in a ratio of (0.5 to 0.9):1:(0.6 to 1), the ratio of the length L1, the length L2, and the length L3 is closer to 1:1:1, the illumination uniformity of the LED filament 100 in the LED light bulb 40a is better, and the omni-directional light appearance is better. The LED filament 100 has at least one first bending point and at least two second bending points when the LED filament is bent. The at least one first bending point and the at least two second bending points are arranged alternately, and the height of any one of the at least one first bending point on the Z-axis is greater than that of any one of the at least two second bending points. In one embodiment, the distances between any of two adjacent first bending points on the Y-axis and the X-axis are equal, and the LED filament has a neat and beautiful appearance. In one embodiment, a distance between any of two adjacent first bending points on the Y-axis or the X-axis has a maximum value D1 and a minimum value D2, where the range of D2 is from 0.5D1 to 0.9D1, and the luminous flux distribution on each plane is relatively consistent. Assuming that a diameter of the lamp cap 16 is R1 (referring to FIG. 4B), a maximum diameter of the lamp housing 12 or a maximum horizontal spacing of the lamp housing 12 in the YZ-plane is R2 (referring to FIG. 4B), a maximum width in the Y-axis direction on the YZ-plane (referring to FIG. 4B) or a maximum width in the X-axis direction on the XZ-plane (referring to FIG. 4C) of the LED filament 100 is R3, then R3 is between R1 and R2, that is, R1<R3<R2. When the LED filament is bent, the distance between adjacent first bending points and/or adjacent second bending points in the Z-axis direction is wide, which is beneficial to improving the heat dissipation effect of the LED filament. In the manufacturing process of the LED light bulb, the LED filament 100 may be placed into an inner space of the lamp housing 12 in a manner of folding first, and then the LED filament 100 may be stretched in the lamp housing 12 manually or mechanically, so that a maximum length of the LED filament 100 on the XZ-plane satisfies the above-mentioned relationship.

As shown in FIG. 4A to FIG. 4D, in this embodiment, the LED filament 100 has one conductive section 130 and two LED sections 102, 104, and every two adjacent LED sections 102, 104 are connected to each other by the conductive section 130. The bent portion of the LED filament 100 at the highest point has an arc shape, that is, the LED sections 102, 104 respectively has an arc shape at the highest point of the LED filament 100, and the conductive section 130 shows an arc shape at a low point of the LED filament 100 as well. The LED filament 100 may be configured to have a structure where each bent conductive section 130 is followed by one segment, and each LED section 102, 104 is formed into a respective section.

Moreover, since the base layer as a flexible substrate (preferably made of a silicone-modified polyimide resin composition) is adopted by the LED filament 100, the silicone-modified polyimide resin composition includes organosilicon-modified polyimide, a thermal curing agent, heat dissipation particles, and phosphor. In this embodiment, two LED sections 102, 104 are respectively bent to form an inverted U shape, the conductive section 130 is located between the two LED sections 102, 104 and the bending degree of the conductive section 130 is the same as or greater than that of the LED sections 102/104. That is, the two LED sections 102, 104 are respectively bent at a high point of the LED filament to form an inverted U shape and have a bending radius r1, the conductive section 130 is bent at a low point of the LED filament 100 and has a bending radius r2, and r1 is greater than r2. Through the configuration of the conductive section 130, the LED filament 100 can be bent with a small radius of gyration in a limited space. In one embodiment, the bending points of the LED section 102 and the LED section 104 are at the same height in the Z direction, the LED filament 100 has a certain symmetry in some directions, so the light distribution of the LED light bulb may be more uniform. In one embodiment, the bending points of the LED section 102 and the LED section 104 are at different height in the Z direction, the height of the bending points of the LED section 102 is greater than that the bending points of the LED section 104, in the case of the same LED filament length, when the LED filament is placed in the lamp housing in this way, part of the LED filament will be more biased towards the lamp housing, so the heat dissipation of the LED filament is better. In addition, in the Z direction, a stand 19a of this embodiment has a smaller height than a stand 19a of the previous embodiment, and the height of the stand 19a of this embodiment corresponds to the height of the conductive section 130 or the stand 19a is presumably in contact with part of the conductor section 130. For example, the lowest portion of the conductive section 130 may be connected to the top portion of the stand 19a, so that the overall shape of the LED filament 100 is not easily deformed. In different embodiments, the conductive section 130 may pass through a through hole of the top portion of the stand 19a to be connected to the stand 19a, or the conductive section 130 may be attached to the top portion of the stand 19a to be connected to the stand 19a, but it is not limited thereto. In one embodiment, the conductive section 130 may be connected to the stand 19a by a conductive wire, for example, the conductive wire is extended from the top portion of the stand 19a and connected to the conductive section 130.

As shown in FIG. 4B, in this embodiment, in the Z direction, the height of the conductive section 130 is greater than that of the two electrodes 110, 112. The two LED sections 102 may be seen as the two electrodes 110 and 112 extending upward to the highest point respectively and then bending down and further extending to connect to the conductive section 130. As shown in FIG. 4C, in this embodiment, the outline of the LED filament 100 in the XZ-plane is similar to a V shape, that is, the two LED sections 102, 104 respectively extend upward and outward obliquely, and respectively extend downward and inward obliquely to the conductive section 130 after being bent at the highest points. As shown in FIG. 4D, in this embodiment, the outline of the LED filament 100 in the XY-plane has an S shape. As shown in FIG. 4B and FIG. 4D, in this embodiment, the conductive section 130 is located between the electrodes 110, 112. As shown in FIG. 4D, in this embodiment, in the XY-plane, the bending point of the LED section 102, the bending point of the LED section 104, and the electrodes 110, 112 are substantially located on a circumference of a circle taking the conductive section 130 (or the stem 19 or the stand 19a) as a center. For example, in the XY-plane, the bending point of the LED section 102 and the bending point of the LED section 104 are located on the same circumference of a circle taking the stem 19 or the stand 19a as a center. In some embodiments, in the XY-plane, the bending point of the LED section 102, the bending point of the LED section 104, and the electrodes 110, 112 are located on the same circumference of a circle taking the stem 19 or the stand 19a as a center.

Figure 5:
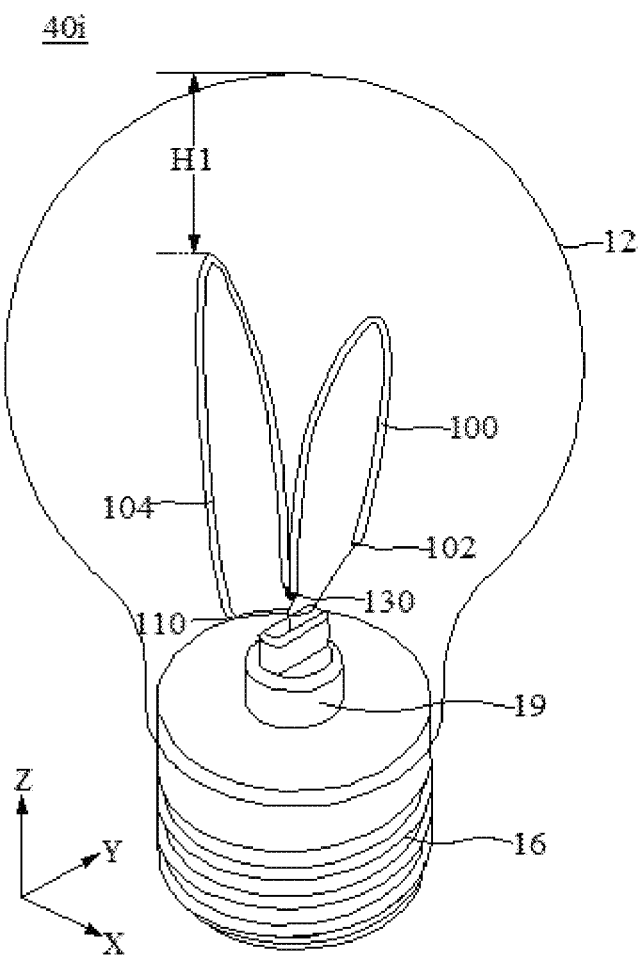
FIG. 5 is a schematic diagram of an LED light bulb according to an embodiment of this application.

Referring to FIG. 5, FIG. 5 is a schematic diagram of an LED light bulb 40i according to an embodiment of this application. The LED light bulb 40i in this embodiment has the same basic structure as the LED light bulb 40h in FIG. 4, including a lamp housing 12, a lamp cap 16 connected to the lamp housing 12, at least two conductive brackets disposed in the lamp housing 12, a supporting arm (not shown), a stem 19, and a single LED filament 100. The difference is that the LED light bulb 40i in this embodiment does not have a stand 19a. The stem 19 includes an inflation pipe, and the gas in the lamp housing 12 is filled through the inflation pipe. As shown in FIG. 5, in the Z-axis direction, the shortest distance from the LED filament 100 (or the bending point of the LED section 102/104) to the lamp housing 12 is H1, the shortest distance from the conductive section 130 to the stem 19 of the LED filament 100 is H2, and H1 is less than or equal to H2, the bending point of the LED section 102/104 is closer to the lamp housing, so the heat dissipation path of the LED filament is short, thereby improving the heat dissipation effect of the LED light bulb. In one embodiment, H1 is greater than H2, the LED filament is approximately located in the middle area of the lamp housing, and the luminous effect of the light bulb is better.

Figure 6A:
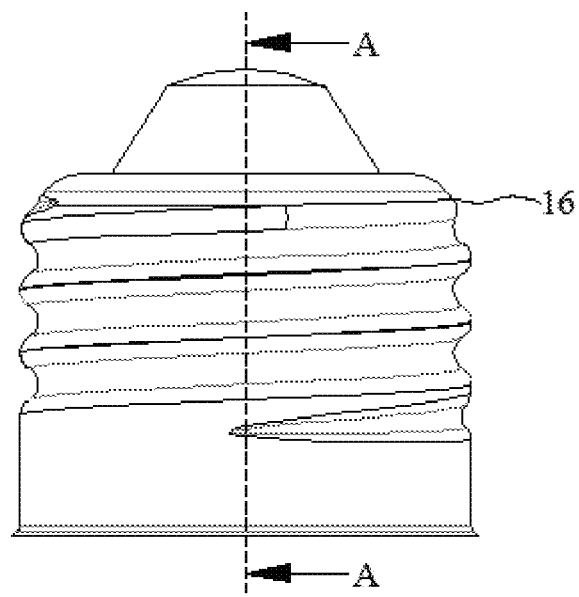
FIG. 6A is a schematic diagram of a lamp cap according to an embodiment of this application.
Figure 6B:
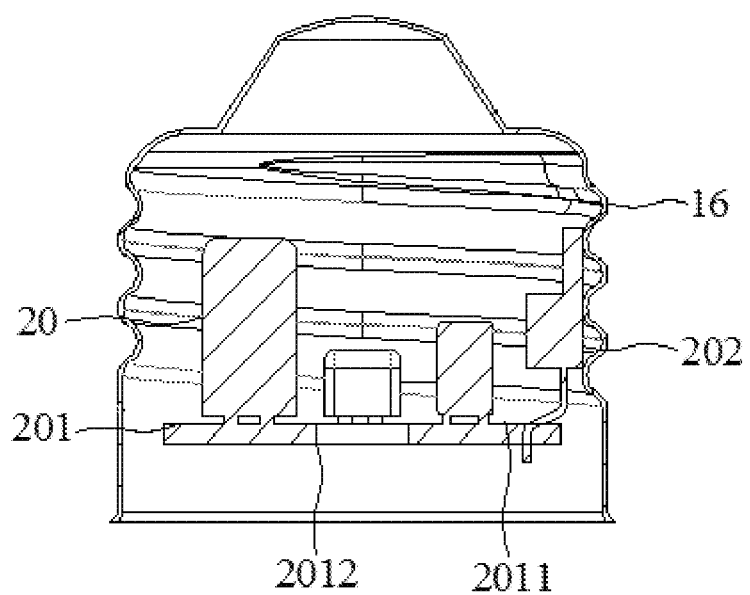
FIG. 6B is a schematic diagram of a cross section A-A in FIG. 6A.

Referring to FIG. 6, FIG. 6 is a schematic structural diagram of a lamp cap according to an embodiment of this application. In this embodiment, a power component (or a driving power supply) 20 is disposed in a lamp cap 16, the power component is electrically connected to the LED filament, and the power component is electrically connected to an electrode of the LED filament. The power component 20 includes a substrate 201, a heating element (an element that generates more heat during operation, such as an IC or a resistor) and a non-heat-resistant element (such as an electrolytic capacitor) are disposed on the substrate 201, the lamp cap 16 has an inner surface and an outer surface opposite to the inner surface, the outer surface of the lamp cap 16 is away from the power component 20, the heating element is closer to the inner surface of the lamp cap 16 than the non-heat-resistant element, an insulation sheet 202 is disposed on the heating element, and the insulation sheet 202 is in contact with the inner surface of the lamp cap 16, for example, the insulation sheet 202 may be in contact with the inner surface of the lamp cap 16 by welding or using fasteners. In one embodiment, the heating element is integrally encapsulated into a component, a heat dissipation sheet is disposed on the component, and the heat dissipation sheet is in contact with the inner surface of the lamp cap 16. For example, after an IC and a rectifier bridge are encapsulated into a component, the heat dissipation sheet is in contact with the inner surface of the lamp cap 16 by welding or using fasteners, and the heat dissipation sheet may be welded to the inner surface of the lamp cap 16 as a negative wire.

In another embodiment, the substrate 201 is in direct contact with the inner surface of the lamp cap 16. Compared with the indirect contact between the substrate and the lamp cap through glue, the direct contact can improve the heat dissipation effect of the light bulb based on the reduction of heat transfer media.

In another embodiment, the heating element is covered with a heat conduction glue. For example, the substrate 201 has a first surface 2011 and a second surface 2012, the second surface 2012 is away from the LED filament, the heating element and the non-heat-resistant element are respectively located on the first surface 2011 and the second surface 2012, and the first surface 2011 is covered with the heat conduction glue, the heat generated by the heating element may be transferred to the lamp cap 16 through the heat conduction glue, thereby improving the heat dissipation effect of the LED light bulb.

Figure 7A:
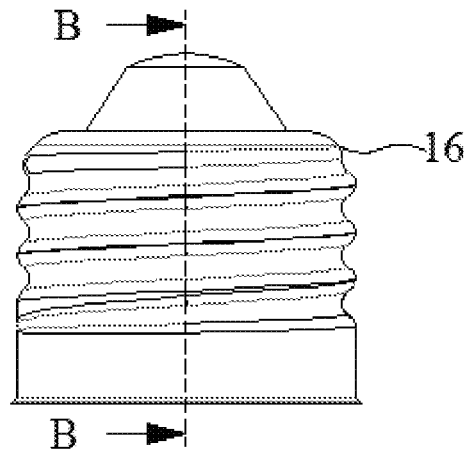
FIG. 7A is a schematic diagram of a lamp cap according to an embodiment of this application.
Figure 7B:
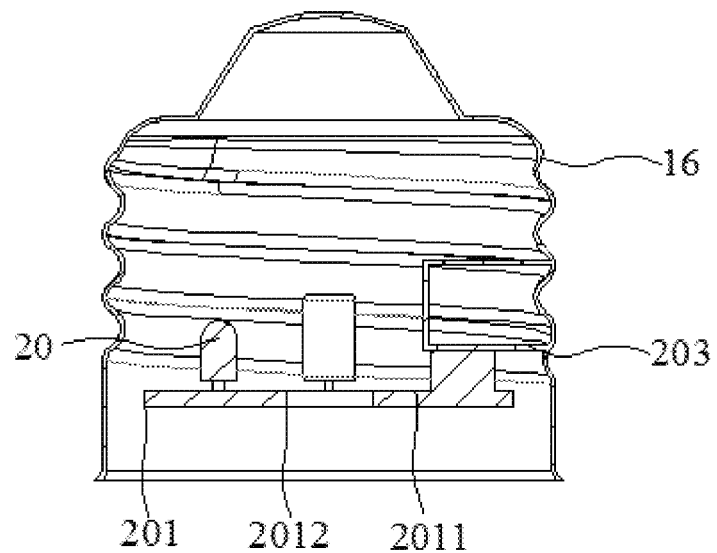
FIG. 7B is a schematic diagram of an embodiment of a cross section B-B in FIG. 7A.

In another embodiment, as shown in FIG. 7, a heat conduction portion 203 is disposed on the inner surface of the lamp cap 16, the heat conduction portion 203 may be a net bag accommodating the heating element or a metal member in contact with the heating element, the thermal conductivity of the heat conduction portion 203 is greater than or equal to the thermal conductivity of the lamp cap 16, and the heat generated by the heating element may be quickly transferred to the lamp cap 16 through the heat conduction portion 203, thereby improving the heat dissipation effect of the LED light bulb.

In another embodiment, each surface of the power component 20 is covered with the heat conduction glue, and a part of the heat conduction glue is in contact with the inner surface of the lamp cap 16. For example, a flexible substrate may be used to be integrally mounted in the lamp cap 16 by pouring the heat conduction glue into the lamp cap 16. The power component is entirely covered with the heat conduction glue to increase the heat dissipation area, thereby greatly improving the heat dissipation effect of the LED light bulb.

Figure 7C:
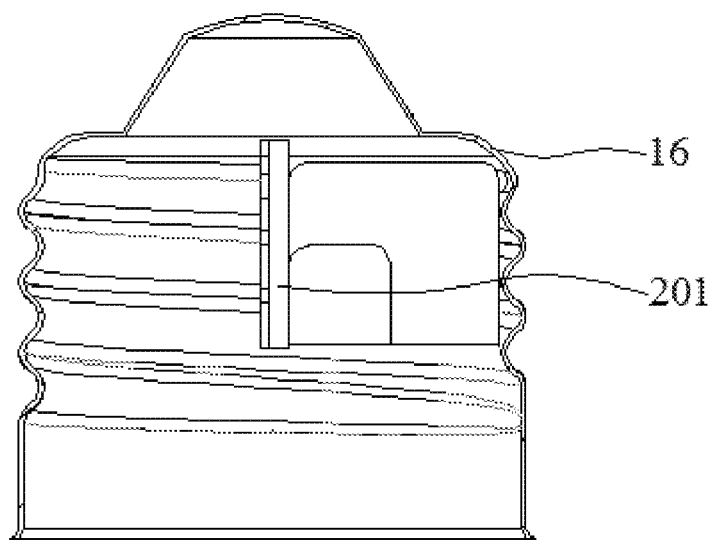
FIG. 7C is a schematic diagram of an embodiment of a cross section B-B in FIG. 7A.

In another embodiment, as shown in FIG. 7C, the substrate 201 is parallel to the axial direction of the lamp cap 16 or the axial direction of the stem 19 in FIG. 4, FIG. 5, and FIG. 8, since all the heating elements can be placed on the side of the substrate 201 close to the lamp cap 16, the heat generated by the heating elements can be quickly transferred to the lamp cap 16, thereby improving the heat dissipation efficiency of the power component; in addition, heating elements and non-heat-resistant elements can be separately arranged on the different surfaces of the substrate 201, it can reduce the influence of the heat generated by the heating element on the heat-resistant element, and improve the overall reliability and life of the power component. In one embodiment a heating element (an element that generates more heat during operation, such as an IC or a resistor) and a non-heat-resistant element (such as an electrolytic capacitor) are disposed on the substrate 201. The heating element is closer to the inner surface of the lamp cap 16 than other electronic elements (such as non-heat-resistant elements or other non-heat sensitive elements, for example, a capacitor). Therefore, compared with other electronic elements, the heating element has a shorter heat transfer distance from the lamp cap 16, which is more conducive to the heat generated by the heating element during operation being conducted to the lamp cap 16 for heat dissipation, thereby improving the heat dissipation efficiency of the power component 20.

As shown in FIG. 5 to FIG. 7, the projections of the inflation pipe and the substrate 201 on the XY-plane overlap. In some embodiments, the projections of the inflation pipe and the substrate 201 on the XZ-plane and/or YZ-plane are separated (or do not overlap), or in the height direction of the lamp cap 16 (or Z-axis direction), there is a certain distance between the inflation pipe and the substrate 201, so the inflation pipe and the substrate 201 are not in contact with each other, and thereby increasing an accommodation space of the power component and improving a utilization rate of the substrate 201. In addition, when the substrate 201 is in contact with the inner surface of the lamp cap 16, a cavity is formed between the first surface 2011 of the substrate 201 and the stem 19, and the heat generated by the heating element located on the first surface of the substrate 201 may be transferred through the cavity, which reduces the thermal impact on the non-heat-resistant element located on the second surface, thereby increasing the service life of the power component.

Figure 8A:
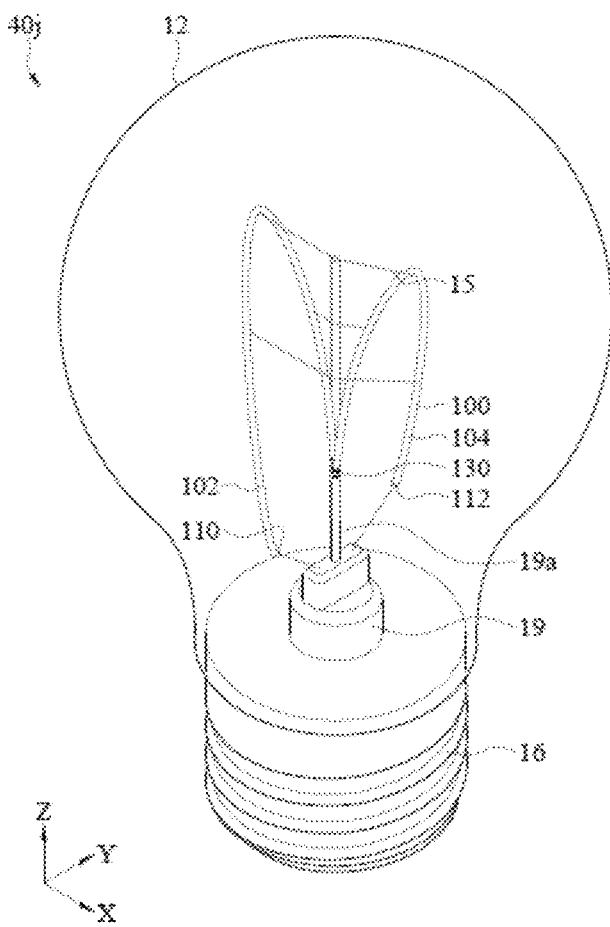
FIG. 8A to FIG. 8D are respectively a schematic diagram, a side view, another side view, and a top view of an LED light bulb according to an embodiment of this application.
Figure 8B:
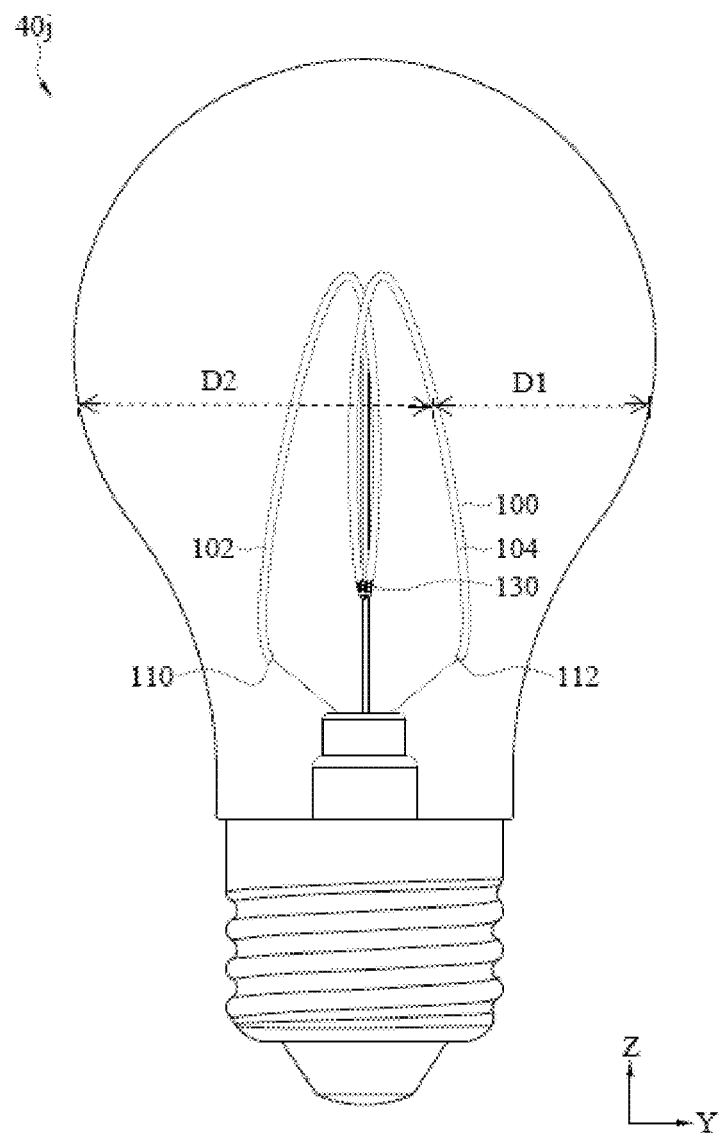
Figure 8C:
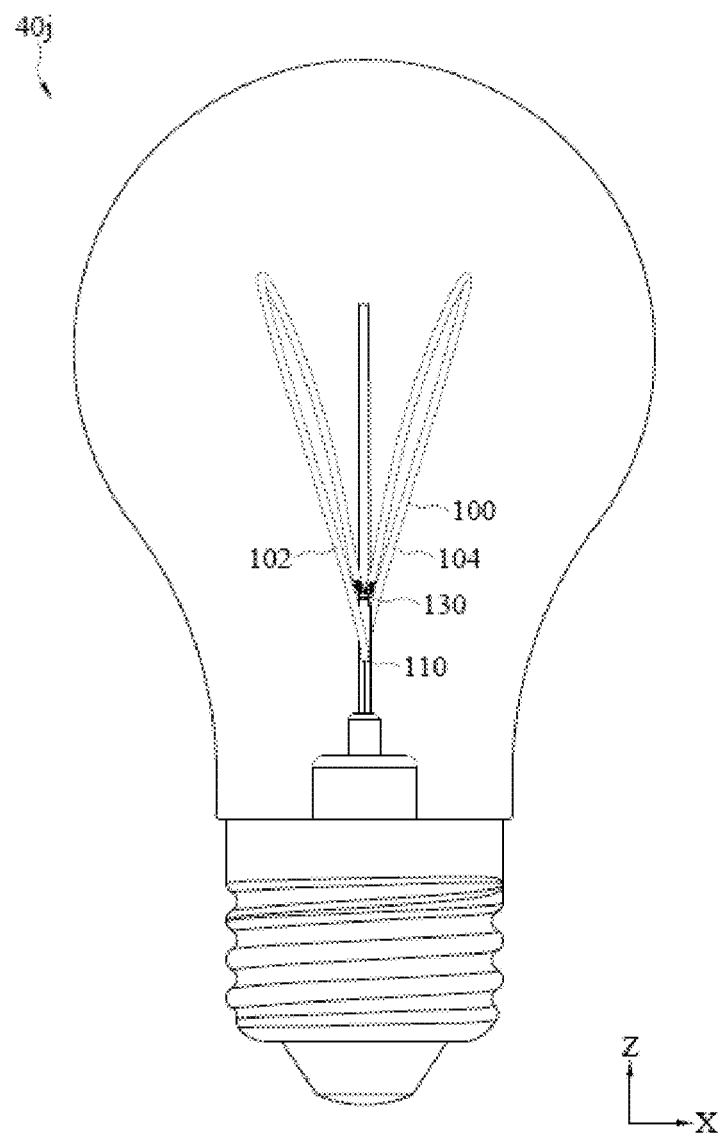
Figure 8D:
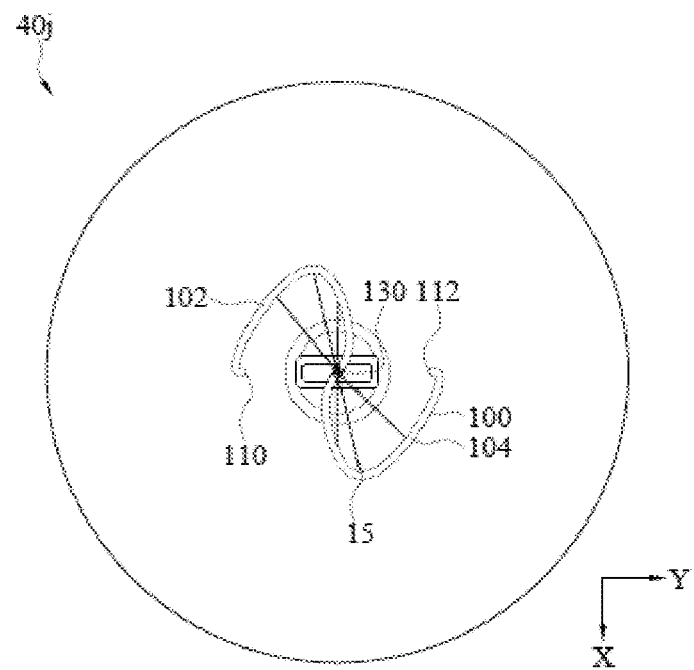
Figure 9A:
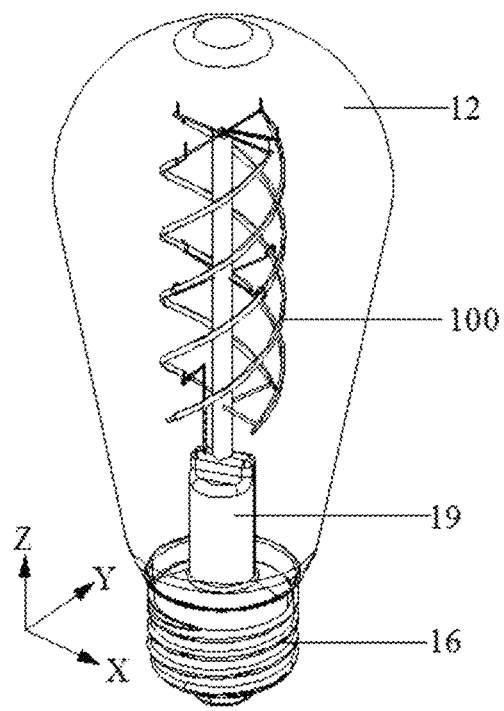
FIG. 9A to FIG. 9D are respectively a schematic diagram, a side view, another side view, and a top view of an LED light bulb according to an embodiment of this application.
Figure 9B:
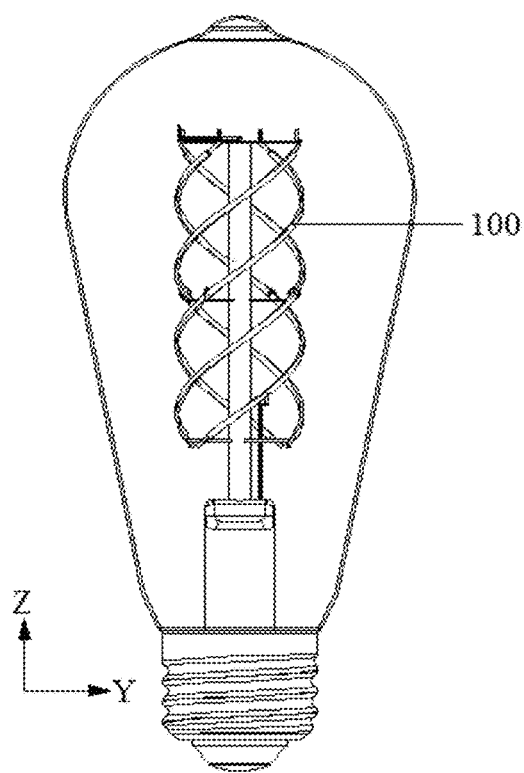
Figure 9C:
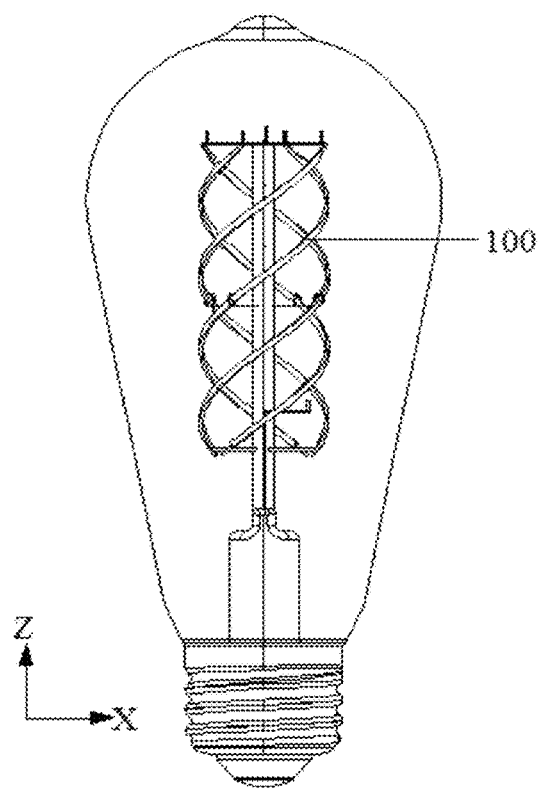
Figure 9D:
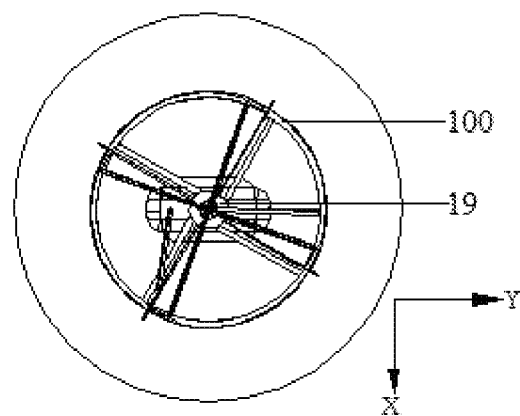

Referring to FIG. 8A to FIG. 8D, FIG. 8A to FIG. 8D are schematic diagrams of an LED light bulb 40$j$ according to an embodiment of this application. The LED light bulb 40$j$ in this embodiment has the same basic structure as the LED light bulb 40$h$ in FIG. 4, including a lamp housing 12, a lamp cap 16 connected to the lamp housing 12, at least two conductive brackets disposed in the lamp housing 12, at least one supporting arm 15, a stem 19, and an LED filament 100, and the supporting arms 15 are not shown in FIG. 8B and FIG. 8C. The stem 19 includes the stand 19$a$. Each supporting arm 15 includes a first end and a second end that are opposite to each other. The first end of each supporting arm 15 is connected to the stand 19$a$, and the second end of each supporting arm 15 is connected to the LED filament 100. The LED light bulb shown in FIG. 8C is different from the light bulb shown in FIG. 4 in that the height of the stand 19$a$ is greater than the distance between a bottom portion of the stand 19$a$ and the conductive section 130 in the Z-axis direction, and the stand 19$a$ comprises the bottom portion of the stand 19$a$ and the top portion of the stand 19$a$ opposite to each other, where the bottom portion of the stand 19$a$ is closer to the inflation pipe. As shown in FIG. 8D, in the XY-plane, the central angle corresponding to the arc where at least two bending points of the LED filament 100 are located ranges from 170° to 220°, so that there is a proper distance between bending points of the LED section 102, 104 to ensure the heat dissipation effect of the LED filament 100. At least one supporting arm 15 is located at the bending point of the LED filament 100, for example, at the bending point of the LED section 102/104. Each supporting arm 15 has an intersection with the LED filament 100. On the XY-plane, at least two intersections are located on a circumference of a circle taking the stem 19 (or the stand 19$a$) as a center, the LED filament has certain symmetry, and the luminous flux in all directions is roughly the same, so that the Light bulb can emit light evenly. In one embodiment, at least one intersection and the bending point of the conductive section 130 form a straight line La, and the intersection on the straight line La and the electrode 110/112 of the LED filament form a straight line Lb. The range of the angle $\alpha$ between the straight line La and the straight line Lb is $0°<\alpha<90°$, preferably $0°<\alpha<60°$, so that the LED sections have a proper spacing after bending, and have good light emission and heat dissipation effects. The LED section has a curvature radius at the bending point. For example, the LED section 102 has a curvature radius r3 at the bending point, the LED section 104 has a curvature radius r4 at the bending point, r3 is equal to r4, and the light is uniform on each plane. Certainly, it is also possible to set r3 to be greater than r4 or r3 to be less than r4 to meet lighting requirements and/or heat dissipation requirements in some specific directions. The conductive section 130 has a curvature radius r5 at the bending point, r5 is less than a maximum value of r3 and r4, that is, r5<max (r3, r4), so that the LED filament 100 is not easy to break, and there is a certain distance between the LED sections 102, 104 that are closer to the stem to prevent the heat generated by the two LED sections 102, 104 from affecting each other.

In one embodiment, the LED filament includes a top layer and a carrying layer. When the LED filament is bent, on any height direction section of the LED filament, or on the central axis (or optical axis) section of the LED chip, compared with the top layer, the carrying layer is closer to the lamp housing, that is, the shortest distance from the carrying layer to the lamp housing is smaller than the shortest distance from the top layer to the lamp housing. In some embodiments, the LED filament has a bending point (or bending region) when bent, and at the bending point (or bending region), the radius of curvature of the carrying layer is greater than the radius of curvature of the top layer. In some embodiments, when the LED filament is bent, on any height direction section of the LED filament, or on the central axis (or optical axis) section of the LED chip, compared with the carrying layer, the top layer is closer to the central axis (or stem) of the LED light bulb, and the distance from the top layer to the central axis (or stem) of the LED light bulb is smaller than the distance from the carrying layer to the central axis (or stem) of the LED light bulb. In some embodiments, the LED filament has a bending point (or bending region) when bent, and a light-emitting surface of the LED chip at a bending point (or bending region) is directed toward the central axis (or stem) of the LED light bulb. Through the above design, when any LED filament in the LED light bulb is bent, the conductive wire in the LED filament has a small bending stress and is not easy to break. The LED section 102/104 includes a first section and a second section. The first section is extending upward (the direction of the top portion of the lamp housing 12) from the electrode 110/112 to the bending point, and the second section is extending downward (the direction of the lamp cap 16) from the bending point to the conductive section 130 connecting two LED sections 102, 104. The first section and the second section to the lamp housing 12 respectively have a first distance and a second distance that are opposite to each other, and the first distance is less than the second distance. In the first distance direction, the base layer of the LED filament 100 is close to the lamp housing 12, and the top layer of the LED filament 100 is away from the lamp housing 12. For example, in FIG. 8B, the first section of the LED section 104 to the lamp housing 12 has a first distance D1 and a second distance D2, and the first distance D1 is less than the second distance D2. In the first distance D1 direction, the base layer of the LED filament 100 is close to the lamp housing 12, and the top layer of the LED filament 100 is away from the lamp housing 12. When the LED filament 100 is bent, the conductive wire in the LED filament 100 has a small bending stress and is not easy to break, improving the production quality of the LED light bulb 40*j*.

Referring to FIG. 4A to FIG. 4D and FIG. 8A to FIG. 8D, a plane A divides the lamp housing 12 into an upper portion and a lower portion, and the lamp housing 12 has the largest width at the plane A. For example, a plane figure formed by R2 (maximum horizontal spacing) in FIG. 4B is located on the plane A, and when there is an intersection between the stem 19 and the plane A, the lamp housing 12 has a lamp housing top portion and a lamp housing bottom portion that are opposite to each other, the lamp housing bottom portion is close to the lamp cap 16, and the length of the LED filament located between the lamp housing top portion and the plane A (or in the height direction of the LED light bulb, the distance from the highest point of the LED filament to the plane A) is less than the length of the LED filament located between the plane A and the lamp housing bottom portion (or in the height direction of the LED light bulb, the distance from the lowest point of the LED filament to the plane A). Because when there is an intersection between the stem 19 and the plane A, the inner diameter of the lamp housing 12 above the top portion of the stem 19 is small and the volume for accommodating gas is small, if a large part of the LED filament is located on the top portion of the stem, the overall heat dissipation effect of the LED filament is affected, thereby reducing the product quality. When there is a distance between the stem 19 and the plane A, and the distance from a stem top portion to the plane A is less than the height of the stand 19*a*, the stem 19 includes a stem bottom portion and a stem top portion opposite to each other, the stem bottom portion is connected to the lamp cap 16, the stem top portion extends to the direction of the lamp housing top portion, and the length of the LED filament located between the stem top portion and the lamp housing top portion (or the distance between the highest point of the LED filament and the stem top portion) is less than the length of the LED filament located between the stem top portion and the lamp housing bottom portion (or the distance between the stem top portion and the lowest point of the LED filament). Most of the LED filament can be indirectly supported by the stem, so as to ensure the stability of the LED filament shape during the transportation of the LED light bulb. In some embodiments, when there is a distance between the stem 19 and the plane A, and the distance from the stem top portion to the plane A is greater than the height of the stand 19*a*, the stem 19 includes a stem bottom portion and a stem top portion opposite to each other, the stem bottom portion is connected to the lamp cap 16, the stem top portion extends to the direction of the lamp housing top portion, and the length of the LED filament located between the stem top portion and the lamp housing top portion is greater than the length of the LED filament located between the stem top portion and the lamp housing bottom portion. Since the volume of gas contained between the stem top portion and the lamp housing bottom portion is large, and most of the LED filament is located between the stem top portion and the lamp housing bottom portion, which facilitates the heat dissipation of the LED filament.

Referring to FIG. 9A to FIG. 9D, FIG. 9A to FIG. 9D are schematic diagrams of an LED light bulb according to an embodiment of this application. The LED light bulb includes a lamp housing 12 and a lamp cap 16 connected to the lamp housing 12. A plurality of LED filaments C1, C2, C3, . . . , Cn arranged in the lamp housing 12, where n is an integer. Each LED filament 100 includes a first electrode and a second electrode. The vertical distance between the first electrode and the second electrode after the LED filament is bent does not exceed the height of the stem 19. In one embodiment, when not bent, the LED filament 100 includes a first end and a second end opposite to each other. The first end and the second end are configured to connect a power component (not shown) to supply power to the LED chips on the LED filament 100. The length of the LED filament 100 is the distance from the first end to the second end. When the LED filament 100 is bent, the first end and the second end of each LED filament 100 are separated from each other, so that each LED filament 100 is spatially distributed. In some embodiments, in the direction of the central axis of the LED light bulb, the vertical distance between the first end of any LED filament and the first end of another LED filament does not exceed 2 cm, or/and the vertical distance between the second end of any LED filament and the second end of another LED filament does not exceed 2 cm, so that the first electrodes of the plurality of LED filaments can pass through (or substantially pass through) a first plane, and the second electrodes of the plurality of LED filaments can pass through (or substantially pass through) a second plane. When the LED filaments are electrically connected, the first ends of the plurality of LED filaments 100 are connected to each other or the second ends are connected to each other, or the first end of one LED filament 100 is connected to the second end of another LED filament. The electrical connection is simple. Compared with the second plane, the first plane is close to the lamp housing top portion, the first plane and the second plane are separated from each other, and the first plane and the second plane are parallel to each other or may be at a certain angle to each other.

Each LED filament 100 is spirally distributed. Each LED filament 100 is rotationally (spirally) extended around an axis (such as the central axis of the LED light bulb), and the angle of rotation of the second end of the LED filament relative to the first end around the central axis of the LED light bulb exceeds 270 degrees (when the LED filament is projected onto a plane along the central axis of the LED light bulb, the central angle occupied by the LED filament 100 on the plane is greater than 270 degrees). Preferably, the axes around which at least two LED filaments 100 revolve are coincident, that is, the at least two LED filaments 100 both rotate around the same axis, or the axes around which the at least two LED filaments 100 revolve are parallel to each other or at a certain angle. The LED filament 100 extends around the axis in a smooth curve between the first end and the second end, or in a broken line between the first end and the second end. In one embodiment, the axis around which the LED filament 100 revolves is parallel to the stem 19, or the LED filament 100 rotates and extends around the stem 19.

The distance from at least one point on the LED filament C1 to the stem 19 is the same or approximately the same as the distance from a point on the LED filament Cn (nfl) to the stem 19. In one embodiment, in the height direction of the LED light bulb, the LED filaments C1, C2, C3, . . . , and Cn are adjacent in sequence, and the distance from LED filament C1 to LED filament C2 is equal to or approximately equal to the distance from LED filament Cn to LED filament Cn+1 (n≥2). In the xy plane, the first electrodes or/and the second electrodes of the LED filaments C1, C2, C3, . . . , and Cn are located on the circumference with the stem 19 (or the stand) as the center. On the XZ plane or the YZ plane, the projections of the LED filaments intersect with each other, and the projection of a part of the LED filament Cn intersects with the projection of the LED filament Cn+1 (n≥1). In some embodiments, on the XZ plane or the YZ plane, the projection of one LED filament intersects with the projections of other LED filaments. For example, the LED light bulb includes four LED filaments C1, C2, C3, and C4. On the XZ plane or the YZ plane, the projection of a part of the LED filament C2 intersects with the projections of the LED filament C1, LED filament C3, and LED filament C4. Certainly, in other embodiments, the projection of a part of the LED filament C2 may intersect with the projections of at least two of the LED filament C1, the LED filament C3, and the LED filament C4.

Figure 10A:
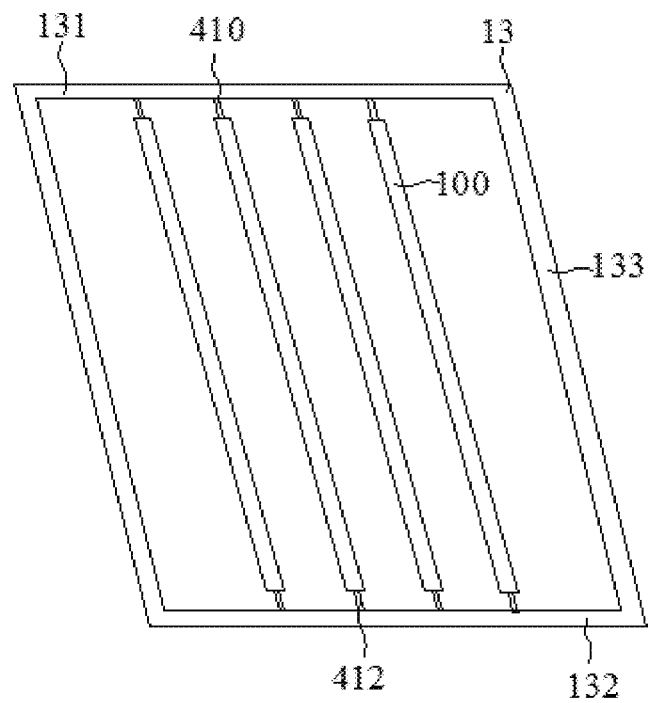
FIG. 10A is a schematic diagram of an LED filament in an unbent state according to an embodiment.
Figure 10B:
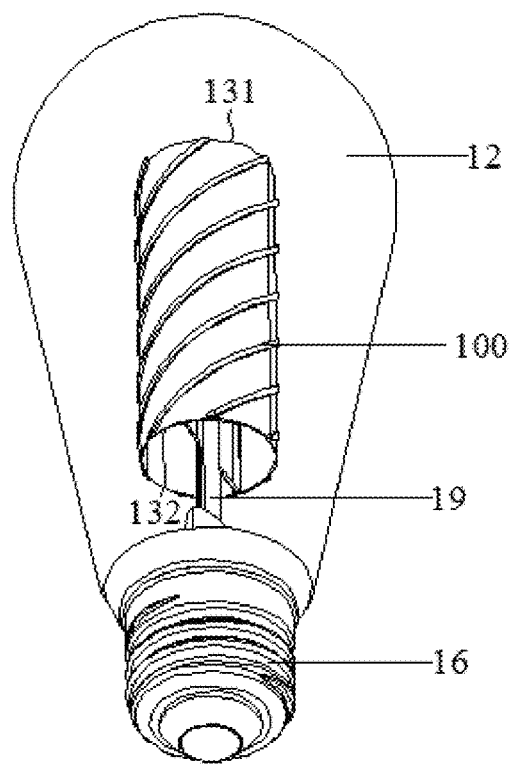
FIG. 10B is a schematic diagram of an LED light bulb using the LED filament shown in FIG. 10A.

Referring to FIG. 10A and FIG. 10B, a fixing portion 13 is disposed in the lamp housing 12, the power module (not shown) is connected to the fixing portion 13, the fixing portion 13 has a first opening 133, the filament body of each filament is located in the first opening 133, and a part of the electrodes 410/412 of each LED filament is connected to the fixing portion 13 to fix the position of the LED filament 100. Specifically, the fixing portion 13 has a first connecting portion 131 and a second connecting portion 132 opposite to each other, the first electrode 410 is connected to the first connecting portion 131, the second electrode 412 is connected to the second connecting portion 132, the first connecting portion 131 has a first end and a second end opposite to each other, and the second connecting portion 132 has a third end and a fourth end opposite to each other. Compared with the second end, the first end of the first connecting portion 131 is closer to the third end of the second connecting portion 132. When the fixing portion 13 is curled, the first end of the first connecting portion 131 approaches the second end of the first connecting portion 131, and the third end of the second connecting portion 132 approaches the fourth end of the second connecting portion 132. That is, the first connecting portion 131 and the second connecting portion 132 are curled in the same direction, and the LED filament 100 is in a straight shape. In some embodiments, when the fixing portion 13 is curled, the first end of the first connecting portion 131 approaches the second end of the first connecting portion 131, and the fourth end of the second connecting portion 132 approaches the third end of the second connecting portion 132. That is, the first connecting portion 131 and the second connecting portion 132 are curled in opposite directions, and the LED filament 100 is in a bent shape. After the fixing portion 13 is curled, the power module is electrically connected to the first connecting portion 131 and the second connecting portion 132 respectively. A carrier 14 is further disposed in the lamp housing 12. After the fixing portion 13 is curled, the LED filament 100 is attached to the carrier 14. The material of the carrier 14 is selected from a material with a light transmittance of at least more than 70%, and the material of the carrier may be glass or the like, so as to reduce the absorption of the light emitted by the LED filament 100 by the carrier 14. In other embodiments, the carrier may be cylindrical, and the LED filament is fixed on the carrier by gluing or the like.

Figure 11A:
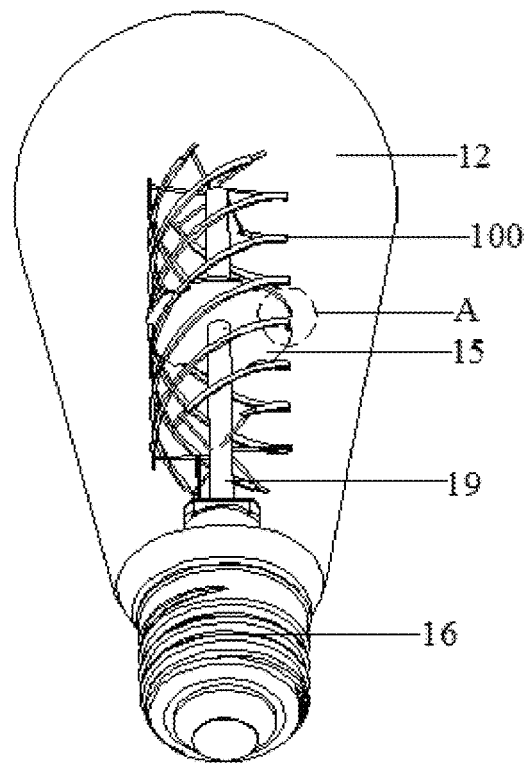
FIG. 11A is a schematic diagram of an LED light bulb according to an embodiment.
Figure 11B:
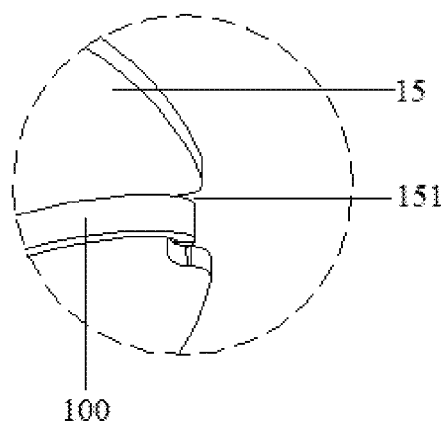
FIG. 11B is an enlarged view of part A in FIG. 11A.

Referring to FIG. 11A and FIG. 11B, a support unit is disposed on the stem 19, the support unit is perpendicular to the stem 19 (or the central axis of the LED light bulb), the support unit extends toward the top portion of the lamp housing 12 along the central axis of the LED light bulb, a plurality of support portions 15 are disposed on the support unit, a second opening 151 is provided on the support portion 15, the height of the LED filament 100 is less than the width of the LED filament 100, and the LED filament 100 may be inclined into the support portion 15 through the second opening 151 first. Since the minimum distance of the second opening 151 is greater than the width of the LED filament 100, the LED filament 100 can be prevented from falling out of the support portion 15, thereby fixing the shape of the LED filament 100.

Figure 12:
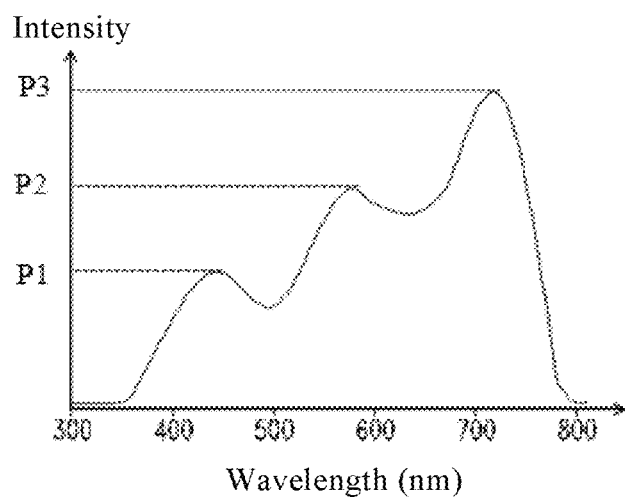
FIG. 12 is a schematic diagram of a light emission spectrum of an LED light bulb according to an embodiment of this application.
Figure 13:
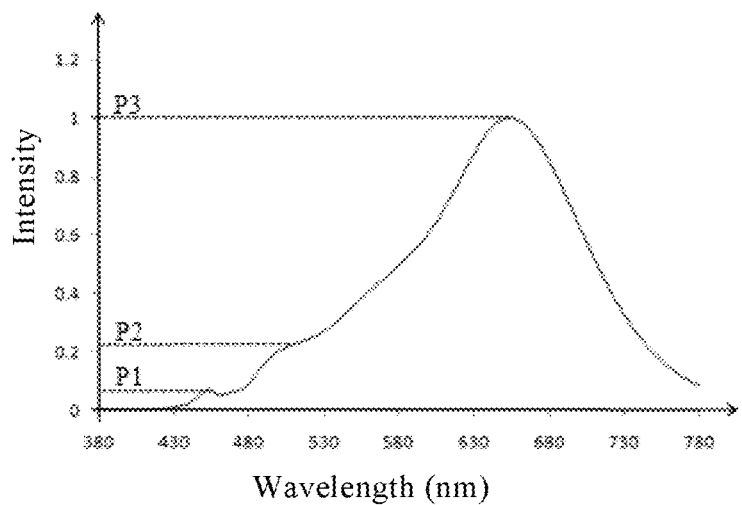
FIG. 13 is a schematic diagram of a light emission spectrum of an LED light bulb according to an embodiment of this application.

Referring to FIG. 12, FIG. 12 is a schematic diagram of a light emission spectrum of an LED light bulb according to an embodiment of this application. In this embodiment, the LED light bulb may be any LED light bulb disclosed in the previous embodiments, and any single LED filament disclosed in the previous embodiments is disposed in the LED light bulb. The light emitted by the LED light bulb is measured by a spectrometer to obtain a schematic diagram of a spectrum shown in FIG. 12. It can be seen from the schematic diagram of the spectrum that the spectrum of the LED light bulb is mainly distributed between the wavelengths from 400 nm to 800 nm, and three peaks P1, P2, P3 appear at three places in this range. The peak P1 is approximately between the wavelengths from 430 nm to 480 nm. The peak P2 is approximately between the wavelengths from 580 nm to 620 nm. The peak P3 is approximately between the wavelengths from 680 nm to 750 nm. With regard to intensity, the intensity of the peak P1 is less than the intensity of the peak P2, and the intensity of the peak P2 is less than the intensity of the peak P3. As shown in FIG. 12, such a spectral distribution is close to the spectral distribution of a conventional incandescent filament lamp and also close to the spectral distribution of natural light. In one embodiment, a schematic diagram of a light emission spectrum of a single LED filament is shown in FIG. 13. It can be seen from the schematic diagram of the spectrum that the spectrum of the LED light bulb is mainly distributed between the wavelengths from 400 nm to 800 nm, and three peaks P1, P2, and P3 appear in this range. The peak P1 is approximately between the wavelengths from 430 nm to 480 nm. The peak P2 is approximately between the wavelengths from 480 nm to 530 nm. The peak P3 is approximately between the wavelengths from 630 nm to 680 nm. With regard to intensity, the intensity of the peak P1 is less than the intensity of the peak P2, and the intensity of the peak P2 is less than the intensity of the peak P3. As shown in FIG. 13, such a spectral distribution is close to the spectral distribution of a conventional incandescent filament lamp and also close to the spectral distribution of natural light.

Figure 14:
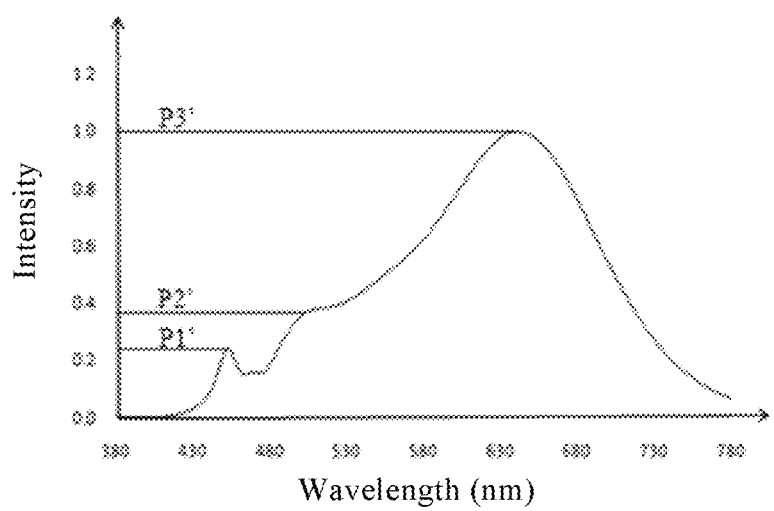
FIG. 14 is a schematic diagram of a light emission spectrum of an LED light bulb according to an embodiment of this application.

Referring to FIG. 14, FIG. 14 is a light emission spectrum of an LED light bulb according to an embodiment of this application. It can be seen from the figure that there are three peaks P1', P2', and P3' similar to those shown in FIG. 13 between the wavelengths from 400 nm to 800 nm where the spectrum of the LED light bulb is distributed. The peak P1' is approximately between the wavelengths from 430 nm to 480 nm. The peak P2' is approximately between the wavelengths from 480 nm to 530 nm. The peak P3' is approximately between the wavelengths from 630 nm to 680 nm. With regard to intensity, the intensity of the peak P1' is less than the intensity of the peak P2', and the intensity of the peak P2' is less than the intensity of the peak P3'. The difference is that the intensity of P1' is greater than that of P1, and the FWHM of P3' is greater than that of P3. The LED light bulb has an average color rendering index Ra (R1-R8) greater than 95, saturated red color (R9) greater than or equal to 90, and a luminous efficiency (Eff) of the LED filament greater than or equal to 100 lm/w.

Figure 15:
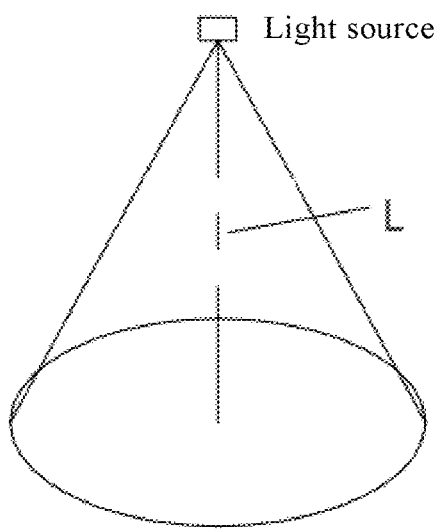
FIG. 15 is a schematic diagram of light transmission of an LED light bulb according to this application.
Figure 16:
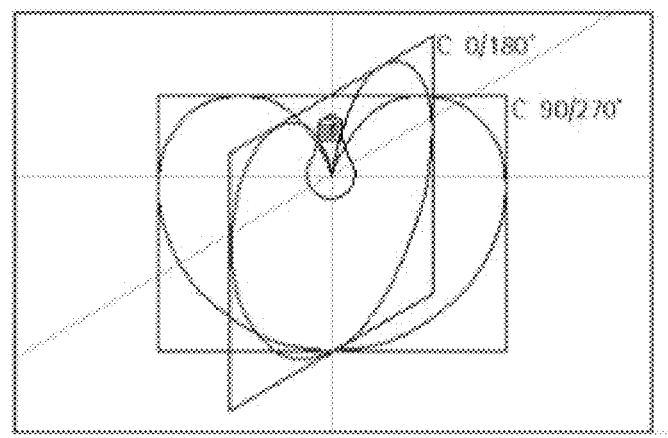
FIG. 16 is a schematic diagram of a C90/180 surface and a C90/270 surface of an LED light bulb according to this application.

FIG. 17 to FIG. 20 are light distribution curve diagrams of LED light bulbs according to different embodiments. Referring to FIG. 15, it can be seen from the figure that the light emitted by the LED light bulb is roughly symmetrically distributed around the optical axis L, and the light emitted by the LED light bulb after lighting has a butterfly-shaped light distribution curve with a wider light distribution. If the lamp cap is facing up and the lamp housing is facing down (as shown in FIG. 16, the downward direction is defined as 0 degrees. Curve L1 is the light intensity distribution curve of 0 degree and 180 degree section (C0/180). Curve L2 is the light intensity distribution curve of 90 degree and 270 degree section (C90/270). C0/180 and C90/270 are respectively symmetrical about the central axis of the LED light bulb. The LED light bulb has symmetrical light distribution at 0 degrees and 180 degrees, or/and symmetrical light distribution at 90 degrees and 270 degrees. When the LED light bulb is lit, the lengths of the filament on the two sections are different or the quantities of the LED chips are different at different angles. Therefore, at some angles, the luminous intensity on the curve L1 is greater than the luminous intensity on the curve L2, and at some other angles, the luminous intensity on the curve L1 is less than the luminous intensity on the curve L2, so that the curve L1 and the curve L2 partially overlap, that is, at least one point on the curve L1 is also located on the curve L2.

Specifically, in the 0 degree and 180 degree section and the 90 degree and 270 degree section, at some certain angles, the luminous intensity on the curve L1 is greater than the luminous intensity on the curve L2 (that is, the curve L1 is at the periphery of the curve L2). At these angles, the length of the LED filament corresponding to the curve L1 is greater than the length of the LED filament corresponding to the curve L2, or the quantity of the LED chips corresponding to the curve L1 is greater than the quantity of the LED chips corresponding to the curve L2. For example, the angles include 100 degrees to 130 degrees in FIG. 17, 30 degrees to 80 degrees in FIG. 18, 30 degrees to 160 degrees in FIG. 19, and 70 degrees to 80 degrees in FIG. 20.

On the plane with the central axis of the LED light bulb as the axis of symmetry, in the LED filament, a part of the top layer faces outward, and a part of the carrying layer faces outward. On the section of the central axis (or optical axis) of the LED chip, when the carrying layer faces outward, the shortest distance from the carrying layer to the lamp housing is less than the shortest distance from the top layer to the lamp housing; and when the top layer faces outward, the shortest distance from the top layer to the lamp housing is less than the shortest distance from the carrying layer to the lamp housing. The light emitted by the LED filament is partly emitted from the top layer and partly from the carrying layer. The luminous flux of the light emitted through the top layer is greater than the luminous flux of the light emitted through the carrying layer. In the plane with the central axis of the LED light bulb as the axis of symmetry (such as the YZ plane), there is both light from the top layer and light from the base layer. If only light from the top layer or light from the base layer is on some of these planes, the light distribution of the LED light bulb will be uneven, which will affect the light emission effect of the LED light bulb.

In one embodiment, when any LED filament in the LED light bulb is bent, at least two LED chips in one LED filament have different light-emitting directions. If there are more than two LED filaments in the LED light bulb, the light-emitting direction of at least one LED chip in one LED filament is different from the light-emitting direction of at least one LED chip in another LED filament. The light-emitting direction of the LED chip will affect the luminous flux of the LED light bulb at different angles. The light-emitting directions of multiple LED chips in the LED filament are different, and light will be emitted from multiple angles of the LED light bulb, to prevent dark regions at certain angles of the LED light bulb. For example, in FIG. 14 to FIG. 17, the LED light bulb emits light at all regions except for the lamp cap.

In one embodiment, some LED light bulbs have relatively less luminous flux distribution in the range of 0 degrees to 30 degrees. For example, the total luminous flux in the range of 0 degrees to 30 degrees is 3% to 20% of the luminous flux of the LED light bulbs. When the LED filaments in these LED light bulbs are bent around the central axis of the LED light bulbs, the LED filaments are farther from the central axis (or stem) of the LED light bulbs, so that less light is emitted from the central axis region of the LED light bulbs. In some embodiments, the distances from different regions of the LED filament to the central axis (or stem) of the LED light bulb are different. A part of the LED filament is close to the central axis (or stem) of the LED light bulb, and a part of the LED filament is far from the central axis of the LED light bulb. Further, some LED chips are close to the central axis (or stem) of the LED light bulb, and some LED chips are far from the central axis of the LED light bulb. If a part of the LED filament is relatively close to the central axis of the LED light bulb, the distance from this part of the LED filament (top layer or carrying layer) to the central axis (or stem) of the LED light bulb is 2-15 mm, or the length of the supporting arm is 2-15 mm. On the one hand, the heat generated by the LED filament is not easy to accumulate; on the other hand, the luminous flux of the LED light bulb increases in the light emission direction, so that the output light of the LED light bulb is evenly distributed in space.

In some embodiments, at least a part of the LED filament intersects with the central axis (or stem) of the LED light bulb. For example, the intersection may be that a part of the LED filament passes through the stem top portion and the distance from the part of the LED filament to the stem is about 0 (0-5 mm), or may be that the LED filament and stem are respectively regarded as lines, which intersect with or go across the central axis of the LED light bulb. With the LED filament, the luminous flux in the central axis region of the LED light bulb increases, and the luminous flux in the range from 0 degrees to 30 degrees is 20% to 50% of the total luminous flux of the LED light bulb, which prevents the formation of dark regions in the light emission direction of the central axis of the LED light bulb. Further, the part of the LED filament intersecting with the central axis (or stem) of the LED light bulb includes at least one or more LED chips, so as to increase the luminous flux in the central axis region of the LED light bulb.

Figure 17:
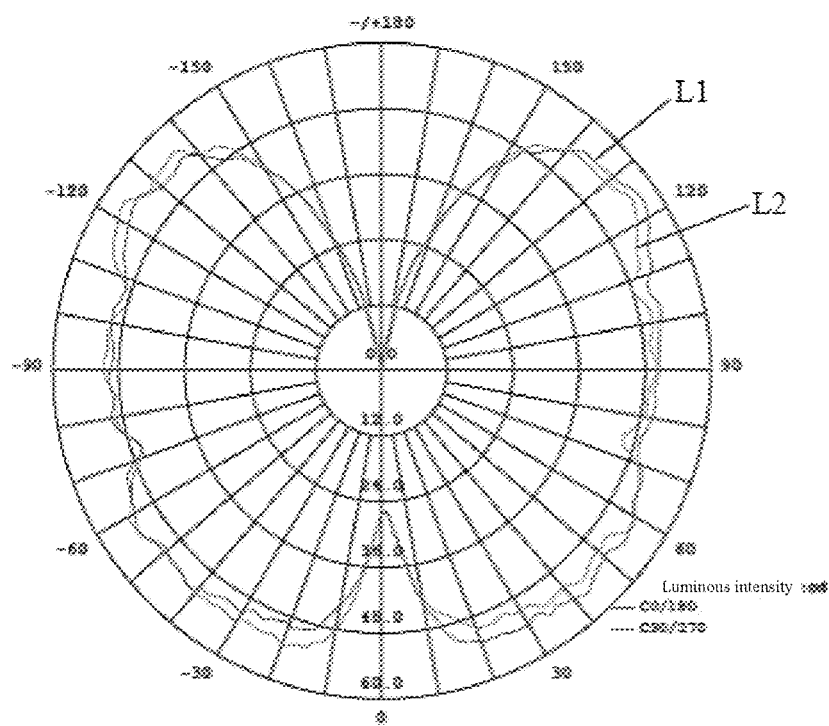
FIG. 17 is a light distribution curve diagram of an LED light bulb according to an embodiment.
Figure 18:
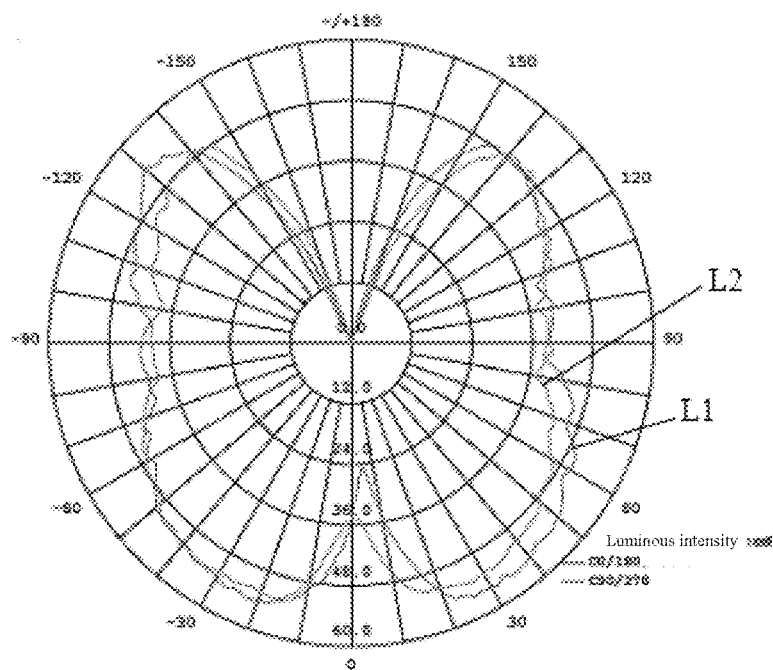
FIG. 18 is a light distribution curve diagram of an LED light bulb according to an embodiment.
Figure 19:
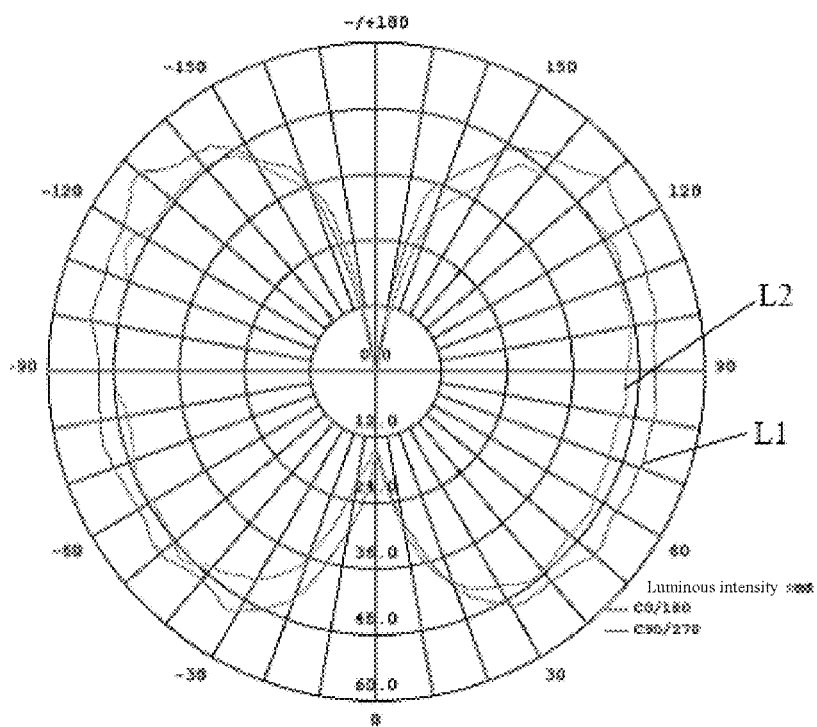
FIG. 19 is a light distribution curve diagram of an LED light bulb according to an embodiment.
Figure 20:
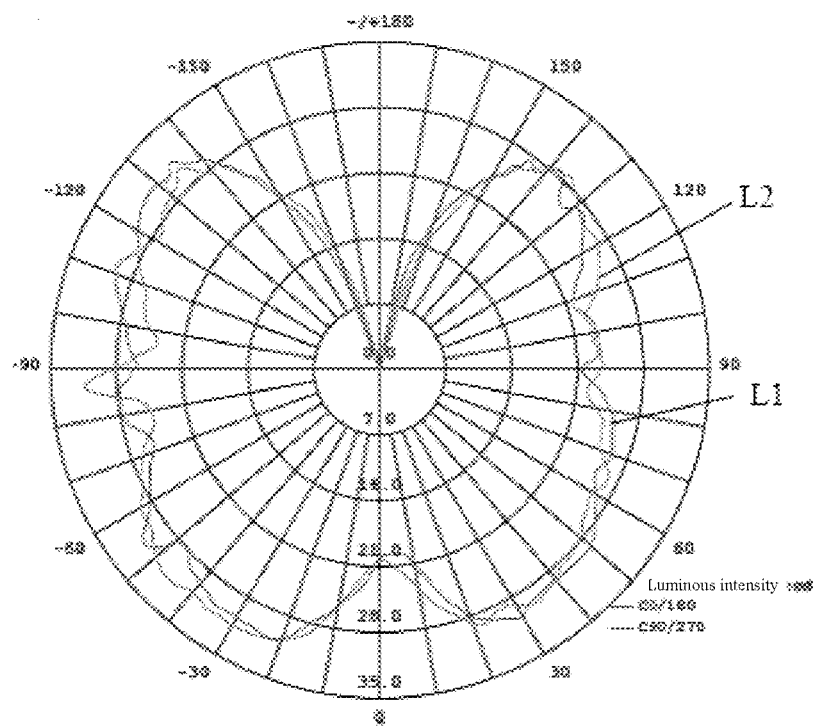
FIG. 20 is a light distribution curve diagram of an LED light bulb according to an embodiment.

In some embodiments, at least on one plane (such as the XY plane, YZ plane, or YZ plane), the LED filament in the LED light bulb is symmetric about the central axis (or stem) of the LED light bulb. Further, at least on one plane, the length of the LED filament is symmetric about the central axis (or stem) of the LED light bulb. Further, at least on one plane, the quantity of the LED chips in the LED filament is symmetric about the central axis (or stem) of the LED light bulb. When the LED filament is symmetrically distributed, the luminous intensity distribution of the LED light bulb on the 0 degree and 180 degree section and 90 degree and 270 degree section is relatively uniform, and the area enclosed by the curve L1 and the curve L2 is roughly the same, for example, as shown in FIG. 17 and FIG. 18, the light distribution of the LED light bulb is relatively uniform.

The beam angle of the LED light bulb on the 0 degree and 180 degree section is α, the beam angle of the LED light bulb on the 90 degree and 270 degree section is β, and the absolute value of the difference between α and β is less than 50°. If the difference between α and β is large, the positions where the maximum luminous intensity of the LED light bulb on the two sections will be far apart, the light and dark levels of the light will be more significant, and the light uniformity of the LED light bulb will be poor. Further, when the absolute value of the difference between α and β is less than 30°, the LED light bulb has excellent light uniformity. Further, when the absolute value of the difference between α and β is less than 10°, the LED light bulb has uniform light distribution. The beam angle may be defined by the International Commission on Illumination (CIE Europe) or the Illuminating Engineering Society (IES USA). Specifically, according to the Illuminating Engineering Society (IES USA), the average beam angle (average of α and β) of the LED light bulb is greater than 100°, and the light distribution is wider. In this embodiment, the beam angle of the LED light bulb is defined as the angle between the two sides at 50% of the normal luminous intensity.

The distance between the highest point and the lowest point of the LED filament in the LED light bulb accounts for 50% to 80% of the height of the lamp housing (the distance from the connection between the lamp housing and the lamp cap to the lamp housing top layer), and most regions of the lamp housing have light penetrating, and the light distribution is wider. If the LED light bulb includes a plurality of LED filaments, the highest point and the lowest point of the LED filament are the highest point and the lowest point of any one of the LED filaments.

Figure 21:
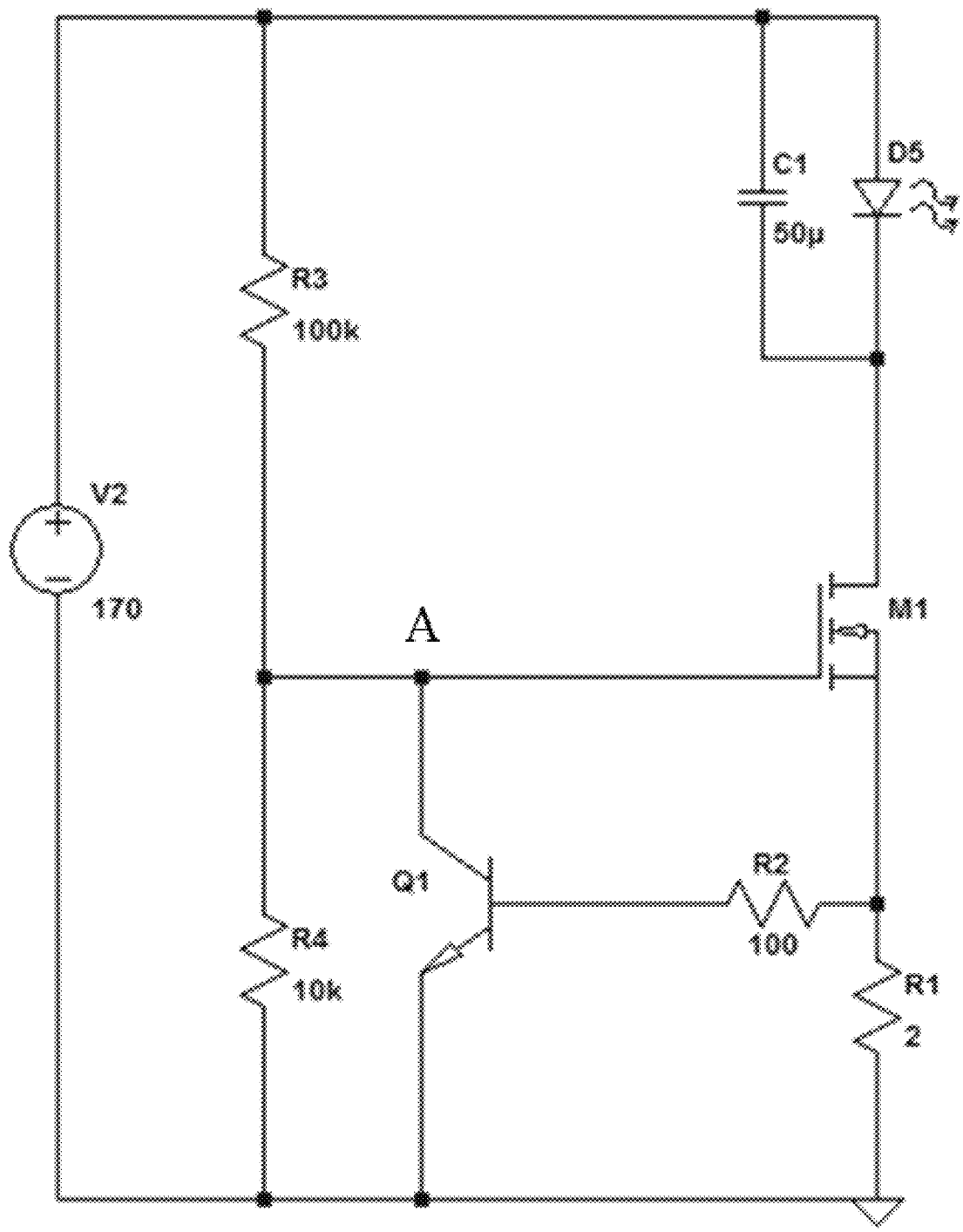
FIG. 21 is a circuit diagram of a first constant-current circuit according to an implementation of the present invention.

FIG. 21 is a circuit diagram of a constant-current circuit according to an implementation of the present invention. According to the general practice of circuit diagrams, the optional parameters of each component are marked in the diagram, and the unit is the international standard measurement unit. In the following description, for brevity, a first resistor R1 is referred to as R1, and other elements are similar.

According to the circuit shown in FIG. 21, after power-on, the voltage at point A is the voltage divided by R4 on R3 and R4, so the current between the drain and source of M1 rises, making Vbe large enough to turn on Q1 and pull down the voltage at point A, causing the current between the drain and source of M1 to drop. R1 is small, so Vbe cannot reach the turn-on voltage of Q1, and then Q1 turns off. When Q1 turns off, the voltage at point A returns to the voltage divided by R4 on R3 and R4, so that the current between the drain and source of M1 rises again, and then the above process is repeated. Finally, M1 remains on and the current IR1 through R1 remains approximately equal to the ratio of Vbe to R1. It can be seen that the constant current on the load D5 is achieved in this way.

Figure 22:
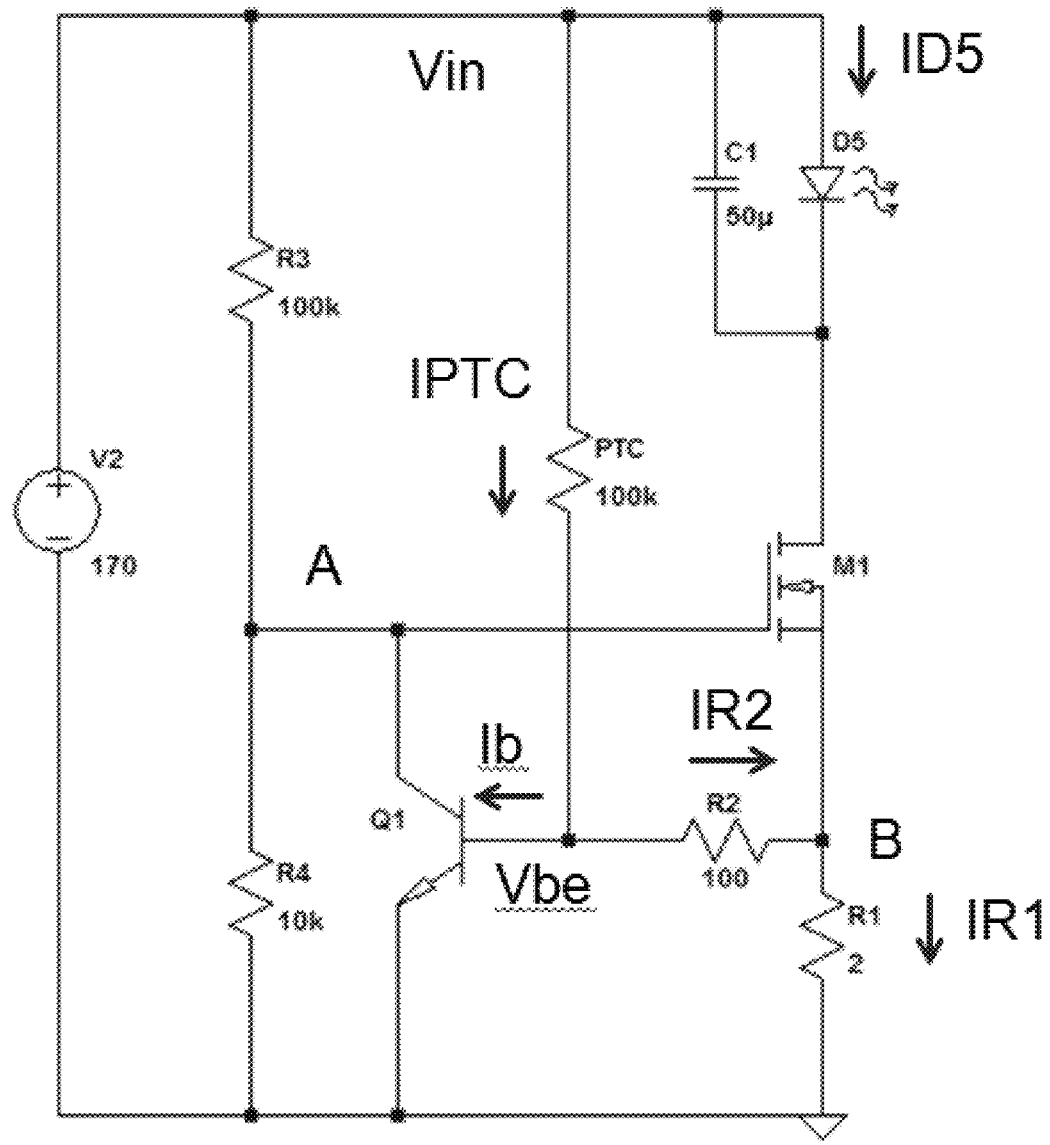
FIG. 22 is a circuit diagram of a second constant-current circuit according to an implementation of the present invention.

The structure of the circuit shown in FIG. 22 is basically the same as that of FIG. 21, except that a positive temperature coefficient (PTC) thermistor is included in FIG. 22. The voltages at some points and the currents on some branches are marked on the diagram. The current through PTC IPTC=(Vin−Vbe)/PTC. The current into the Q1 base is almost zero, so IPTC=IR2, and IR2=(Vbe−VB)/R2, where VB represents the voltage at point B. Therefore, (Vin−Vbe)/PTC=(Vbe−VB)/R2, where PTC represents the resistance of the PTC resistor. According to the transformation of this formula, VB=Vbe−(Vin−Vbe)R2/PTC. It can be learned from FIG. 22 that VB=ID5×R1, so ID5×R1=Vbe−(Vin−Vbe)R2/PTC, and then the formula 1 is obtained as follows:

$$ID5=Vbe/R1-[(Vin-Vbe) \times R2]/(PTC \times R1).$$

It can be seen from the formula 1 that the load current ID5 is also affected by the resistance of PTC. Due to the physical properties of the triode, the voltage Vbe of its base will decrease when the temperature rises. It can be seen from the formula 1 that the reduction of Vbe will reduce ID5, that is, the load current will decrease, which will affect the lighting of the lamp. On the other hand, PTC will increase when the temperature rises. It can be seen from the formula 1 that ID5 also increases when PTC increases, which helps to offset the fluctuation of load current caused by the decrease of Vbe.

According to the formula 1, if the PTC resistor is replaced with a negative temperature coefficient thermistor, ID5 will increase when the temperature decreases, that is, the low temperature protection function of the lamp is realized. In addition, it can be seen from the formula 1 that R1 directly affects ID5, that is, R1 directly affects the brightness of the lamp. Therefore, when the power supply voltage remains unchanged, the setting of the load current can be realized by selecting the value of R1.

Figure 23:
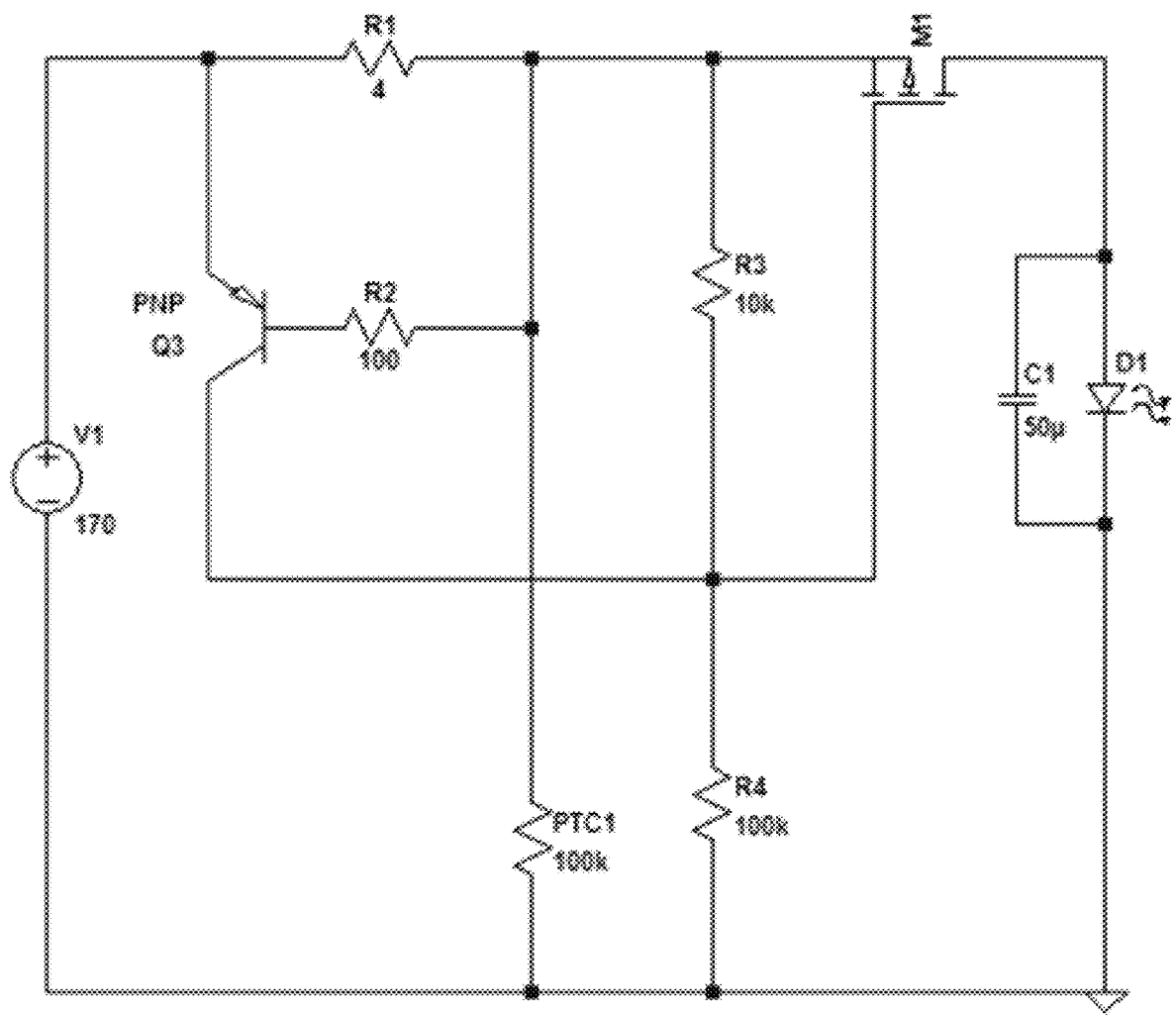
FIG. 23 is a circuit diagram of a third constant-current circuit according to an implementation of the present invention.

According to the circuits shown in FIG. 21 and FIG. 22, M1 acts as a main switching element, and its current is affected by the negative feedback loop composed of R1, R2, and Q1, and Q1, as a secondary switching element, is turned on or off under the action of the current of M1, and finally the on-current of M1 is maintained at a fixed level, thereby realizing a constant current circuit for the load. FIG. 21 and FIG. 22 are only examples, and there are also other circuit topologies, such as FIG. 23. FIG. 23 is a circuit diagram of a third constant-current circuit according to an implementation of the present invention.

According to the circuit shown in FIG. 23, when PTC1 (or NTC resistor) is added in a preferred way, similar to the previous analysis, after power-on, the on-current of M1 rises, so that Q3 is turned on. The conduction of Q3 reduces the on-current of M1, which also forms the negative feedback similar to that in FIG. 24 and FIG. 22, so that M1 maintains a constant on-current state, and then the current flowing through the load D1 is constant.

In the technical solutions of the implementations of the present invention, each switching element may also adopt other types of switching devices. In addition to using a direct current voltage source, the power supply may be a rectifying circuit, which can convert an external alternating current input (usually utility power) to direct current. In addition, a fourth resistor R4 may be connected in parallel to a capacitor, so that the voltage at point A increases gradually when power-on, so as to realize the function of delaying the power-on.

According to the technical solutions of the implementations of the present invention, the main switching element and the negative feedback circuit are used to realize that the current flowing through the main switching element is a constant value, thereby realizing a constant current circuit. In this way, the constant current circuit can be realized by using fewer discrete components, and the problem of electromagnetic compatibility is not involved. In the specific circuit structure, PTC or NTC may also be used to improve the temperature drift phenomenon. When the constant current circuit is applied to a lamp, the occupied volume is small and the light emission is stable.

Figure 24:
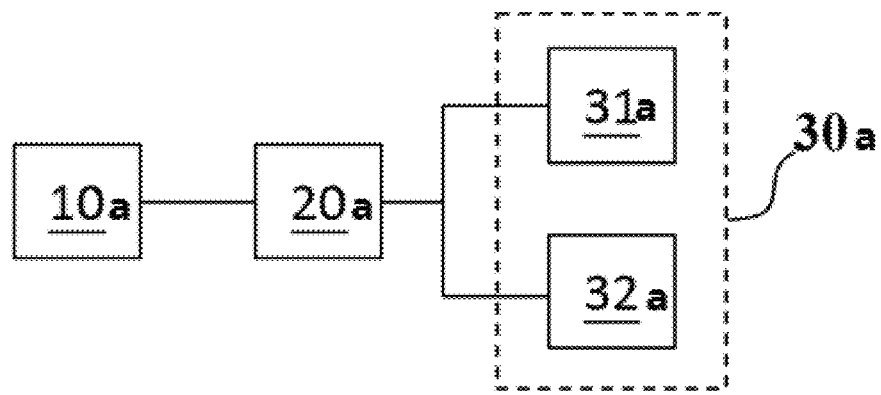
FIG. 24 is a schematic circuit block diagram of an LED lamp according to an embodiment of this application.

FIG. 24 is a schematic circuit block diagram of an LED lamp according to an embodiment of this application. In this embodiment, the LED lamp includes a constant-current drive circuit 10a, a shunt circuit 20a, and an LED module 30a. The constant-current drive circuit 10a is a constant-current source for providing a constant current. The LED module 30a includes an LED component 31a and an LED component 32a. The LED components 31a and 32a are electrically connected to the shunt circuit 20a. The shunt circuit 20a is configured to receive the constant current of the constant-current drive circuit 10a and distribute the current to the LED component 31a and the LED component 32a. In this embodiment, the LED component includes a light emitting diode or a plurality of light emitting diodes connected in series.

In some embodiments, the LED component 31a and the LED component 32a are configured with different color temperatures. The brightness of the LED components 31a and 32a can be adjusted by adjusting the current flowing through the LED component 31a and the LED component 32a. The color temperature can be adjusted by adjusting the brightness ratio of the LED component 31a to the LED component 32a.

In some embodiments, the LED component 31a and the LED component 32a are configured with different colors.

In some embodiments, the LED component 31a and the LED component 32a include different quantities of light emitting diodes.

Through the configuration of the above embodiment, only one constant-current drive circuit is required to realize the control of at least two LED components, so as to realize the function of adjusting color temperature or color. Especially when the LED components include different quantities of light emitting diodes, the adjustment of current of different LED components can still be achieved.

Figure 25A:
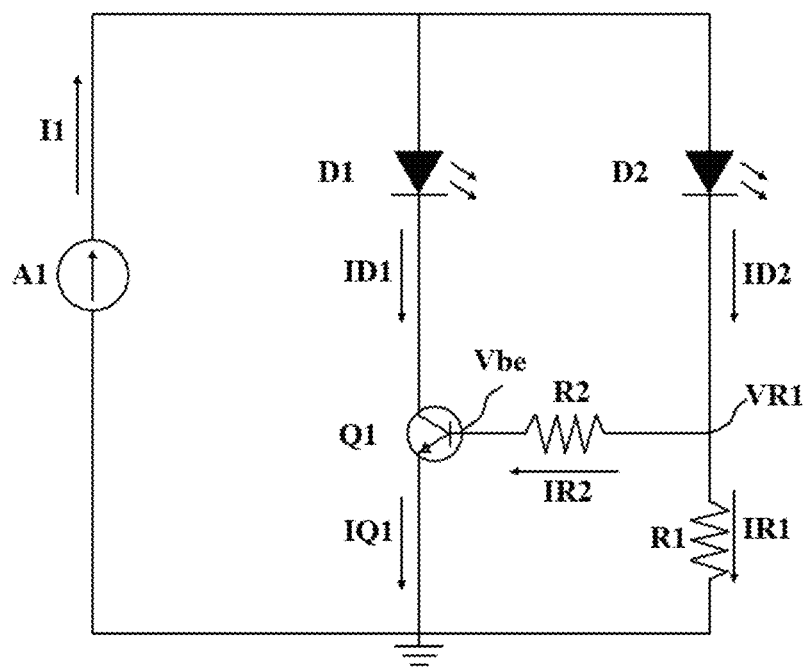
FIG. 25A is a schematic circuit structural diagram of an LED lamp according to an embodiment of this application.

FIG. 25A is a schematic circuit structural diagram of an LED lamp according to an embodiment of this application. In this embodiment, the constant-current drive circuit 10a includes a constant current source A1, the LED component 31a includes a LED component D1, the LED component 32a includes an LED component D2, and the shunt circuit 20a includes a triode Q1, and resistors R1 and R2. An anode of the LED component D1 is electrically connected to an anode of the LED component D2 and is electrically connected to a first output terminal of the constant current source A1. A cathode of the LED component D1 is electrically connected to a collector of the triode Q1, an emitter of the triode Q1 is electrically connected to a common ground terminal, a base of the triode Q1 is electrically connected to a first pin of the resistor R2, and a second pin of the resistor R2 is electrically connected to a first pin of the resistor R1 and a cathode of the LED component D2. A second pin of the resistor R1 is electrically connected to the common ground terminal. A second output terminal of the constant current source A1 is electrically connected to the common ground terminal.

In this embodiment, the LED components D1 and D2 includes a light emitting diode or a plurality of light emitting diodes connected in series (that is, the LED chips in the foregoing embodiments).

The operation principle of the shunt circuit 20a is described below. In this embodiment, the constant current source A1 provides a constant current I1. After being shunted by the shunt circuit 20a, the current flowing through the LED component D1 is ID1, and the current flowing through the LED component D2 is ID2. The current flowing through the resistor R1 is IR1, and the current flowing through the resistor R2 is IR2. The voltage of the base of the triode Q1 is Vbe, and the current of the emitter of the triode Q1 is IQ1. The current satisfies the following relationships:

$$I1 = ID1 + ID2$$

$$ID2 = IR1 + IR2$$

$$IQ1 = ID1 + IR2$$

In this embodiment, the current of IR2 is small and can be omitted, so $$ID2 \approx IR1$$

$$IQ1 \approx ID1$$

$$IR1 \approx Vbe/R1$$

When ID2 has an increasing trend, VR1 increases, and IR2 increases. According to the amplification principle of the triode, ID1 increases. ID1 and ID2 add up to a constant value I1, so when ID1 increases, ID2 decreases. Therefore, when ID2 has an increasing trend, the increasing trend of ID2 is suppressed through the adjustment by the shunt circuit 20a, so that ID2 tends to be a stable value. Similarly, when ID2 has a decreasing trend, VR1 decreases, and IR2 decreases. According to the amplification principle of the triode, ID1 decreases. ID1+ID2=I1, so when ID1 decreases, ID2 increases. Therefore, when ID2 has a decreasing trend, the decrease of ID2 is suppressed through the adjustment by the shunt circuit 20a, so that ID2 tends to be a stable value.

$$ID2 \sim Vbe/R1$$

$$ID1 = I1 - ID2$$

In this embodiment, Vbe is a constant value about 0.7 V. By adjusting the resistor R1, the current ID1 and the current ID2 can be adjusted, so as to achieve the purpose of adjusting the brightness of the LED components D1 and D2.

In some embodiments, the quantity of light emitting diodes included in the LED component D1 is less than or equal to the quantity of light emitting diodes included in the LED component D2.

In some embodiments, the LED components D1 and D2 are configured with different colors or color temperatures.

In some embodiments, the triode Q1 may be replaced with a field-effect transistor, which does not affect the technical effect to be achieved by this application.

Figure 25B:
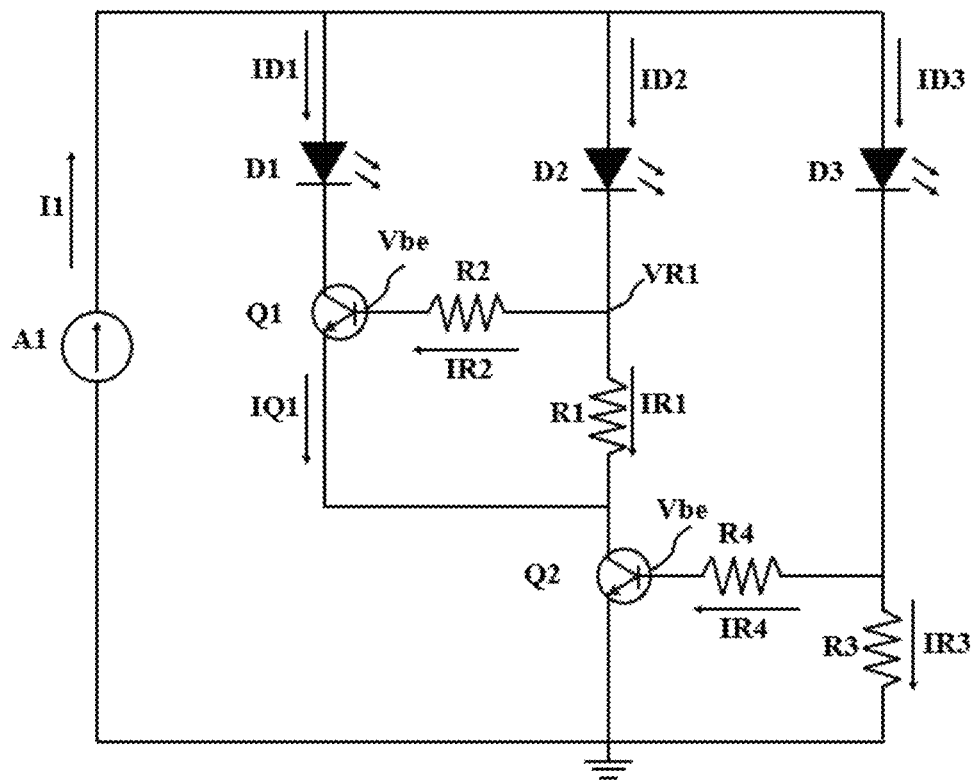
FIG. 25B is a schematic circuit structural diagram of an LED lamp according to another embodiment of this application.

FIG. 25B is a schematic circuit structural diagram of an LED lamp according to another embodiment of this application. The circuit structure of the LED lamp in this embodiment is similar to the embodiment in FIG. 25A. The difference is that, in this embodiment, the LED module 30a further includes an LED component D3, and the shunt circuit 20a further includes a triode Q2, and resistors R3 and R4. The anode of the LED component D1 is electrically connected to the anode of the LED component D2 and an anode of the LED component D3, and is electrically connected to the first output terminal of the constant current source A1. The cathode of the LED component D1 is electrically connected to the collector of the triode Q1. The emitter of the triode Q1 is electrically connected to the second pin of the resistor R1, and the base of the triode Q1 is electrically connected to the first pin of the resistor R2. The second pin of the resistor R2 is electrically connected to the cathode of the LED component D2 and the first pin of the resistor R1. A collector of the triode Q2 is electrically connected to the second pin of the resistor R1, an emitter of the triode Q2 is electrically connected to the common ground terminal, and a base of the triode Q2 is electrically connected to a first pin of the resistor R4. The second pin of the resistor R4 is electrically connected to the cathode of the LED component D3 and the first pin of the resistor R3. A second pin of the resistor R3 is electrically connected to the common ground terminal. The second output terminal of the constant current source A1 is electrically connected to the common ground terminal.

The principle of adjusting the current of the three LED components by the shunt circuit in this embodiment is similar to the embodiment in FIG. 25A. The difference is that, in this embodiment, the LED component D3 is further added. The current in this embodiment satisfies the following relationships:

$$I1 = ID1 + ID2 + ID3$$

$$ID3 \approx IR3$$

$$ID2 \approx IR1$$

$$ID1 \approx IQ1$$

In this embodiment, IR2 and IR4 may be omitted. Therefore, $$ID3 \approx Vbe/R3$$

$$ID2 \approx Vbe/R1$$

$$ID1 = I1 - ID2 - ID3$$

In this embodiment, Vbe is a constant value about 0.7 V. By adjusting the resistance of the resistors R1 and R3, the currents ID2, ID3, and ID1 can be adjusted, so as to adjust the brightness of the LED components D1, D2, and D3.

In this embodiment, the quantity of diodes included in the LED component D1 is less than or equal to the quantity of light emitting diodes included in the LED component D2; and the quantity of light emitting diodes included in the LED component D2 is less than or equal to the quantity of light emitting diodes included in the LED component D3.

In some embodiments, the LED components D1, D2, and D3 are configured with different colors or color temperatures.

In some embodiments, the triodes Q1 and Q2 may be replaced with a field-effect transistor, which does not affect the technical effect to be achieved by this application.

Through the configuration of the above embodiment, only one constant-current drive circuit is required to realize the control of three LED components, so as to realize the function of adjusting color temperature or color. Especially when the LED components include different quantities of light emitting diodes, the adjustment of current of different LED components can still be achieved.

Figure 25C:
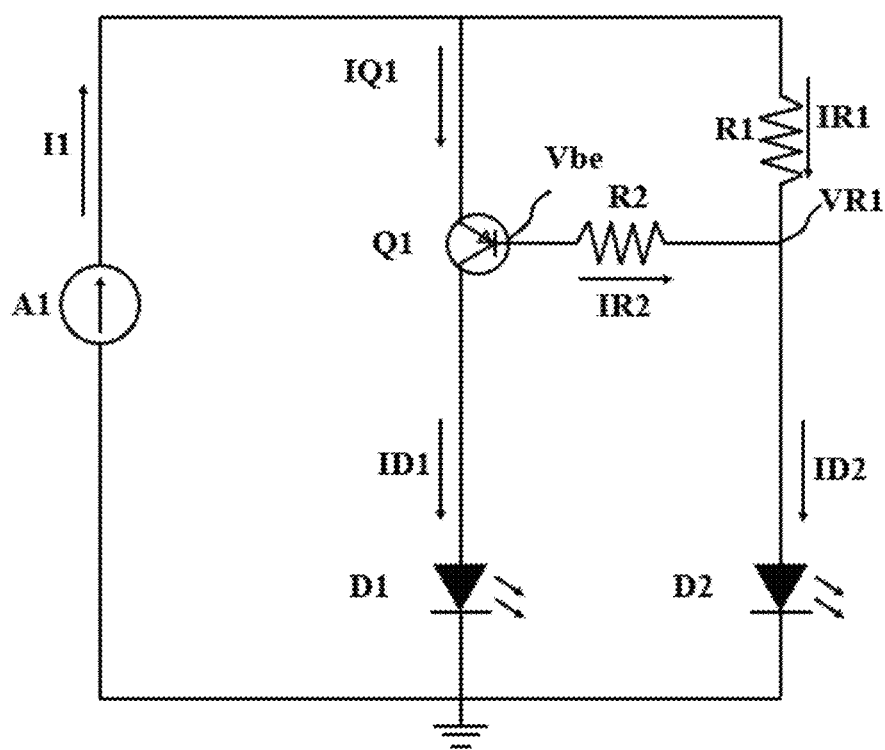
FIG. 25C is a schematic circuit structural diagram of an LED lamp according to still another embodiment of this application.

FIG. 25C is a schematic circuit structural diagram of an LED lamp according to still another embodiment of this application. The circuit structure of the LED lamp in this embodiment is similar to the embodiment in FIG. 25A. The difference is that, in this embodiment, the triode used for the shunt circuit 20a is a PNP triode, while the triode used in the embodiment in FIG. 25A is an NPN triode. In this embodiment, the constant-current drive circuit 10a includes a constant current source A1, the LED module 30a includes LED components D1 and D2, and the shunt circuit 20a includes a triode Q1, and resistors R1 and R2. The emitter of the triode Q1 is electrically connected to the first pin of the resistor R1 and the first output terminal of the constant current source A1, the collector of the triode Q1 is electrically connected to the anode of the LED component D1, and the base of the triode Q1 is electrically connected to the first pin of the resistor R2. The second pin of the resistor R2 is electrically connected to the second pin of the resistor R1 and the anode of the LED component D2. The cathode of the LED component D1 and the cathode of the LED component D2 are electrically connected to each other and together electrically connected to the common ground terminal. A second output terminal of the constant current source A1 is electrically connected to the common ground terminal.

The operation principle of the shunt circuit 20a in this embodiment is similar to the embodiments in FIG. 25A and FIG. 25B. Details are not described herein again. In this embodiment, the current of IR2 is small and can be omitted. The current satisfies the following relationships:

$$ID2 \approx Vbe/R1$$

$$ID1 = I1 - ID2$$

By adjusting the resistor R1, the currents ID1 and ID2 can be adjusted, so as to adjust the brightness of the LED components D1 and D2.

In some embodiments, the quantity of light emitting diodes included in the LED component D1 is less than or equal to the quantity of light emitting diodes included in the LED component D2.

In some embodiments, the LED components D1 and D2 are configured with different colors or color temperatures.

In some embodiments, the triode Q1 may be replaced with a field-effect transistor, which does not affect the technical effect to be achieved by this application.

Through the configuration of the above embodiment, only one constant-current drive circuit is required to realize the control of two LED components, so as to realize the function of adjusting color temperature or color. Especially when the LED components include different quantities of light emitting diodes, the adjustment of current of different LED components can still be achieved.

Through the description of the above embodiments, a person skilled in the art may properly carry out the shunt adjustment of multiple LED components, not limited to two or three.

The "one LED filament" or "an LED filament" in this application is formed by connecting the above-mentioned conductive section and the LED section or is only formed by the LED sections (or LED chip units), which has the same and continuous light conversion layer (including the same and continuously formed top layer or bottom layer), and only provides two conductive electrodes electrically connected to the conductive brackets of the light bulb at two ends. The structure that meets the above-mentioned structure description is the single LED filament structure in this application.

This application has been disclosed above with preferred embodiments. However, those skilled in the art should understand that these embodiments are only used to describe some implementations in this application, and should not be construed as a limitation. It should be noted that all changes and substitutions equivalent to these embodiments or proper combinations between these embodiments (especially the filament embodiment is combined into the light bulb embodiment in FIG. 4) should fall within the scope supported by the specification of this application. Therefore, the protection scope of this application shall be subject to the appended claims.

What is claimed is:

1. An LED lamp, comprising:
a lamp housing with a central axis;
a lamp cap connected to the lamp housing;
a stem disposed in the lamp housing along the central axis;
a first conductive bracket and a second conductive bracket disposed in the lamp housing;
a power supply disposed in the lamp cap and electrically connecting to the first conductive bracket and the second conductive bracket, the power supply comprising a constant-current drive circuit and a shunt circuit electrically connected to the constant-current drive circuit;
a first LED filament and a second LED filament being bent to form a spatial curve in the lamp housing and to be symmetrical to each other about the central axis, the first LED filament comprising a first LED component and the second LED filament comprising a second LED component, one end of the first LED filament and one end of the second LED filament coupled to the first conductive bracket, and the other end of the first LED filament and the other end of the second LED filament coupled to the second conductive bracket; and
a first supporting arm and a second supporting arm disposed in the lamp housing, one end of the first supporting arms connecting to the stem and the other end of the first supporting arm connecting to the first LED filament, one end of the second supporting arm connecting to the stem and the other end of the second supporting arm connecting to the second LED filament;
wherein the constant-current drive circuit comprises a first output terminal and a second output terminal and configured to provide a constant current,
wherein the first LED component and the second LED component are coupled to the constant-current drive circuit, and configured to receive the constant current to light up,
wherein the shunt circuit electrically connects to the constant-current drive circuit, the first LED component and the second LED component, and configured to distribute currents of first LED component and second LED component.

2. The LED lamp according to claim 1, wherein both of the first LED component and the second LED component comprise a plurality of light emitting diodes connected in series.

3. The LED lamp according to claim 2, wherein each of the first LED filament and the second LED filaments comprises a light conversion layer wrapping the plurality of light emitting diodes, wherein the light conversion layer comprises a top layer and a carrying layer, the plurality of light emitting diodes are disposed on the carrying layer and the top layer covering the plurality of light emitting diodes.

4. The LED lamp according to claim 3, wherein each of the first LED filament and the second LED filament further comprises two conductive electrodes respectively disposed at two end of the first LED filament and the second LED filament, and respectively connecting the first conductive bracket and the second conductive bracket.

5. The LED lamp according to claim 4, wherein the top layer comprises light-transmitting resin, phosphors and heat dissipation particles.

6. The LED lamp according to claim 5, wherein a portion of the conductive electrode is covered by the light conversion layer and another portion of the conductive electrode is exposed from the light conversion layer, wherein the portion of the conductive electrode covered by the light conversion layer is provided with a through hole and the light conversion layer fills the through hole.

7. The LED lamp according to claim 5, wherein each of the first LED filament and the second LED filament further comprises a layered body disposed on the outer surface of the light conversion layer and the hardness of the layered body is greater than that of the light conversion layer.

8. The LED lamp according to claim 5, wherein the shunt circuit comprises a first triode, a first resistor, and a second resistor, a collector of the first triode is electrically connected to a cathode of the first LED component, an emitter of the first triode is electrically connected to a first ground terminal, a base of the first triode is electrically connected to a first pin of the second resistor, a second pin of the second resistor is electrically connected to a cathode of the second LED component and a first pin of the first resistor, a second pin of the first resistor is electrically connected to the first ground terminal, an anode of the first LED component is electrically connected to an anode of the second LED component and is electrically connected to a first output terminal of the constant-current drive circuit, and a second output terminal of the constant-current drive circuit is electrically connected to the first ground terminal.

9. The LED lamp according to claim 8, wherein the first triode is an NPN triode.

10. The LED lamp according to claim 9, wherein the first resistor is a variable resistor.

11. The LED lamp according to claim 10, wherein a color of a light emitted by the first LED filament after lighting is different from a color of the light conversion layer of the first LED filament.

12. The LED lamp according to claim 11, wherein a color of a light emitted by the second LED filament after lighting is different from a color of the light conversion layer of the second LED filament.

13. The LED lamp according to claim 10, wherein the first LED component and the second LED component have different color temperatures or colors.

14. The LED lamp according to claim 5, wherein the shunt circuit comprises a second triode, a third resistor, and a fourth resistor, an emitter of the second triode is electrically connected to a first pin of the third resistor and a first output terminal of the constant current source, a collector of the second triode is electrically connected to an anode of the first LED component, and a base of the second triode is electrically connected to a first pin of the fourth resistor, a second pin of the fourth resistor is electrically connected to a second pin of the third resistor and an anode of the second LED component, a cathode of the first LED component and a cathode of the second LED component are electrically connected to each other and together electrically connected to the common ground terminal, a second output terminal of the constant current source is electrically connected to the common ground terminal.

15. The LED lamp according to claim 14, wherein the first triode is an PNP triode.

16. The LED lamp according to claim 15, wherein the third resistor is a variable resistor.

17. The LED lamp according to claim 16, wherein a color of a light emitted by the first LED filament after lighting is different from a color of the light conversion layer of the first LED filament.

18. The LED lamp according to claim 17, wherein a color of a light emitted by the second LED filament after lighting is different from a color of the light conversion layer of the second LED filament.

19. The LED lamp according to claim 16, wherein the first LED component and the second LED component have different color temperatures or colors.

\* \* \* \* \*